United States Patent [19]
Chen et al.

[11] Patent Number: 5,432,932
[45] Date of Patent: Jul. 11, 1995

[54] SYSTEM AND METHOD FOR DYNAMICALLY CONTROLLING REMOTE PROCESSES FROM A PERFORMANCE MONITOR

[75] Inventors: James N. Chen; Niels Christiansen, both of Austin; Joseph C. Ross, Georgetown; Albert T. Rowan, Austin, all of Tex.

[73] Assignee: International Business Machines Corporation, Armonk, N.Y.

[21] Appl. No.: 965,954

[22] Filed: Oct. 23, 1992

[51] Int. Cl.⁶ ............................................. G06F 11/32
[52] U.S. Cl. .................. 395/650; 364/234.3; 364/234.4; 364/264.5
[58] Field of Search ................................ 395/650, 700

[56] References Cited

U.S. PATENT DOCUMENTS

| | | |
|---|---|---|
| 4,019,040 | 4/1977 | Thompson . |
| 4,291,376 | 9/1981 | McCahill . |
| 4,296,727 | 10/1981 | Bryan . |
| 4,373,184 | 2/1983 | Lambregts . |
| 4,459,656 | 7/1984 | Wilder, Jr. . |
| 4,485,440 | 11/1984 | Duff et al. . |
| 4,533,910 | 8/1985 | Sukonick et al. . |
| 4,533,997 | 8/1985 | Furgerson . |
| 4,590,550 | 5/1986 | Eilert et al. . |
| 4,633,467 | 12/1986 | Abel et al. . |
| 4,651,146 | 3/1987 | Lucash et al. . |
| 4,653,020 | 3/1987 | Cheselka et al. . |
| 4,730,315 | 3/1988 | Saito et al. . |
| 4,821,178 | 4/1989 | Levin et al. . |
| 4,823,290 | 4/1989 | Fasack et al. . |
| 4,845,644 | 7/1989 | Anthias et al. . |
| 4,878,183 | 10/1989 | Ewart . |
| 4,905,171 | 2/1990 | Kiel et al. . |
| 4,937,743 | 6/1990 | Rassman et al. . |
| 4,943,968 | 7/1990 | Hirose et al. . |
| 4,951,229 | 8/1990 | DiNicola et al. . |
| 5,050,105 | 9/1991 | Peters . |
| 5,062,055 | 10/1991 | Chinnaswamy et al. . |
| 5,067,099 | 11/1991 | McCown et al. ................ 364/550 |
| 5,067,107 | 11/1991 | Wade . |
| 5,075,675 | 12/1991 | Barker et al. . |
| 5,103,394 | 4/1992 | Blasciak . |
| 5,109,486 | 4/1992 | Seymour ........................... 395/200 |

FOREIGN PATENT DOCUMENTS 01026228 1/1989 Japan .

OTHER PUBLICATIONS

"General Purpose Data Collection Method", IBM Technical Disclosure Bulletin, vol. 16, No. 6, Nov. 1973, 1796–1798.
"Structure of Performance Monitor for Distributed Computer Systems", IBM TDB, vol. 20, No. 11B, Apr. 1978, pp. 5060–5065.
"Computer with Integral Function Monitor", IBM TDB, vol. 10, No. 11, Apr. 1968, pp. 1700–1703.
"Performance Evaluator for Operating System", IBM TDB, vol. 16, No. 1, Jun. 1973, pp. 110–118.
"General Trace Facility", IBM TDB, vol. 15, No. 8, Jan. 1973, pp. 2446–2448.
"Software Tool for Reducing Page Fault Frequency", IBM TDB., vol. 32, No. 5B, Oct. 1989, pp. 464–466.
"Performance Monitor of Small Remote Computer Systems", IBM TDB, vol. 19, No. 6, Nov. 1976, pp. 2386–2388.
"Memory Usage Estimator", IBM TDB, vol. 16, No. 1, Jun. 1973, pp. 284–285.

(List continued on next page.)

*Primary Examiner*—Kevin A. Kriess
*Assistant Examiner*—John D. Chavis
*Attorney, Agent, or Firm*—Wayne P. Bailey; Diana L. Roberts

[57] ABSTRACT

Local and remote processes can be controlled from a data processing system performance monitor. Multiple processes can be controlled concurrently with a single action selected. Processes to be controlled can be ranked when presented to a user, to assist in determining problematic processes that need attention. Process data is captured dynamically at local and remote processes using a daemon to minimize system overhead in monitoring and controlling processes.

17 Claims, 33 Drawing Sheets

OTHER PUBLICATIONS

"Functional Working Sets", IBM TDB, vol. 19, No. 4, Sep. 1976, pp. 1363–1364.

"Working Set Determination", IBM TDB, vol. 26, No. 9, Feb. 1984, p. 4761.

"Working-Set Coprocessor", IBM TDB, vol. 32, No. 4A, Sep. 1989, pp. 240–242.

"Memory Utilization Monitor", IBM TDB, vol. 15, No. 5, Oct. 1972, pp. 1709–1712.

"Definition and Measurement Method of 'Working Set' When Analyzing Memory Utilization in OS/2", IBM TDB, vol. 33, No. 2, Jul. 1990, p. 186.

"Application-Initiated Multitasking and Queued Task Recognition", IBM TDB, vol. 31, No. 10, Mar. 1989, pp. 355–356.

"Provide the Ability to Run Shared Applications Directly from the List of Available Shared Applications Being Displayed", IBM TDB, vol. 34, No. 10A, Mar. 1992, p. 359.

"The OSRM2 System", C.O.L. Consulting LTD, copyright 1989–1990, 43 pages.

"System Performance Monitor/2, V. 1.0 Reference Manual", copyright IBM, May 1991, Order #15F7177, 180 pages.

C. Crossman, "Get behind Dashboard to run your computer", article from the Austin American Statesman Newspaper, Sep. 28, 1992.

"AIX NetView/6000, Administration Reference, Version 1", IBM Corp., Apr. 1992, #SC31-6175 00.

"AIX NetView/6000, At a Glance, Version 1", IBM Corp., Mar. 1992, #GC31-6175-00.

CONFIGURATION SUBSYSTEM

DATA DISPLAY SUBSYSTEM

RECORDING SUBSYSTEM

PLAYBACK SUBSYSTEM

DATA VALUE RECEIVER SUBSYSTEM

NETWORK SEND/RECEIVE INTERFACE

RECORDING SUBSYSTEM

RECORDING SUBSYSTEM

|  |  | ALL INSTRS ARE RECORD- ING | SOME INSTRUMENTS ARE RECORDING ||||
|---|---|---|---|---|---|---|
|  |  |  | SELECT'D INSTR IS RECORD- ING | SELECT'D INSTR NOT RECORD- ING | NO INSTR IS SELECTED | NO INSTR IS RECORD- ING |
| CONSOLE MENU | SAVE BUFFER | - | - | - | - | + |
| CONSOLE MENU | BEGIN RECORDING | - | + | + | + | + |
| CONSOLE MENU | SAVE & BEGIN REC | - | - | - | - | + |
| CONSOLE MENU | END RECORDING | + | + | + | + | - |
| INSTRUMENT MENU | SAVE BUFFER | - | - | - | N/A | + |
| INSTRUMENT MENU | BEGIN RECORDING | - | - | + | N/A | + |
| INSTRUMENT MENU | SAVE & BEGIN REC | - | - | - | N/A | + |
| INSTRUMENT MENU | END RECORDING | + | + | - | N/A | - |

FIG. 11

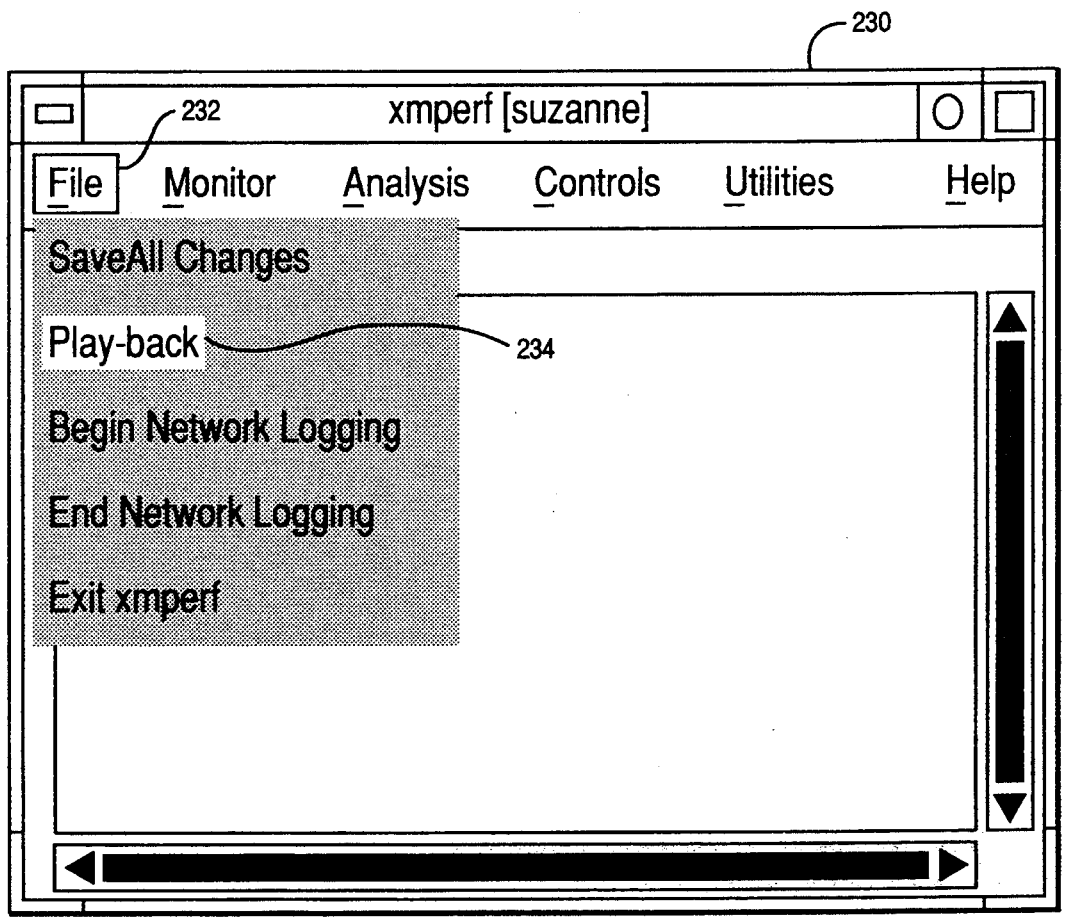

FIG. 12a

PLAYBACK SUBSYSTEM

PLAYBACK SUBSYSTEM

DATA DISPLAY SUBSYSTEM

CONFIGURATION SUBSYSTEM

DATA VALUE RECEIVER SUBSYSTEM

NETWORK SEND/RECEIVE INTERFACE

GRAPHICAL USER INTERFACE SUBSYSTEM

GRAPHICAL USER INTERFACE SUBSYSTEM

XMSERVD TO DDS INTERFACE

XMPEEK

```
$ SdiCons1 umbra
resync

CPU    CPU    CPU    CPU    CPU     CPU     CPU     CPU
  user   kern   wait   idle   uticks  kticks  wticks  iticks 86.9   13.5   0.0    0.0    86.9    13.5    0.0     0.0
  76.9   22.9   0.0    0.0    76.9    22.9    0.0     0.0
  91.0    9.0   0.0    0.0    91.0     9.0    0.0     0.0
  88.9   10.9   0.0    0.0    88.9    10.9    0.0     0.0
  84.0   16.0   0.0    0.0    84.0    16.0    0.0     0.0
  88.0   12.0   0.0    0.0    88.0    12.0    0.0     0.0
  87.9   11.9   0.0    0.0    87.9    11.9    0.0     0.0
  88.0   12.0   0.0    0.0    88.0    12.0    0.0     0.0
  91.9    7.9   0.0    0.0    91.9     7.9    0.0     0.0

$
```

DATA SUPPLIER DAEMON

```
#include <stdio.h>
#include <sys/signal.h>
#include "Sdidef.h"
#extern char    SdiEMsq[ ];
struct dat
{
    u_long   a;
    u_long   b;
    u_long   c;
    u_long   d;
};
static const struct Stat PUStats[ ] = {
{"gadgets", "Fake counter value", 0, 100, SiCounter, SiLong, NULL,
  SZ_OFF(dat, a, SiULong)},
{"widgets", "Another fake counter value", 0, 100, SiCounter, SiLong,
  NULL< SZ_OFF(dat, b, SiULong)}
};
static const struc Stat FakeMemStats{ } = {
{"level", "Fake quantity", 0, 100, SiQuantity, SiLong, NULL, SZ_OFF
  (dat, c, SiULong)},
{"queue", "Another fake quantity", 0, 100, SiQuantity, SiLong, NULL,
  SZ_OFF(dat, d, SiULong)}
};
static const cx_create cx_table[ ] = {
{'Test", "Bogus Context Number 1", sizeof(struct Context),
       "Top", PUStats, STAT_L(PUStats), NULL, 0, NULL, SiContInst},
{"MORETEST", "Bogus Context Number 2", sizeof(struct Context),
       "Top", NULL, 0, NULL, 0, NULL, SiContInst},
{"SubTEST", "Bogus Context Number 3", sizeof(struct Context),
       "MORETEST", FakeMemStats, STAT_L(FakeMemStats), NULL, 0,
NULL, SiMoInst}
};
static int      CxCount = CX_L(cx_table); /*Count of contexts defined */
static SdiShare *dataarea = NULL;         /*Shared memory pointer */
static struct dat *d = NULL;              /*Pointer to stats data area */
static struct timezone tzone;
```

FIG. 27A

```
A                                                                                A
void SdiStopMe( )
{
    if (dataarea)
        shmctl(dataarea->SiShMemId, IPC_RMID, NULL);
    dataarea = NULL;
    exit(0);
} void main( )
{
    dataarea = SdiDInit(cx_table, CxCount, NULL, 0, "/mydir/mydds");
    if (!dataarea)
    {
        fprintf("%s", SdiEMsg);
        exit(-1);
    }
    d = (struct dat *)&dataarea->SiShArea[0];
    signal(SIGTERM, SdiStopMe);
    signal(SIGSEGV, SdiStopMe);

gettimeof day(&dataarea->SiShT, &tzone);
    d->a = 22;
    d->b = 42;
    d->c = 28;
    d->d = 62;
    while(!dataarea->SiShGoAway
    {
        usleep(499000);
        gettimeofday(&dataarea->SiShT, &tzone);
        d->a += dataarea->SiShT.tv_sec & 0xff;
        d->b += dataarea->SiShT.tv_sec & 0xf;
        d->c += (dataarea->SiShT.tv_sec & 0x20f) & 0xffff;
        d->d += (dataarea->SiShT.tv_sec & 0x7f) & 0xffff;
    }
}
```

FIG. 27B

ANNOTATION & MARKING OF LIVE RECORDING GRAPHS

ANNOTATION & MARKING OF PLAYBACK GRAPHS

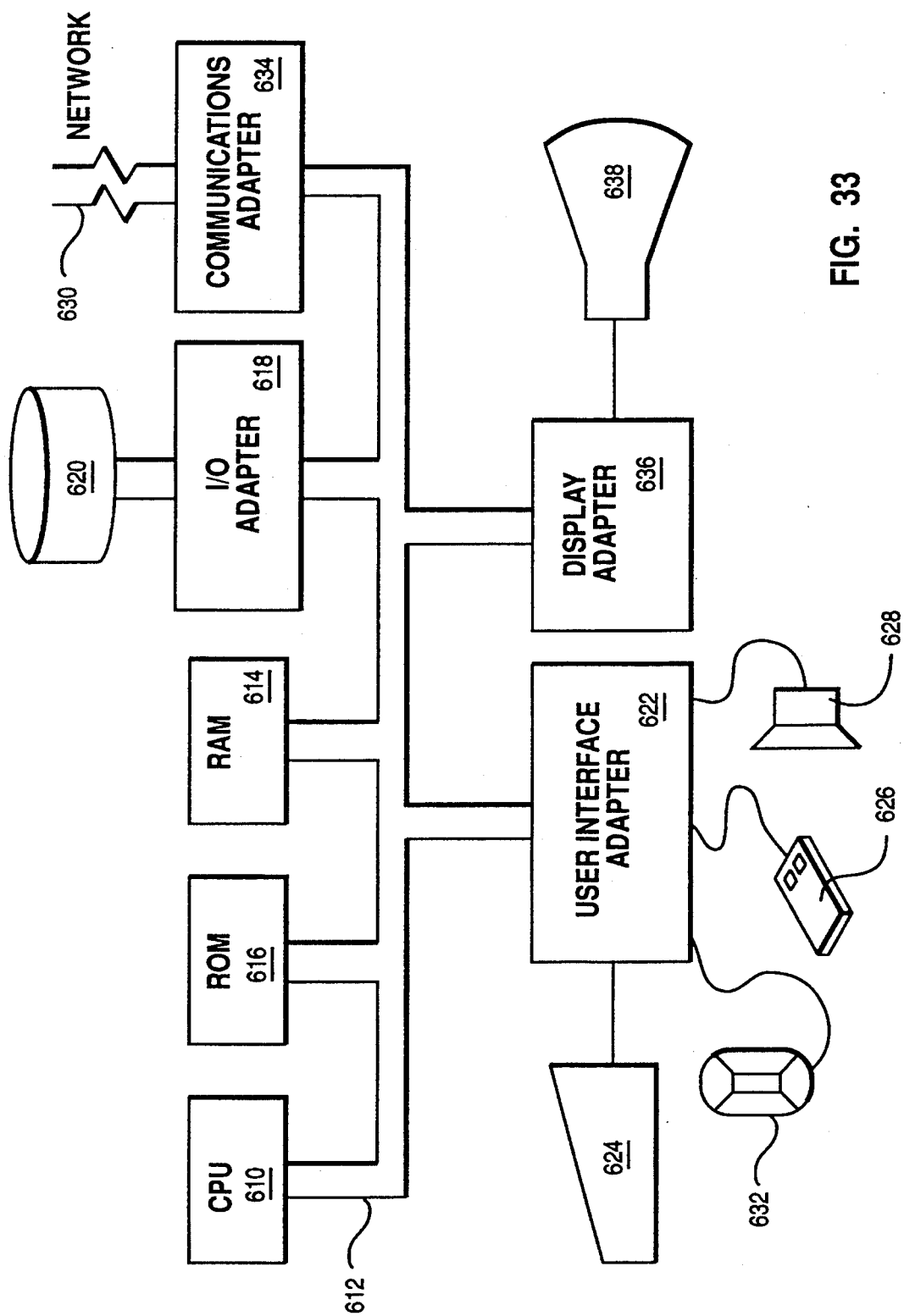

SYSTEM AND METHOD FOR DYNAMICALLY CONTROLLING REMOTE PROCESSES FROM A PERFORMANCE MONITOR

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

CROSS REFERENCE TO RELATED PATENT APPLICATIONS

Ser. No. 07/713,484, filed Jun. 10, 1991 for REAL TIME SYSTEM RESOURCE MONITOR FOR DATA PROCESSING SYSTEM, now abandoned, and assigned to the same assignee as the present invention and hereby incorporated by reference.

Ser. No. 07/713,471, filed Jun. 10, 1991 for REAL TIME SYSTEM RESOURCE MONITOR FOR DATA PROCESSING SYSTEM WITH SUPPORT FOR DYNAMIC VARIABLE UPDATE AND AUTOMATIC BOUNDING, now abandoned, and assigned to the same assignee as the present invention and hereby incorporated by reference.

Ser. No. 07/713,486, filed Jun. 10, 1991 for REAL TIME INTERNAL RESOURCE MONITOR FOR DATA PROCESSING SYSTEM, now abandoned, and assigned to the same assignee as the present invention and hereby incorporated by reference.

Ser. No. 07/965,982, filed Oct. 23, 1992 for SYSTEM AND METHOD MAINTAINING PERFORMANCE DATA IN A DATA PROCESSING SYSTEM, currently co-pending, and assigned to the same assignee as the present invention, which is hereby incorporated by reference.

Ser. No. 07/965,956, filed Oct. 23, 1992 for SYSTEM AND METHOD FOR CONCURRENT RECORDING AND DISPLAYING OF SYSTEM PERFORMANCE DATA, currently co-pending, and assigned to the same assignee as the present invention, which is hereby incorporated by reference.

Ser. No. 07/965,959, filed Oct. 23, 1992 for SYSTEM AND METHOD FOR DISPLAYING SYSTEM PERFORMANCE DATA, currently co-pending, and assigned to the same assignee as the present invention, which is hereby incorporated by reference.

Ser. No. 07/965,960, filed Oct. 23, 1992 for SYSTEM AND METHOD FOR REAL TIME VARIABLE GRANULARITY RECORDING OF SYSTEM PERFORMANCE DATA, currently co-pending, and assigned to the same assignee as the present invention, which is hereby incorporated by reference.

Ser. No. 07/965,981, filed Oct. 23, 1992 for SYSTEM AND METHOD FOR MONITORING AND OPTIMIZING PERFORMANCE IN A DATA PROCESSING SYSTEM, currently co-pending, and assigned to the same assignee as the present invention, which is hereby incorporated by reference.

Ser. No. 07/965,953, filed Oct. 23, 1992 for SYSTEM AND METHOD FOR ANNOTATION OF REAL TIME DATA IN A DATA PROCESSING SYSTEM, currently co-pending, and assigned to the same assignee as the present invention, which is hereby incorporated by reference.

TECHNICAL FIELD

This invention relates to the area of data processing systems, and more particularly to the field of performance tools used to analyze the operations of data processing systems.

BACKGROUND ART

As data processing systems continue to grow in complexity, traditional tools used in the development, design and debug of such systems become increasingly impractical to use. For example, in the development and design of personal computers, an engineer could use a logic analyzer and oscilloscope to assist in locating errors in hardware and software. As the software running on these data processing systems became more complex, tools such as in-circuit emulators were developed, whereby the instruction flow of a central processing unit (CPU) could be captured and analyzed. These types of tools still require a large amount of human intervention and human analysis to assist in problem determination.

Various types of software tools have been introduced in the marketplace to assist in monitoring a data processing system, such as the System Performance Monitor/2 from IBM. This tool provides a graphical interface to visual depict various aspects of a data processing system, and greatly reduces the amount of time required to analyze the operation of a data processing system. Although these systems provide a substantial improvement over previous methods for monitoring and analyzing a data processing system, there are still certain deficiencies. First, they are geared towards hardware resources in a data processing system, and do not fully address the ability to monitor software processes or applications. Secondly, the flexibility and granularity provided are limited. Further, performance data is merely output to a user display device, and thus does not provide full flexibility in analyzing the data being captured.

Network monitoring tools such as IBM NetView/6000 (TM) programs are concerned primarily with supervision and corrective action aiming at keeping the network resources available and accessible. Resource availability is the concern of such tools, rather than resource utilization. For example, IBM NetView/6000 tracks the amount of free space of a disk.

There is a need to provide a data processing system performance tool that is flexible and easy to use, that can monitor hardware as well as software events and process activities, that can capture data (e.g. read sampled data) for subsequent retrieval and analysis, and that provides other facilities to further analyze and categorize such captured data.

SUMMARY OF THE INVENTION

It is an object of the present invention to provide a highly flexible analysis tool for a data processing system.

It is a further object of the present invention to provide a performance tool for a data processing system.

It is yet a further object of the present invention to provide a tool for monitoring, capturing, saving, retrieval and analysis of data processing system operations.

These objects and others are accomplished by a performance tool, its related application programming interfaces and the performance daemon are designed for interactive selection of performance statistics across a network of computer systems, the control of the flow of performance data, and the monitoring of the remote host(s) performance in live graphs.

Some of the key aspects of the design are in the combination of (1) graphical monitoring of remote data in highly customizable graphs capable of combining plotting styles; (2) the monitoring program is not required to know which hosts in the network can supply statistics and which statistics are available from each host; (3) interactive exploration of the sources of statistics on the network and the collection of statistics available from each source; and (4) the negotiation of what data systems processes to monitor across the network.

A computer system is made up of a variety of different types of hardware and software components, such as network nodes, CPUs, memory, processes, etc. In the field of performance analysis, these objects represent different contexts for the collection of performance data, and the computation of performance statistics.

Since the computing environment can be decomposed into successively smaller and smaller components, it defines a hierarchy of these performance analysis contexts. In the xmperf performance tool disclosed herein, all statistics are associated with particular contexts, and these contexts are identified by listing all the contexts which are traversed in going from the top-level context to that context. For example, in the case of a network-based computing environment, the disk called "hdisk0" on the host called "ultra", would be referenced by using the following path:

/hosts/ultra/disks/hdisk0

The statistic for the number of read operations on this disk can then be referenced by adding the statistic name to the above path:

/hosts/ultra/disks/hdisk0/reads

The set of hosts on a particular network, and the configuration of any one system, may vary greatly from environment to environment and from time to time. Furthermore, the resource monitoring tool is faced with the problem of monitoring entities, such as processes, that are created dynamically and disappear without warning. Thus, obviously, a statically defined context hierarchy would not be adequate, and instead, the context hierarchy must be dynamically created and modifiable at execution time.

In the performance tool (xmperf), this problem is handled by using an object oriented model. In this model, a generic hierarchy of performance statistics contexts is defined using a hierarchy of context classes. Statistics are attributes of these classes, and generally all instances of a particular context class will have the same set of statistics. For example, the statistics relevant to the class of "disks" might include: "busy time", "average transfer rate", "number of reads", "number of writes", etc. Each class also has a "get_data()" method (i.e. function) for each statistic, which can be called whenever that statistic needs to be computed.

In xmperf, context classes also contain an "instantiate()" method, which is called to create object instances of that class. For example, this method could be used for the class of "disks" to generate performance analysis contexts for collecting data on each disk in a particular system, (e.g. "hdisk0", "hdisk1", etc.). These disk contexts would all have the same set of statistics and "get_data()" methods, which they inherit from the "disks" class.

A client/server model was implemented to allow performance monitoring over a network, typically (but not necessarily) a Local Area Network (LAN). The model is implemented with a server program, known as a "Data Supplier", that runs as a daemon on the server system and one or more client programs, called "Data Consumers", which are providing the monitoring facilities.

The Data Supplier daemon:

- Has its statistical data organized in a hierarchy to provide a logical grouping of the data.
- Upon request over the network, and on a selective basis, presents what statistics it has available.
- Accepts subscriptions for a continuous flow of one or more sets of performance data at negotiable frequency.
- Provides for dynamic extension of its inventory of statistics through a simple application programming interface.

The Data Consumer Programs:

- May be the developed graphical monitoring program as is described in more detail below.
- May be a user-developed (application) program using the developed application programming interface to negotiate the set(s) of statistics in which it is interested with one or more Data Supplier daemons and to receive, process, display, and take corrective action based on the statistics as they are received from the Data Supplier(s) over the network.

An important design objective was to make sure that a Data Consumer program does not need any prior knowledge of the statistics available from Data Suppliers. This was further emphasized by the fact that not all hosts in a network have identical configurations and abilities and thus can not supply identical collections of statistics. The solution was to allow Data Consumers to negotiate with potential Data Suppliers. The implementation is a low cost, Transmission Control Protocol (TCP)/User Datagram Protocol (UDP) based protocol with the following message types:

- Control messages to identify potential Data Suppliers on the network and to check whether partners are still alive
- Configuration messages to learn about the statistics available from identified suppliers and to define subscriptions for data
- Data Feed and Feed Control messages to control the continuous flow of data over the network
- Status messages to query a Data Supplier's status
- Messages to register additional statistics with the Data Supplier daemon.

The protocol allows for up to 124 individual values being grouped into a set and sent across the network in a single packet. A value is the finest granularity of statistic being monitored and has attributes associated with it. The simple application program interface hides the protocol from the application programmer and isolates it from application programs. This isolation largely makes application programs unaware of future protocol extensions and support for other base protocols.

The performance monitor tool is the most visible part of the project. It is an OSF/Motif based program (OSF/Motif is a trademark of the. Open Software Foundation) that allows a user to interactively select the relevant data to monitor while also permitting a predetermined set of monitoring "devices" to be maintained. It also provides the interface for interaction with a user to control processes within a data processing system.

The basic monitoring device is called a monitor. It shows as a window on the display and can be activated or deactivated from popup or pulldown menus.

Multiple monitors can be active at a time. Within a monitor, one or more sets of data processing system statistics may be observed in subwindows called instruments. An instrument can monitor a set of statistics supplied from any host on the network that runs the Data Supplier daemon. A set of statistics can be selected from among the complete collection of statistics available from the Data Supplier. Instruments can graphically display their sets of statistics in many different graph formats.

The most versatile of the graph formats shows the statistics on a time scale with each statistics value being plotted in one of four plotting styles:

- Line graph
- Skyline graph (squared-off line graph)
- Area graph (filled line graph)
- Bar graph Proper selection of plotting style allows the superimposing of data values upon others permitting easy correlation of performance data. Another facility allows cumulative plotting of a subset of the values in a set.

The foregoing and other objects, features, and advantages of the invention will become more apparent from the followed detailed description of the preferred embodiment which proceeds with reference to the accompanying drawing.

BRIEF DESCRIPTION OF THE DRAWINGS

FIG. 11 is a table showing allowable actions from various menu selections.

FIGS. 12a–12e depict various displays generated by the performance tool.

FIGS. 27A–27B are a C language program of a dynamic data supplier program using the daemon application programming interface to provide extensions for supplying additional types of data.

FIG. 33 depicts the preferred embodiment data processing system.

DETAILED DESCRIPTION OF THE PREFERRED EMBODIMENT

Figure 1:
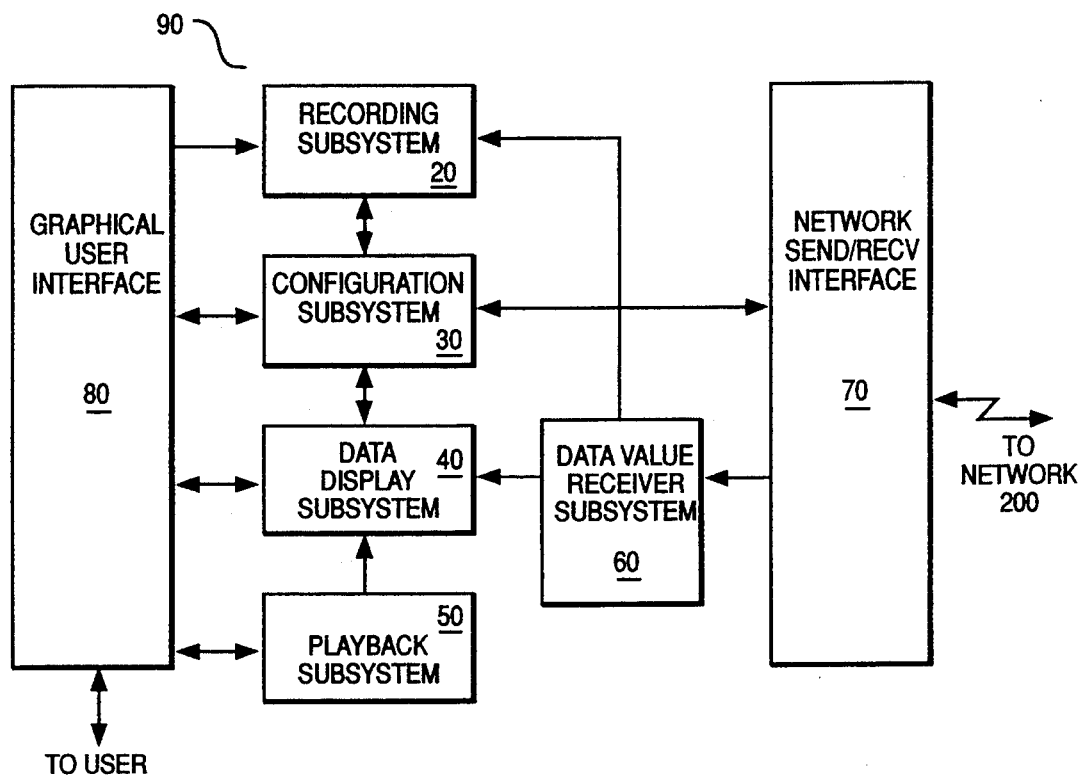
FIG. 1 depicts the subsystem components comprising the performance tool.

As shown in FIG. 1, the performance tool 90 can be perceived as consisting of five subsystems and two interfaces. The following sections describe each of these components.

GRAPHICAL USER INTERFACE

The performance tool's graphical user interface (GUI) 80 allows the user to control the monitoring process almost entirely with the use of a pointing device (e.g. a mouse or trackball). The GUI 80 uses menus extensively and communicates directly to the following four subsystems:

GUI TO RECORDING SUBSYSTEM

Figure 2:
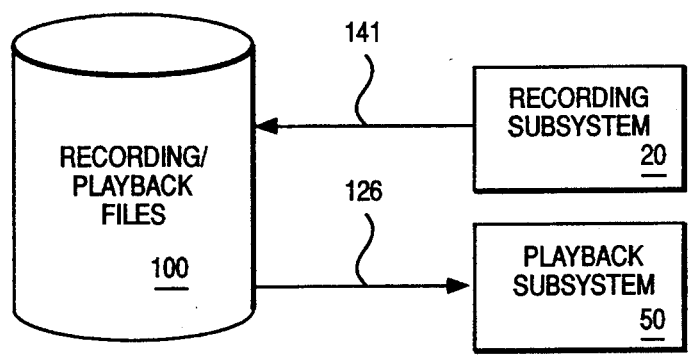
FIG. 2 depicts the playback and recording system interface to a recording file.

The GUI 80 allows the user to start and stop recording from any active monitoring console and any active monitoring instrument. When recording begins in the recording subsystem 20, the configuration of the entire monitoring console is written to a recording file (100 of FIG. 2). The recording file 100 itself is named from the name of the monitoring console from which it is being recorded.

As all information about the monitoring console's configuration is stored in the recording file 100, playback can be initiated without a lengthy interaction between user and playback subsystem 50. Through the GUI 80, the user can start and stop recording as required and if a recording file already exists when recording is requested for a monitoring console, the user is given the choice of appending to the existing file or replacing it.

GUI TO CONFIGURATION SUBSYSTEM

The configuration subsystem 30 has two means of acquiring information about the monitoring of consoles and instruments. First, a configuration file (110 of FIG. 3) can contain configuration information for many monitoring devices. These may be skeleton consoles or may be fixed consoles. Second, the user can add, change, and delete configuration about fixed consoles directly through the GUI 80. Whether configuration information is read from the configuration file or established in interaction with the user, it causes configuration messages to be exchanged between the configuration subsystem 30 and the network send/receive interface 70 and the remote data supplier daemon(s) (210 of FIG. 8).

The skeleton consoles are monitoring devices where the exact choice of the performance data to display is left open. To activate a skeleton console, the user must specify one or more instances of the available performance data, such as the processes, the remote host systems, or the physical disks to monitor.

Each time a skeleton console is activated, a new instance is created. This new instance allows a user to activate multiple, similar-looking consoles, each one monitoring different performance data, from one skeleton console.

GUI TO DATA DISPLAY SUBSYSTEM

In addition to configuring of monitoring devices, the user uses the GUI 80 to activate or close monitoring devices, thereby causing network messages to be exchanged between the configuration subsystem 30 and the network send/receive interface 70. These messages consist largely of instructions to the remote data supplier daemon(s) (210 of FIG. 8) about what performance data to send and how often.

The data display subsystem 40 receives information about monitoring devices from the configuration subsystem 30 and uses this information to present the user with a list of monitoring devices for the user from which to select. In the case of skeleton consoles, the GUI 80 will also present a list of the items from which the user can select when instantiating the skeleton console.

GUI TO PLAYBACK SUBSYSTEM

Finally, the GUI 80 is used to start the playback of recordings at 50. Recordings are kept in disk files (recording file 100 of FIG. 2) and may have been created at the same host system that is used to play them back, or may have been generated at other hosts. This flexibility allows a remote customer or user to record the performance data for some workload and mail the performance data to a service center or technical support group to analyze.

Recordings 100 contain all necessary information to recreate exact replicas of the monitoring consoles from which they were recorded. When a recording file is selected for display, the imbedded configuration data is passed on to the data display subsystem 40 and a playback console is constructed on the graphical display.

Once the playback console is opened, the user can play the recording at almost any speed, can rewind, search for any time stamp on the recording, erase the recording and stop the playback of the recording.

CONFIGURATION SUBSYSTEM

Figure 3:
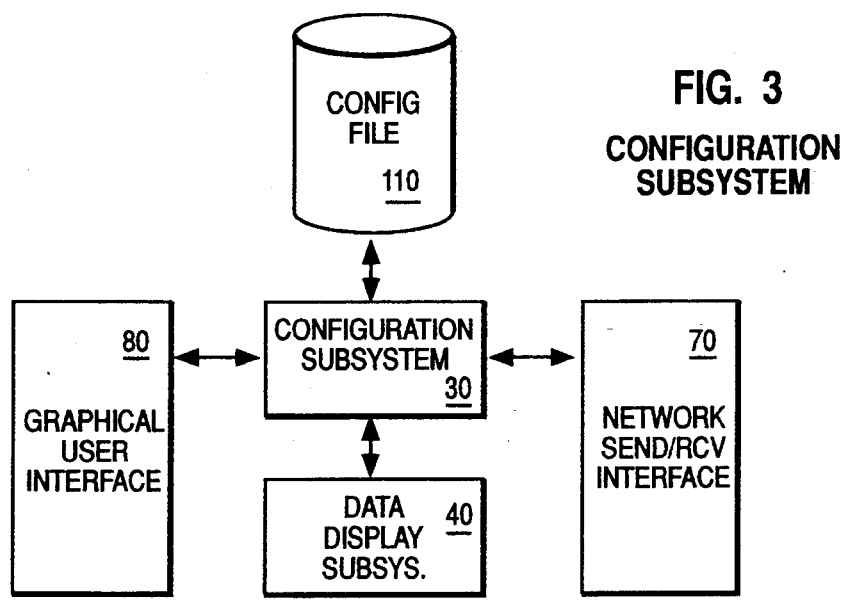
FIG. 3 depicts system interactions with the configuration subsystem.

Referring to FIG. 3, the configuration subsystem 30 has several important functions in the performance tool: a graphical user interface 80, a configuration file 110, a network send/receive interface 70, and a data display subsystem 40. Each is closely related to one of the interfaces or other subsystems, as described below.

Through the graphical user interface (GUI) 80, the user can design the monitoring devices to use, can instantiate skeleton consoles, can activate and close consoles, and can traverse the hierarchy of performance data available from any of the data supplier daemons (210 of FIG. 4) in the network 200. This is done in close cooperation between the GUI 80, the configuration subsystem 30, and the network send/receive interface 70.

The GUI presents the user with a series of graphical menus that allow a user to completely specify the appearance and contents of a graphical performance "console." Via the menu selections, the user can create a new "console" window, add new "instrument" subwindows, and add multiple instrument values to any instrument. Values are individual statistics being monitored, displayed and/or recorded, and include such statistics for system elements such as CPU, memory, paging space, disk, network, process, system call, system I/O, interprocess communications, file system, communication protocol, network file system, or remote procedure calls. The user also has menu control over the colors, value limits, presentation style, sampling frequency, labeling, and other value attributes. All this information is stored in an ASCII configuration file 110 in "stanza" formats similar to Motif resource files. If the user wishes to access remote statistics, the remote nodes are contacted via the network send/receive interface 70 to ensure that they are available and have the requested statistics generally specified by "skeleton" consoles in the local configuration file. After the user has made these selections through the GUI, the requested console is displayed and live data is fed to the graphics console. When the user is finished viewing the console, it can be "closed" or "erased". Closing a console leaves the console available in the configuration file 110 for later activation and viewing. Erasing a console removes the console from the configuration file, so that it must be reconstructed from scratch.

When the user has designed the consoles, the final configuration can be written to a configuration file 110, so that future invocations of the performance tool can obtain the configuration information by reading the file as the tool begins operations.

The configuration file 110 is an important tool for the performance tool user. The file may contain three types of information:

○ Executable Programs
  Any number of executable programs and scripts can be placed in the performance tool's pulldown menus by entering a short definition of each in the configuration file. Programs may be entered multiple times with various subsets of their command line options, and program definitions can be made so that the user is prompted for command line arguments before the program is executed. Prompting can be for required or optional arguments, may have defined defaults and is done from Motif style dialog windows. Program definitions must currently be entered into the configuration file manually.

○ Fixed Consoles

This console type defines a console with a predetermined set of performance data to monitor. Fixed consoles can be entered manually into the configuration file or they may be saved as the result of an on-line configuration session with the user through the GUI.

○ Skeleton Consoles

The skeleton consoles are monitoring devices where the exact choice of the performance data to display is left open to be specified by a user. Skeleton consoles must currently be entered into the configuration file manually.

Most configuration tasks involve the exchange of configuration information over the network using a network send/receive interface 70. All configuration-type messages are of the "request/response" type. This is also true for the unique messages that allow a user to traverse the hierarchy of performance data to see what's available before selecting data to display in consoles. A "request-response" type protocol is a two way communication between a client and a server. The data client sends a "request for data" message to the data server and then waits for a "response" from the server. If the server does not respond within a specified time limit, the client may attempt a retry or terminate with an error.

Finally, the configuration subsystem 30 supplies configuration information to the data display subsystem 40 whenever the user requests that a console be activated. When a user requests a "console" to be activated, the detailed console specifications that were originally read into memory from the configuration file 110 are passed to the data display subsystem 40 in a memory control block area. The configuration subsystem 30 can likewise pass skeleton console data that was read from the configuration file to the data display subsystem 40 in a memory control block area.

It also provides the data display subsystem 40 with a list of possible performance data to instantiate skeleton consoles.

DATA DISPLAY SUBSYSTEM

Figure 4:
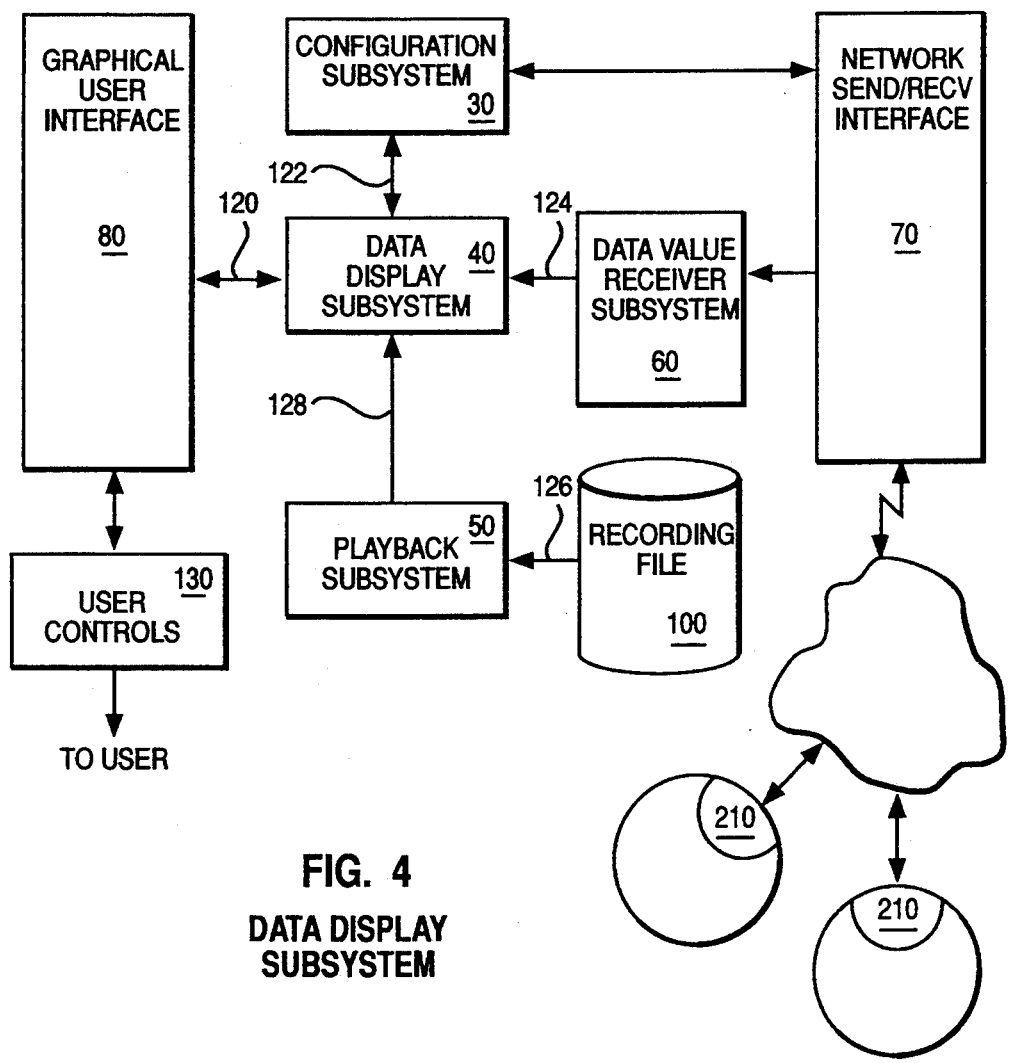
FIG. 4 depicts system interactions with the data display subsystem.

The data display subsystem's 40 main responsibility is to display the performance data in the format described by the configuration subsystem 30, and to display it as soon as it is received from either the playback subsystem 50 or the data value receiver subsystem 60. As illustrated in FIG. 4, the data display subsystem 40 interfaces to three other subsystems, 30, 50, 60, and the GUI 80. The data display subsystem 30 is primarily a receiver of information from two of the other subsystems; only the interface 120 to the GUI 80 and, to some extent, the configuration subsystem interface 122 are dialog type interfaces.

The configuration subsystem 30 is a supplier of configuration information and a vehicle for traversing the hierarchy of the performance data. The former is used to construct the windows and subwindows of monitoring devices on the graphical display; the latter is used to present lists of choices when a skeleton console is created or when designing or changing an ordinary console. The traversal of the data hierarchy requires the exchange of network messages between the configuration subsystem 30 and the data supplier daemon(s) 210 involved, using the request/response network interface.

Finally, requests to start, change, and stop feeding of performance data are passed from the data display subsystem 40 to the configuration subsystem 30 through the network send/receive interface 70 to the data supplier daemon 210 of FIG. 4.

Data flow on the interface 124 to the data value receiver subsystem 60 is unidirectional, always from the data value receiver subsystem 60 to the data display subsystem 40. As data packets are received from the network send/receive interface 70, the data value receiver 60 uses the StatSetID from the received packets to do a lookup in a list of all active display consoles from a common parameter storage area, gets a pointer to the console control block, and passes this information at 124 to the data display subsystem 40.

The playback subsystem 50 mimics the data value receiver subsystem 60. Where the latter receives packets of data over the network, the playback subsystem 50 reads them at 126 from the recording file 100 and hands them at 128 to the data display subsystem 40 in the same data format that the data value receiver subsystem 60 uses. This allows the data display subsystem 40 to handle the two data sources as if they were the same.

Several unique features of the performance tool are implemented in the data display subsystem 40. They all depend on the GUI 80 as the vehicle for the user to communicate his or her wishes. Among these are:

○ Changeable Graph Style

Directed by the user through the GUI, the data display subsystem can instantly change the graph style of any monitoring instrument in any console. Data viewed as pie chart graph in one second may be viewed as a time-scale graph the next.

○ Tabulation Windows

Any monitoring instrument may be told to tabulate the data it receives in addition to showing the received data in a graph. Tabulation is done in special windows and can be turned on and off by the user with a couple of mouse clicks.

○ Skeleton Instantiation

Whenever the user wants to instantiate a skeleton console, the data display subsystem 40 will use the GUI 80 to present a list of possible data values to the user. The user then selects the desired data at 130 from a list, and an instantiated console is created. The contents of the selection list depend on how the skeleton console is defined in the configuration file 110 and may represent any node (context) in the data hierarchy that may vary between hosts or between multiple/differing executions of the performance tool.

RECORDING SUBSYSTEM

Figure 5:
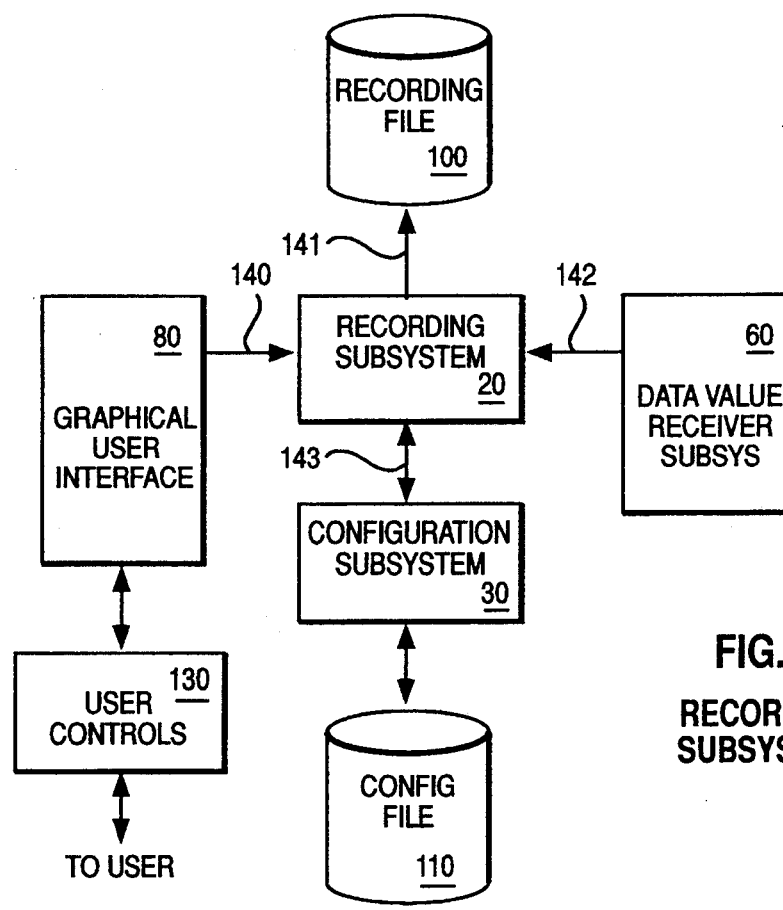
FIG. 5 depicts system interactions with the recording subsystem.

The recording subsystem 20 of FIG. 5 is controlled from the GUI 80 over interface 140. When a recording is requested by the user at 130, the first thing that happens is that the configuration information 110 is stored in the recording file 100. This configuration information 110 is extracted from the current in memory control blocks and consists of the following control blocks:

- Console Information
  Describes the size and placement of the monitoring console's window.
- Instrument Information
  Describes each of the monitoring console's monitoring instruments, including their relative position within the monitor window, colors, tiling, etc.
- Value Display Information
  Describes the path name, color, label and other information related to the display format of each of the statistics values displayed in the monitoring instruments.
- Value Detail Information
  Gives information about a statistics value that is independent of the monitoring "instrument" the in which the value is being used. This includes the value's descriptive name, data format, etc.

The actual data recording uses a fifth and final control block format. This format allows for variable length blocks to be written to preserve file space.

This design also keeps data volume requirements down by referring each data recording data block symbolically to the configuration information in the recording file, rather than storing long identifiers. The contents of each data block is described later, with reference to Table 5.

The recording subsystem 20 will, for each console that has recording activated, be passed the actual data feed information at 142 as it is processed by the data value receiver subsystem 60. As long as recording is active for a console, data is passed along.

PLAYBACK SUBSYSTEM

Figure 6:
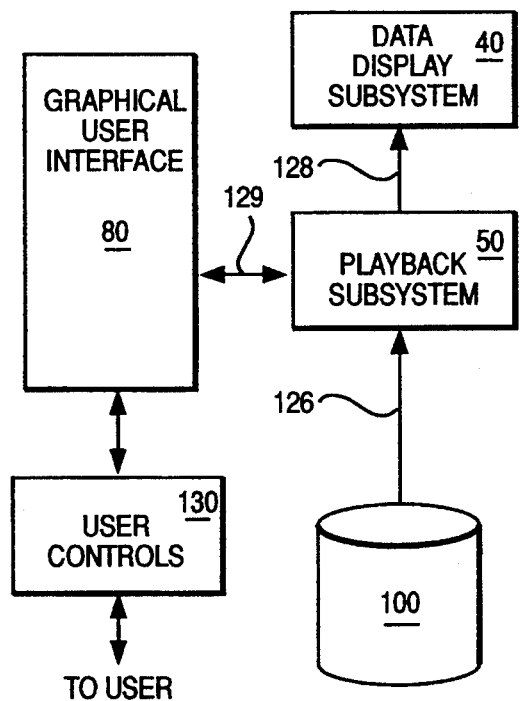
FIG. 6 depicts system interactions with the playback subsystem.

The playback subsystem of FIG. 6 has logic to permit a realistic playback from any recording file 100. The logic also allows searching for time stamps in a recording with data from many hosts, each of which had different clock settings when the recording was created. Other than that, the playback subsystem 50, as seen from the data display subsystem 40, is just another supplier of data packets along 128.

Packets are read from the recordings file 100 at the speed requested by the user at 130 and fed at 128 to the data display subsystem 40.

The GUI 80 is the only other subsystem interfacing at 129 with the playback subsystem 50. It allows the user at 130 to:

- Select which recordings to play back from a list of recordings
- Play the recording and increase or decrease the playback speed
- Rewind the recording or forward the recording to any time stamp
- Erase a selected recording

DATA VALUE RECEIVER SUBSYSTEM

Figure 7:
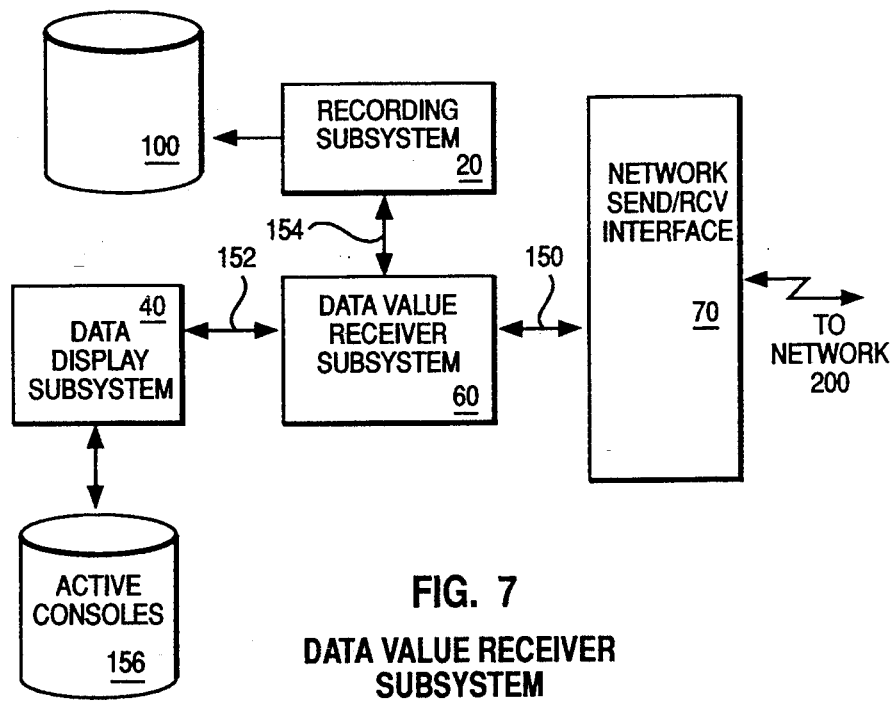
FIG. 7 depicts system interactions with the data value receiver subsystem.

The data value receiver subsystem 60 of FIG. 7 is responsible for receiving all data feed packets arriving from the network 200 and making sure all interested subsystems get a copy of each data feed packet. Before the packet is passed on, it is tagged with information that identifies the target console to which it is intended. If no target can be found, the data packet is discarded.

The interface to the other subsystems and the network send/receive interface is as follows.

The network send/receive interface 70 uses the API library functions (described later, with reference to 161 of FIG. 8) to access the network 200. This includes the API callback function that gets control whenever a data feed package is received. The data value receiver subsystem 60 is the only function that will ever receive data packets at interface 150 in the performance tool. Subsystem 60 does not have to poll but is scheduled automatically for each data feed packet received.

Since the data feed packets do not require a response, the communications at 150 with the network send/receive interface 70 is strictly unidirectional. Because of this unidirectionality and lack of polling/responses, data can be supplied along 150 at very high data rates, thus allowing for real time monitoring of remotely supplied statistics.

When a data packet is received, the data value receiver subsystem 60 consults the tables of active consoles 156 as maintained by the data display subsystem 40. Data packets that can not be related to an active monitoring console are discarded, assuming they arrived after the console was closed. If a console is identified, the recording subsystem 20 is invoked if recording is active for it. Then the packet is passed on at 152 to the data display subsystem 40 where further decoding is done as part of the actual display of data values. This design thus provides the ability to concurrently display and record local and remotely supplied performance statistics in real-time.

If a data packet is identified as belonging to a monitoring console that is being recorded, the recording subsystem 20 is invoked at 154 to write a copy of the data packet to the recording file 100. If recording is only active for some of the instruments in the console, only data belonging to those instruments is actually written to the recording file 100.

NETWORK SEND/RECEIVE INTERFACE

Figure 8:
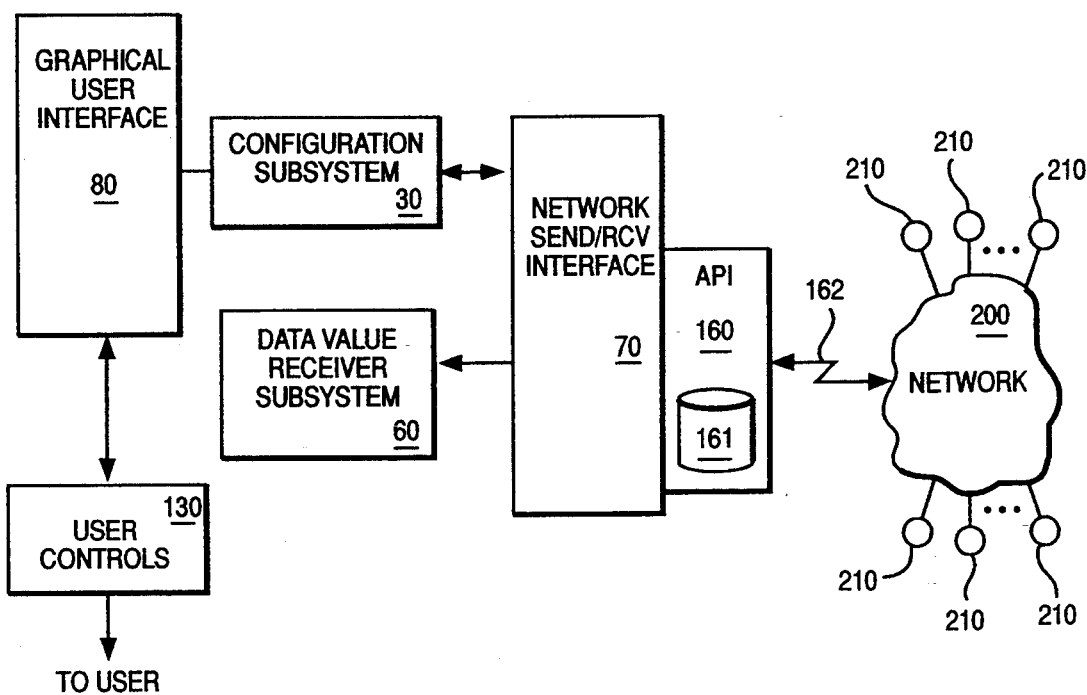
FIG. 8 depicts system interactions with the network send/receive subsystem.

Referring now to FIG. 8, the network send/receive interface 70 consists of (i) the library functions 161 of the performance tool's application programming interface (API) 160, and (ii) code written specifically for the performance tool's monitoring program to invoke the API library functions 161. The interface has several responsibilities, the most prominent of which are:

- Identifying Data Suppliers
  The interface uses the API broadcast function to identify the data supplier daemons 210 available in the network 200. Invitational packets are sent at 162 to remote hosts as directed by the API "hosts file", where the user may request plain broadcasting on all local interfaces and/or request specific hosts or subnets to be invited. An API "hosts file" is a file that can be set up by the user to specify which subarea networks to broadcast the invitation "are_you_there" message. It can also specify individual hosts to contact or "nobroadcast". Invitational broadcasts are conducted periodically to make sure all potential data supplier hosts are identified.
- Traversal of Data Hierarchy
  The API request/response interface 160 is used to traverse the data hierarchy whenever the user requests this at 130 through the GUI 80 and the configuration subsystem 30.

○ Negotiation of Sets of Statistics

For each instrument that is activated by the user, the API request/response interface 160 is used to negotiate what data values belong to the set. If a data supplier daemon 210 is restarted, the performance tool 90 uses the same interface to renegotiate the set. While data feeding is active, and in certain cases when it is not, both the performance tool 90 and the data supplier daemon 210 keeps information of the set. The data supplier daemon does so to know what data values to send, while the configuration subsystem 30 needs the information so it can instruct the data display subsystem 40 what's in the data packet.

○ Starting and Stopping Data Feeding

The data display subsystem 40 (FIG. 4), as instructed by the user at 130 through the GUI 80 (FIG. 4), will pass requests for start, stop, and frequency changes for data feed packets through the configuration subsystem 30 to the network send/receive interface 70, using the API request/response interface 160.

○ Keeping Connections Alive

The API 160 includes functions to make sure active monitors are known by the data supplier daemons 210 to be alive. These functions are handled by the API library 161 without interference from the performance tool 90.

○ Processing Data Feed Packets

Data feed packets are received by the API library functions on the one-way interface 162 and passed on to the data value receiver subsystem 60 for further processing. No processing is done directly in the network send/receive interface 70.

IMPLEMENTATION OF RECORDING SUBSYSTEM

Figure 9:
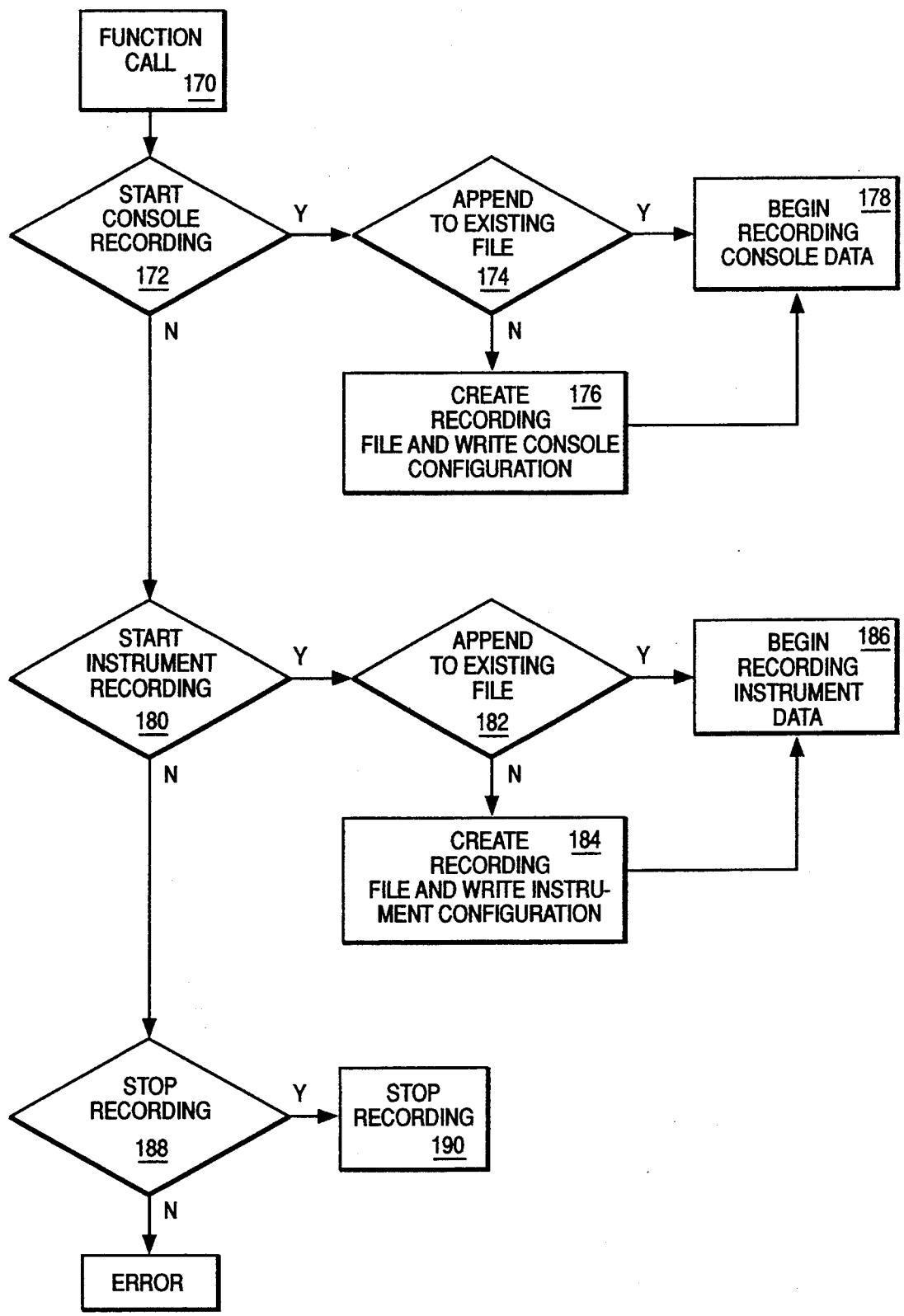
FIG. 9 is a flow diagram of the operations of the recording subsystem.

Referring now to FIG. 9, recording of statistics can be initiated for one or more instruments in a console or for all instruments in a console. Recording can be active for more than one console at a time. All recordings from any one console always goes to a file in directory "$HOME/XmRec", which has a name prefix of "R." followed by the name of the console. For example, the recording file for a console named "Remote IP Load" would be:

$HOME/XmRec/R.RemoteIPLoad

There are a number of facets of the recording process, to mention in one preferred embodiment. First, a console cannot be recorded while playing back from a file whose name matches the console. Second, whenever a file is created, a full description of the entire console is written as the first records of the file. This is true whether recording is started for the console as a whole or for only some instruments in the console. Third, if the file exists when a recording action is instantiated, the system will prompt the user whether they want to append to the file or recreate it. If append to the file is elected (as determined by 174 and 182 of FIG. 9), it is assumed that a console description already exists in the file. Fourth, recording files are located in a subdirectory named "XmRec" in the user's home directory. If this directory does not exist when recording is attempted, it is created if possible.

When a user selects recording from a menu, the following choices are presented to the user using the GUI. The GUI then translates a user's selected option to a corresponding function call, which is sent to the recording system at 170 of FIG. 9. Recording is controlled from a menu with the following choices:

Save Buffer

This option will transfer the contents of the selected console's or instrument's history buffer to the recording file 100. The option is only available when recording is not already active from the console, since the values saved from the buffer would otherwise be out of synchronization with the ongoing recording's values. The option is intended for situations where an interesting pattern in a console has been detected, and it is desired to capture it for later analysis. When the recording of the buffer is completed, the recording file is closed.

Begin Recording

This option will start writing data values to the recording file as they are received. It does not matter whether the data is received from a remote data supplier or is local. Recording continues until stopped by the user or the console is closed (as specified by 130, through the GUI 80).

Save & Begin Recording

Combines the previous two options by first saving the display history buffer data to the file; then starting recording.

End Recording

Stops recording and closes the recording file if no other instrument in the console is still recording.

Depending on whether a console or one of its instruments is currently recording and which recording menu has been selected, different items in the recording submenu will be active. The status of menu items is closely related to the difference between console recording and instrument recording, as is next described.

First, if the recording submenu is derived from a "Start Console Recording" menu as detected at 172 of FIG. 9, all menu items in the submenu are assumed to be concerned with the console as a whole. Thus, whether one or more or all instruments in the console are currently being recorded, a selection of "End Recording" will stop recording for all instruments at 188. Similarly, no matter if one or more instruments are currently being recorded, a selection of "Begin Recording" from the submenu will cause all instruments in the console to be recorded from this time on at 178.

Second, if the recording submenu is arrived at from a "Start Instrument Recording" menu (as determined at 180 of FIG. 9), all menu items in the submenu are considered to apply to the currently selected instrument. Therefore, if the selected instrument is not currently being recorded, a selection of "Begin Recording" will start recording for the instrument at 186. If the instrument is being recorded, no matter if the recording was started as a consequence of a full console recording being started, a selection of "End Recording" will stop recording for the selected instrument at 190. In neither case does the operation affect any other instrument in the console.

Third, the "Save Buffer" submenu item will only be valid if no recording is currently going on for any instrument in the console. This may seem like an untimely restriction, but the results of mixing historic data with "real-time" recording does not seem to be of any practical significance.

All the above rules influence what submenu items are active at any point in time. FIG. 11 describes the possible combinations. Allowable selections are indicated by a '+', and selections not allowed are indicated by a '—'.

To remind a user that recording is in progress, a symbol illustrating a tape reel is shown in the lower right corner of all instruments (except "state light" instruments) with recording active.

The recording file contains five types of records, each mirroring control blocks internal to the performance tool. The record types are the following:

1. Console Information
2. Instrument Information
3. Value Display Information
4. Value Detail Information
5. Data Value records Table 1 describes the layout of the console record. This record contains information such as the left and top offset of the console (measured in pixels from the left side of the display), the height and width of the console window (in pixels), a count of the number of instruments within this console, and the major and minor protocol versions. The major and minor protocol version fields are used to identify different protocol versions across releases. If the recording format has major changes, the "major" protocol version number is incremented. Minor changes, or versions for different systems, would cause the "minor" protocol version number to be incremented. Thus, these fields allow the playback subsystem to identify recordings that are of a compatible level. This console information is written to the recording file at 176 (FIG. 9) if a new recording file is being created, as determined by 174.

TABLE 1

| Console Information | | | |
|---|---|---|---|
| unsigned short left; | /* | geometry: left offset | */ |
| unsigned short top; | /* | geometry: top offset | */ |
| unsigned short w; | /* | geometry: window width | */ |
| unsigned short h; | /* | geometry: window height | */ |
| unsigned short count; | /* | count of instruments | */ |
| unsigned short major; | /* | major protocol version | */ |
| unsigned short minor; | /* | minor protocol version | */ |

For each instrument within the console being recorded, the information of Table 2 is written to the recording file 100, such that the format of the internal control block consistency is maintained between the subsystems. This information is written at 184 (FIG. 9) when a new recording file is being created, as determined at 182.

Referring to Table 2, the graph type indicates whether this is a monitor-type (i.e. fixed) or skeleton-type (created from a skeleton). The graph collection name is the name of the console to which this instrument belongs. The subgraph number indicates which positional instrument this is within the console. The offsets are the location of the instrument within the console, specified as a percentage of the height (for top and bottom offsets; top being 0%) and width (for left and right offsets; left being 0%). The number of pixels to shift specifies how many picture elements (pixels) to shift the time graphs between subsequent data recording observations. The space between bars parameter is the number of pixels to space between bar graph elements being displayed. The history parameter specifies the number of observations to save in the display buffer for an instrument. The display history buffer is a 'cache-like' buffer which maintains recent data displayed on the display. The time interval parameter specifies the data recording sampling frequency, in milliseconds. This time interval allows the granularity of samples to be varied in real time, and further allows for differing instruments to record the same value at different granularities, or frequencies. The index into tile array is a number that identifies a tile "pattern" in an array of tile patterns (e.g. vertical stripes, horizontal stripes, diagonal stripes, checkerboard, cross-hatch, etc.). These patterns can be combined with the foreground and background colors of a statistic being displayed to help differentiate it from other statistics in an instrument. The style parameter indicates the primary style of the instrument, such as a line graph, area graph, skyline graph, bar graph, state bar graph, state light graph, speedometer graph or pie chart. The stacked parameter specifies whether stacking is to be used for values that use the primary style

TABLE 2

| Instrument Information | | | | |
|---|---|---|---|---|
| char | *typ; | /* | graph type | */ |
| char | *id; | /* | graph collection name | */ |
| unsigned int | seq; | /* | subgraph number | */ |
| unsigned int | x; | /* | offset from left of Form | */ |
| unsigned int | y; | /* | offset from top of Form | */ |
| unsigned int | x2; | /* | offset from right of Form | */ |
| unsigned int | y2; | /* | offset from bottom of Form | */ |
| unsigned int | br; | /* | no of pixels to shift/obs. | */ |
| unsigned int | sp; | /* | space between bars | */ |
| unsigned int | hist; | /* | history, # of observations | */ |
| unsigned int | t; | /* | time interval, millisecs | */ |
| char | foregr[64]; | /* | foreground color name | */ |
| char | backgr[64]; | /* | background color name | */ |
| short | tile_ix; | /* | index into tile array | */ |
| graph_style | style; | /* | primary style of graph | */ |
| boolean | stacked; | /* | True if stacking active | */ |

The basic description of each of the values of an instrument is stored in a record type shown in Table 3. The svp field is used to identify the value within the instrument and to match the following two record types (defined in Tables 4 and 5) with this one. The field is interpreted as two 16-bit values, where one identifies the instrument and the other gives the relative value number within the instrument. Again, this same principle is used for the two record types described next. The r1 and r2 values allow for scaling of graphs to match the data being recorded/displayed. There is a threshold alarm value, to trigger an action as described below. The index into tile array provides for differing tile patterns to be used for the graph fill. The graph style saves the style of graph to be displayed on a subsequent playback. Weighting allows to average more than a single sampled value to include the result of multiple samples taken over a period of time, thus providing a way to stabilize/average widely varying data samples. The descending flag indicates an alarm is to be triggered when the sampled value drops below (as opposed to going above) the threshold value. The path, label, and color fields are self-explanatory.

TABLE 3

| Value Display Information | | | | |
|---|---|---|---|---|
| struct StatVals | *svp; | /* | Statistics value pointer | */ |
| unsigned long | r1; | /* | scale min value | */ |
| unsigned long | r2; | /* | scale max value | */ |
| unsigned long | thresh; | /* | threshold value for alarm | */ |
| short | tile_ix; | /* | index into tile array | */ |
| unsigned | style; | /* | graph style for this value | */ |
| unsigned | weighting; | /* | true if weighting/ averaging | */ |

TABLE 3-continued

| | Value Display Information | | |
|---|---|---|---|
| unsigned | descending; | /* | true if threshold is descend. */ |
| char | path[128]; | /* | path name of statistic */ |
| char | label[64]; | /* | any user-defined label */ |
| char | color[64]; | /* | name of color to plot value */ |

The contents of the record type of Table 4 might as well have been included in the former record type of Table 3. The current format is chosen because it matches the internal control block format of the performance tool (i.e. the same as blocks created from the configuration file by the configuration. There is one instance of this record type for each value defined in the console. The name and description of the value are self-explanatory. The data type field specifies the type of data that is recorded (e.g. counter (counts/time interval) or quantity data(Cumulative count)). The data format field specifies the internal format of the data (e.g. floating point, long word, short word, character, etc.).

TABLE 4

| | Value Detail Information | | |
|---|---|---|---|
| unsigned long | svp; | /* | statistics value pointer */ |
| char | name[SI_MAXNAME]; | /* | name of value */ |
| char | descr[SI_MAXLNAME]; | /* | description of value */ |
| enum ValType | value_type; | /* | value type */ |
| enum DataType | data_type; | /* | data format */ |

Whenever a set of data values is received for an instrument that is currently recording, a record as shown in Table 5 is written to the recording file 100. The svp pointer has previously been described. The actual data and delta values are self-explanatory. The instrument identifier field is an identifier value that tells which instrument to which this array of recorded values belongs. Count is the number of values contained in this record. The two time fields are self-explanatory, and are used to timestamp the values that were captured. The Instr_Def data structure defines an "array of data reads" that has "n" records (as specified by the "count" field), the records being of the format defined by the Per_Val_Rec structure shown in this Table 5.

TABLE 5

| | Data Value Records | | |
|---|---|---|---|
| typedef struct | | | |
| { | | | |
| long | svp; | /* | statistics value pointer */ |
| union Value | val; | /* | actual data reading */ |
| union Value | val_change; | /* | delta value (value change) */ |
| } Per_Val_Rec; | | | |
| typedef struct { | | | |
| unsigned short | ssp; | /* | instrument identifier */ |
| unsigned short | count; | /* | count of values in record */ |
| struct timeval | time; | /* | time of data reading */ |
| struct timeval | time_change; | /* | elapsed time since previous reading */ |
| Per_Val_Rec | r[MAX_PLOTS_PER_GRAPH]; | /* | array of data reads */ |
| } Instr_Def; | | | |

Figure 10:
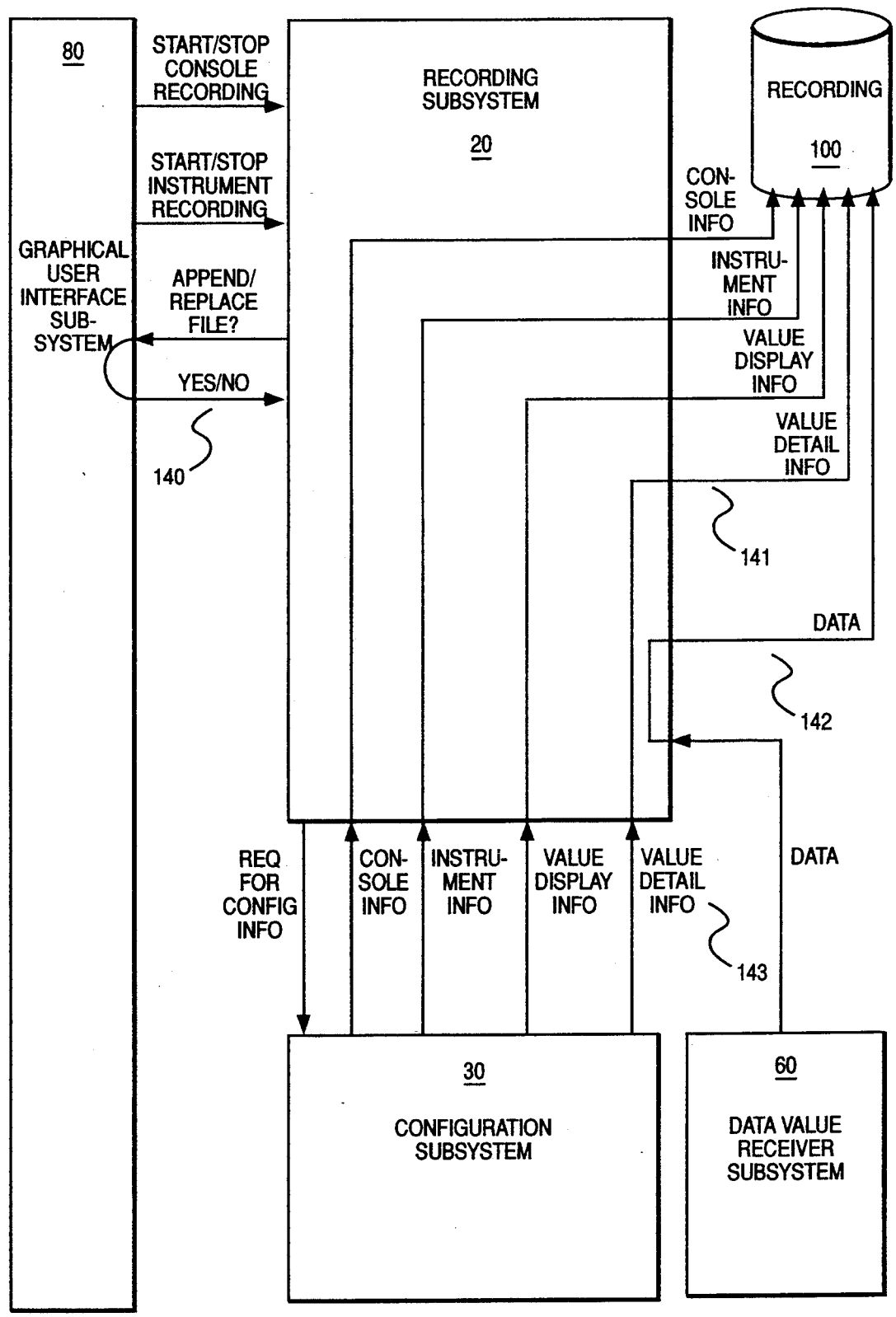
FIG. 10 depicts the recording subsystem interfaces to the overall performance tool system.

The recording subsystems interfaces of FIG. 5 are further expanded in FIG. 10. The interface 140 between the GUI 80 and the recording system 20 comprises messages from the GUI 80 to start/stop console recording and to start/stop instrument recording. The recording subsystem 20 can send a message to the GUI 80, to be presented to a user/operator of the performance tool, on whether the user desires to append or replace the recording file. The GUI 80 returns a yes/no user response in a message to the user.

The interface 142 between the data value receiver subsystem 60 and the recording subsystem 20 comprises data blocks. The recording subsystem 20 does not have to worry with, or maintain, the origin of the data, as this operation is done by the data value receiver subsystem. The recording subsystem 20 also treats local and remote data statistics identically, further providing minimal overhead delays when recording data. This is because all data, whether local or remote, is treated the same by the data value receiver subsystem 60. Thus, based on this modular design, data can be quickly recorded in real-time as the overhead for receiving a packet of data and storing in the recording file is minimal. Further, as the overhead is minimal, recording can occur concurrently with the display of data, as will be later described.

The interface 141 between the recording subsystem 20 and the recording file 100 comprises the data to be recorded (described above), as well as the console, instrument, value display, and value detail information, thus maintaining the context of the stored recording data. This information (console, instrument, value display, and value detail) is obtained across interface 143 from the configuration subsystem 30, as initiated by a request for configuration information from the recording subsystem 20.

IMPLEMENTATION OF PLAYBACK SUBSYSTEM

Figure 12B:
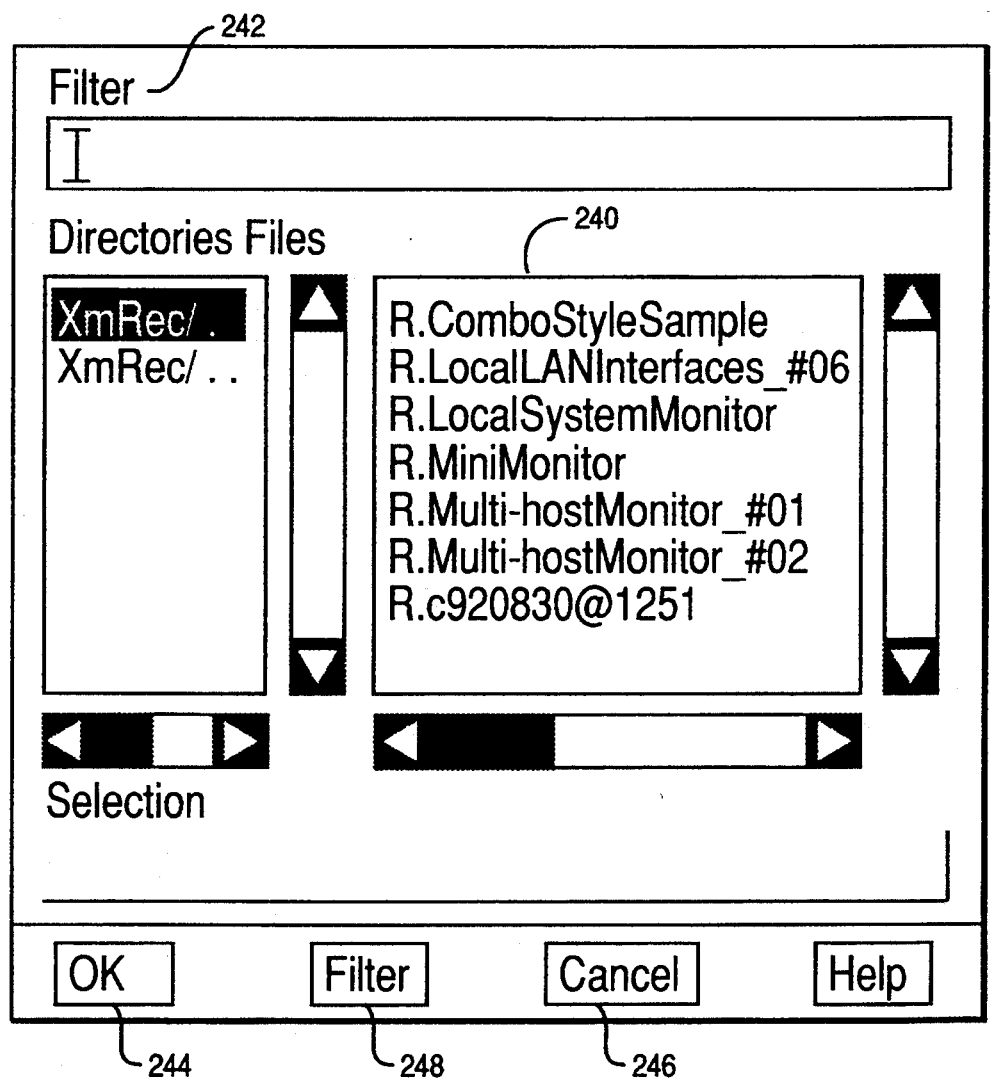

Referring initially to FIG. 12a, playback 234 is initiated from the "File" 232 menu of the main window of the performance tool user interface 230, as shown in FIG. 12a. When the "playback" menu item is selected (as determined by the GUI), a list of files 240 available for playback is presented, as shown in FIG. 12b. The file list consists of all files in the "$HOME/XmRec" directory with a prefix of "R.". A user can use the filter selection or button 248 and the filter portion of the file selection box at 242 to look for other masks in whichever directory they want. To select a file to replay, a user clicks on it as indicated and then on the "OK" button 244 or double-clicks on the file name. The selection box will remain open after a user selects a file to replay. This allows the user to select more than one file. To make the selection box go away, a user clicks on "Cancel" 246.

Figure 12C:
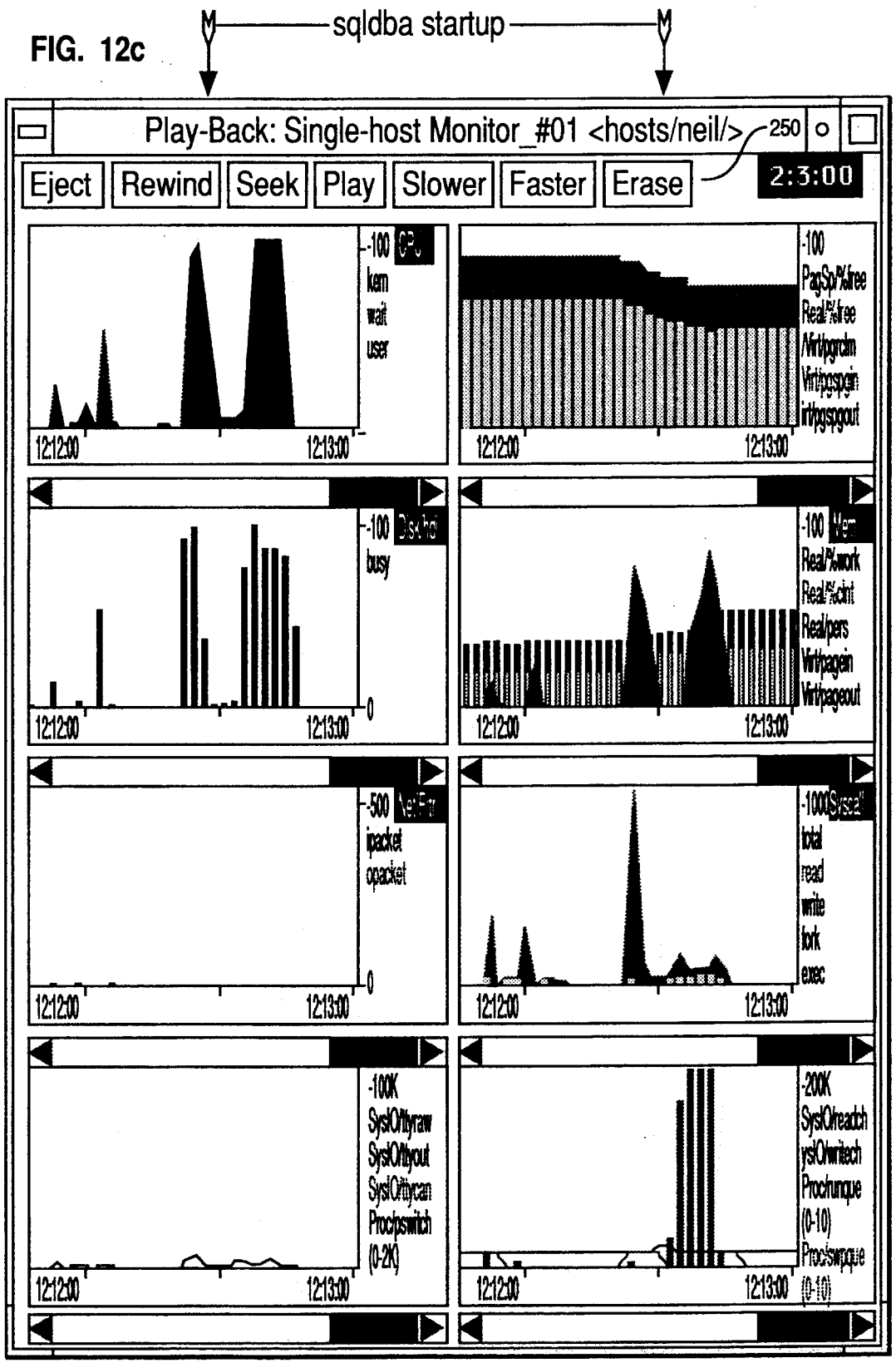

When a user selects a valid playback file, GUI instructs the playback system to open the file, as detected at 252. The performance tool reads the console configuration from the recording file and creates the console at 254 of FIG. 15. The playback console is constructed from the console, instrument, value display, and value detail information records read in from the start of each recording (information structures described in Tables 1–4). This data is used to construct the playback console in the same manner that the data display subsystem constructs a regular console from data it reads in from the console configuration file. The main difference is that the creation of the playback console does not allow the normal console command pulldown or popup menus, but instead creates a special set of buttons to control the playback functions (e.g. Eject, Erase, Rewind, Seek, Play, Stop, Slower, and Faster), as shown in FIG. 12c at 250. Playback doesn't start until a user clicks on the "Play" button.

The functions of the buttons as selected by a user, and the resulting operations, are as follows:

Eject

Figure 15:
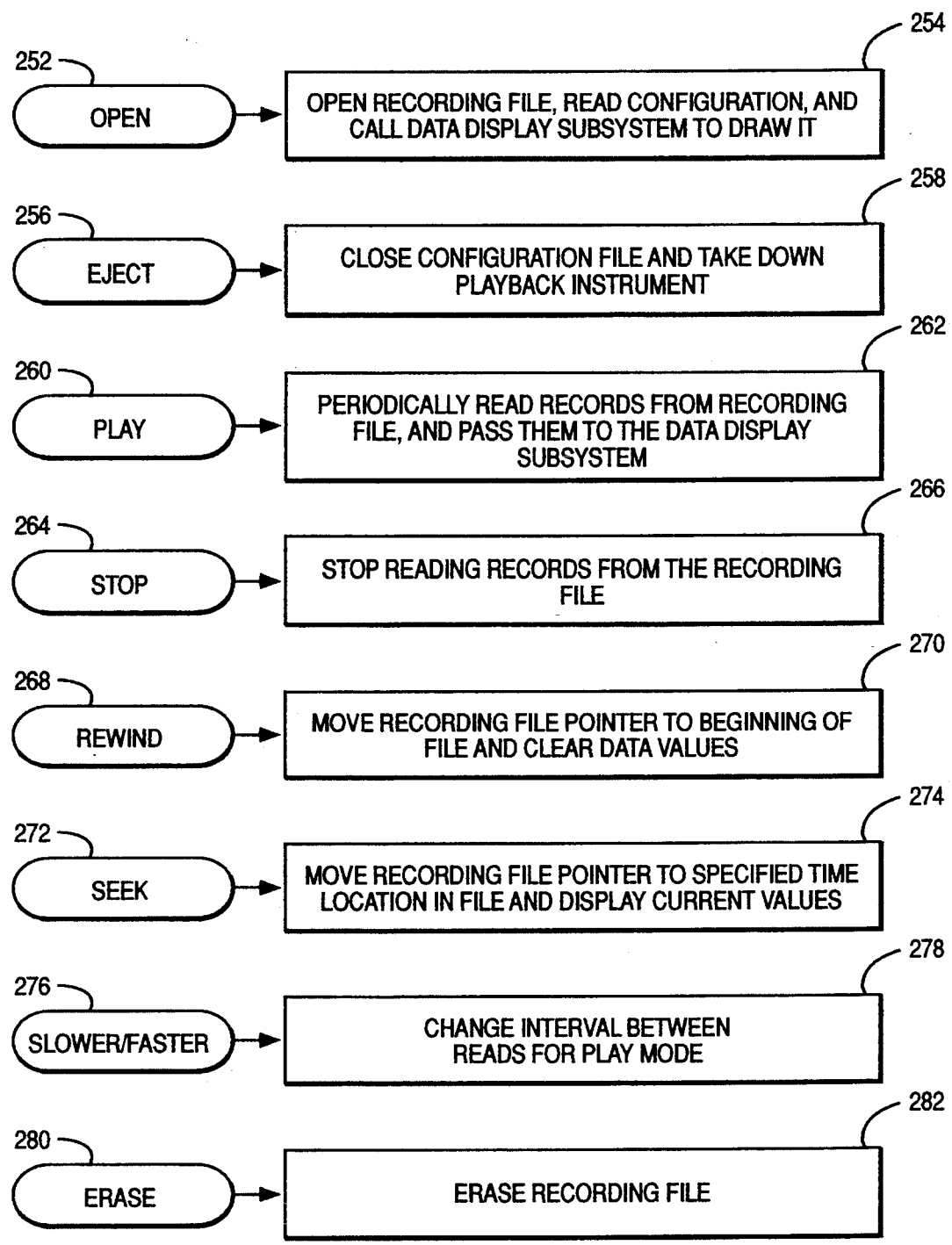
FIG. 15 is a flow diagram of the internal operations of the playback subsystem.

Immediately stops playback, closes the console, and closes the playback file. To restart playback you must reselect "playback" from the "File" menu of the main window and reselect the playback file 100. Internal to the performance tool, and in reference to FIG. 4, the GUI 80 component gets notified via user controls 130 that the "Eject" button was depressed and sends a message to the playback subsystem 50 to stop the playback as detected at 256 (FIG. 15). The playback subsystem 50 then calls the data display subsystem 40 to remove the associated playback console and cleanup at 258 of FIG. 15. Next, the playback subsystem 50 closes the associated recording file 100 and exits.

Erase

Allows a user to erase a playback file. When this button is selected, a dialog window will pop up. The dialog window warns that the user has selected the erase function, and indicates the name of the file currently playing back from. To erase the file and close the playback console, a user selects "OK". To avoid erasure of the file, a user selects "Cancel". Internal to the performance tool, the GUI 80 component gets notified via user controls 130 that the "Erase" button was depressed and sends a message to the playback subsystem 50. The playback subsystem 50 sends a message to the GUI 80 to display a dialog window to inform and solicit a response from the user. The user is prompted to confirm the erasure of the recording file 100 or cancel their request. If the user confirms the desire to erase the recording file (via user controls 130), the playback subsystem 50 will delete the recording file 100 at 282 (FIG. 15) and then call the data display subsystem 40 to remove the associated playback console from the display and cleanup.

Rewind

Resets the console by clearing all instruments and rewinds the recording file 100 to its start. Playback does not start until a user selects "Play". The "Rewind" button is not active while playback is ongoing. Internal to the performance tool, the GUI component 80 gets notified via user controls 130 that the "Rewind" button was depressed. The GUI sends a message indicating this selection to the playback subsystem 50. The playback subsystem 50 detects this (268 of FIG. 15) and sends a message to the data display subsystem 40 to reset all the console instruments back to their initial state (270 of FIG. 15). The playback subsystem then resets a pointer to the beginning of the recording file 100. The playback of a recording does not start until a user selects the "Play" menu button.

Seek

User selection of "Seek" pops a dialog box that allows a user to specify a time desired to seek for in the playback file 100. The time can be set by clicking on the "Hour" or "Minute" button. Each click will advance the hour or minute by one. By a user holding the button down more than one second, the hour or minute counter advances faster. Once the digital clock shows the time desired to seek for, a user then clicks on the "Proceed" button. This will cause all instruments in the console to be cleared and the playback file to be searched for the specified time. Internal to the performance tool, the GUI 80 component gets notified via user controls 130 that the "Seek" button was depressed and sends a message to the playback subsystem 50. The playback subsystem 50 sends a message to the GUI component 80 to display a dialog box to allow the user to specify a recording time to "seek to". Each data element in a recording has a timestamp that was affixed to the data value when the data was gathered by the data supplier. When the recording subsystem 20 records the data, it preserves the original timestamp. After the user selects the "seek to" time, the GUI 80 passes this parameter to the playback subsystem 50. The playback subsystem 50 detects this at 272 (FIG. 15) and then calls the data display subsystem 40 to reset the recording console instruments to their initial value. The playback subsystem then opens the recording file 100, reads in the graphical context of the recording, passes this data to the data display subsystem 40, and reads recording data from the recording file until it finds the specified "seek to" time. As the playback system 50 reads the recorded data into memory, it checks the timestamp of each data entry and can thus seek to a particular point in time of a recording. The playback subsystem then sets the playback time pointer to this "seeked" data record at 274 (FIG. 15), and then waits for the user to select, via GUI 80, the "Play" button to start the playback from this recording time record.

In situations where a playback file spans over midnight, so that the same time stamp exists more than once in the playback file, the seek proceeds from the current position in the playback file and wraps to the beginning if the time is not found. Because multiple data records may exist for any hour/minute, "Play" should be used to advance to the next minute before doing additional seeks on the same time, or seek for a time one minute earlier than the current playback time. The "Seek" button is not active while playing back.

Play

Starts playing from the current position in the playback file. While playing, the button's text changes to "Stop" to indicate that playing can be stopped by clicking the button again. Immediately after opening the playback console, the current position will be the beginning of the playback file. The same is true after a rewind. Internal to the performance tool, the GUI 80 component gets notified via user controls 130 that the "Play" button was depressed and sends a message to the playback subsystem 50. The playback subsystem 50 detects this at 260 and tells the GUI subsystem 80 to change the "Play" button to a "Stop" button and then starts to feed the data display subsystem 40 with recording data from the current position of the recording file at 262 (FIG. 15). Initially, playing back is attempted at approximately the same speed at which the data was originally recorded. The speed can be changed by using the "Slower" and "Faster" buttons. While playing back, neither the "Rewind" nor the "Seek" buttons are active. The playback subsystem 50 continues to feed recording data to the data display subsystem 40 until it reaches the end of the recording file 100, or the user presses the "Stop" button via user controls 130. If the user presses the "Stop" button, the GUI 80 is notified and sends a message to the playback subsystem 50. If "Stop" is signalled, the playback subsystem 50 tells the GUI to change the "Stop" button to a "Play" button and then stops feeding the data display subsystem 40 with recording data. The playback subsystem 50 then waits for an indication that the user has selected another action.

Slower

A user clicks on this button to cut the playback speed to half of the current speed. The GUI 80 gets notified that the "Slower" button was depressed via user controls 130, and sends a message to the playback subsystem 50, where it is detected at 276 (FIG. 15). The playback subsystem 50 divides its playback rate parameter in half at 278 (FIG. 15), so that it now feeds the data to the data display subsystem 40 at half its present rate, thus providing a variable playback rate.

Faster

A user clicks on this button to double the playback speed. The GUI 80 gets notified that the "Faster" button was depressed via user controls 130, and sends a message to the playback subsystem 50, where it is detected at 276 (FIG. 15). The playback subsystem 50 doubles its playback rate parameter at 278 (FIG. 15), so that is now feeds the data to the data display subsystem 40 at double its present rate, thus providing a variable playback rate.

00:00:00

At the far right of a console is a digital clock. It shows the time corresponding to the current position in the playback file 100 or zeroes if at the beginning of the file 100. As play back proceeds, the clock is updated. This is done by reading the time stamp associated with the playback data being read from the recording/playback file.

Recordings from instruments contain control blocks describing the instrument and console from which the recording was done, as previously described. There are a few possible surprises that may occur when a user attempts to playback from a file that does not contain valid configuration and/or statistics data.

Playing from saved buffers

When the buffer of an instrument or console is saved, that buffer may not be full because the monitoring has not been going on for a long enough time. If such a recording is replayed, the playback will show values of zeroes up to the up to the point where real data values are available.

Unsynchronized Instruments

Playback from recordings of multiple data supplier hosts in one console behaves just like the real console in that time stamps are applied to each instrument (where applicable) as they are read from the data. This reflects the differences in time-of-day as set on the data supplier hosts and thus should not be a surprise. However, these "time warps" do influence the "Seek" function and the current position clock.

Recordings from Instantiated Skeleton Consoles

Each time a skeleton console is instantiated, the actual choices made are very likely to vary. Even when, say, the same three remote hosts in two instantiations are selected, the sequence in which the hosts appear in the instantiated console is very likely to be different, due to various response delays inherent in a multi-computer data processing system interconnected via a communication network. This is no problem as long as new recordings are created for each instantiated console. However, if a recording is appended to a previous one with the same name, things will get messy. The reason is that a recording contains the definition of the console only once: at the beginning of the recording. During playback, when the position where a different instantiation was appended to a previous recording is reached, it is assumed that the relative position of instruments and values are unchanged.

Figure 13:
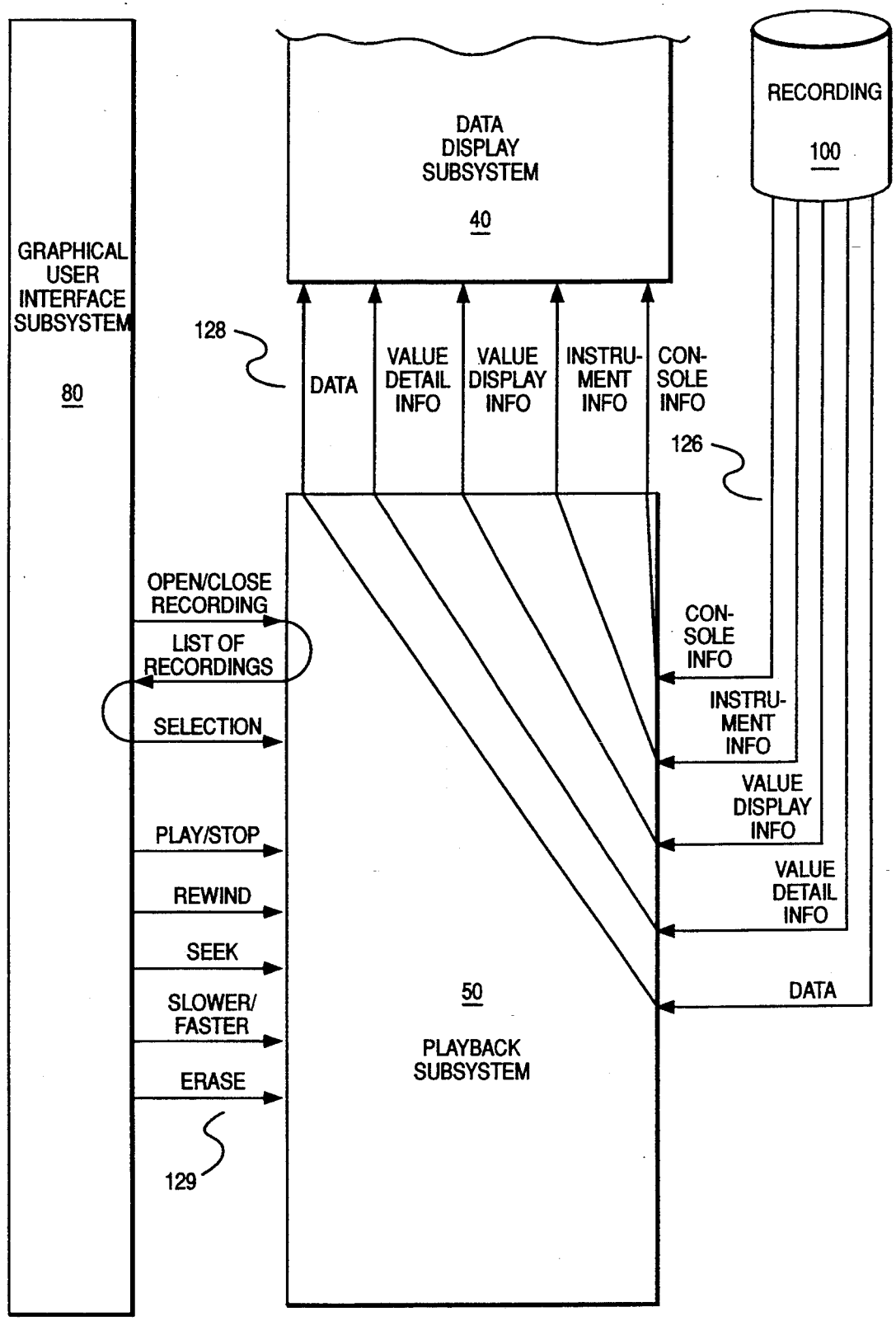
FIG. 13 depicts the playback subsystem interfaces to the overall performance tool system.

FIG. 13 further expands the interfaces of the playback system shown in FIG. 6. The interface 129 between the GUI 80 and the playback subsystem 50 comprises a message initiated by an operator to open/close a recording. The playback subsystem responds to the GUI with a list of recordings available and the user's selection is returned from the GUI to the playback subsystem. Further messages from the GUI, as initiated by an operator, are to play/stop, rewind, seek, slower/faster and erase a recording file 100.

The interface 126 between the recording file 126 and the playback subsystem 50 provides the actual data to be displayed on a computer console, such as that shown in FIG. 12c. Further information read from the recording file 100 includes console, instrument, value display and value detail information. Again, this information is used to preserve the display context of the data to be presented to a user.

All information and data read at interface 126 is passed immediately to the data display subsystem 40 at interface 128. Minimal system overhead is required to read the data and display it, allowing for other subsystem activities to occur with the actual displaying of data, such as recording the same or other performance data.

Concurrency of Playback with Recording

Figure 14:
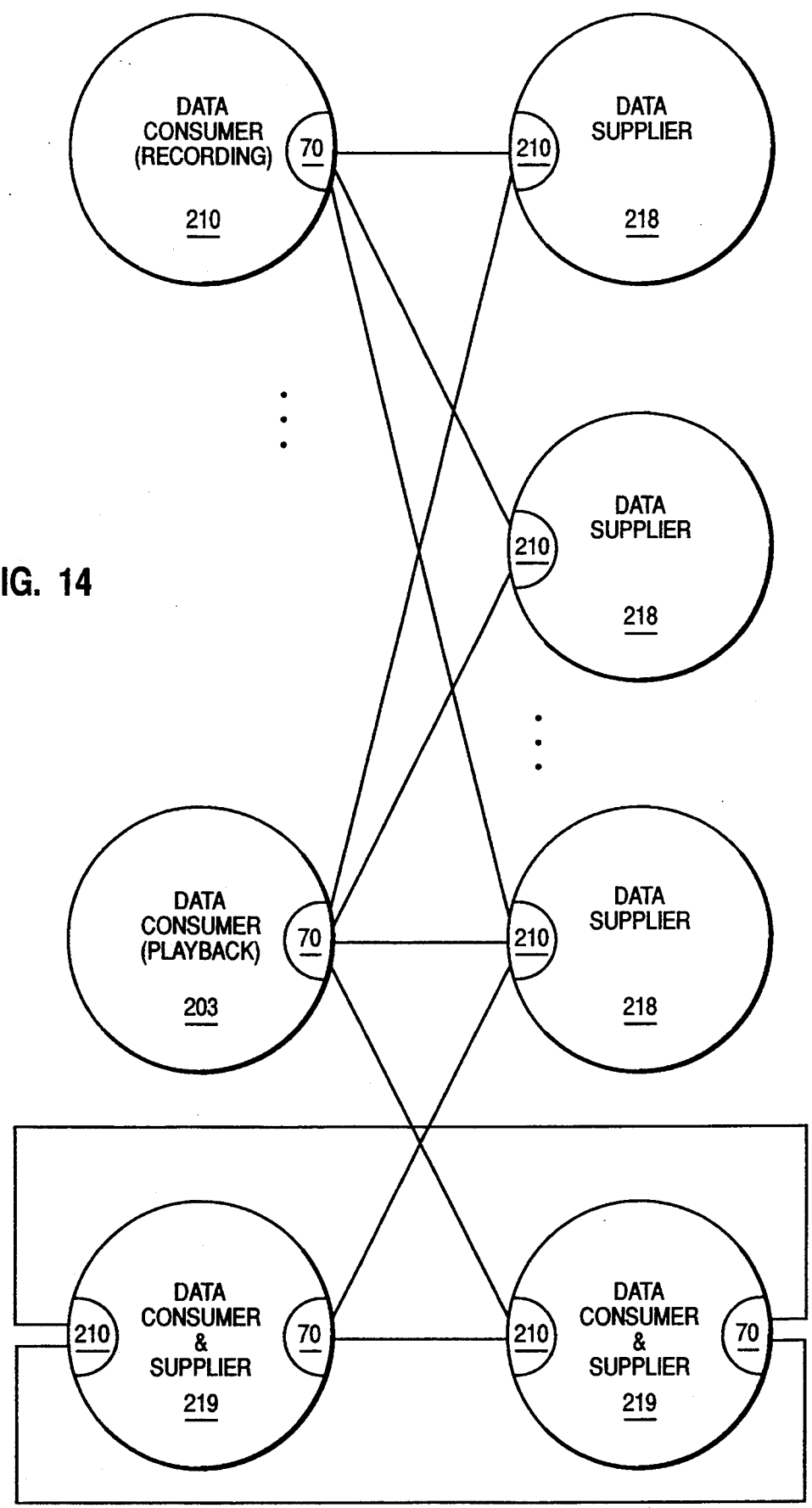
FIG. 14 depicts concurrent operations between multiple data processing systems.

When recording to, and playing back from, a linear media such as a magnetic tape, one can only have limited playback control while recording because the "read head" follows the "write head" while the tape mechanism is moving. This arrangement is quite inflexible and does not allow functions like rewind, search, faster, slower, or play/stop while recording. In the preferred embodiment disclosed herein, recording is done on a filesystem that allows concurrent reading writing to a common file. Therefore, the record and playback functions are more independent in their operations than those of a linear media. The record function can continuously record prespecified data while a playback function can simultaneously read the data already recorded, up to the currently recorded data record, without disturbing the recording process. If a copy of the recording file is made to another file, then the playback can be done totally concurrently and independently of the original recorded file. Another technique that can be used is to copy the context of the data to be recorded and create two recording sessions for the same data. Then, a playback session can be invoked on one session while the other session continues recording of data. As shown in FIG. 14, this technique can similarly be extended to multiple remote machines 218, such that any machine 201 is recording data while any other machine 203 is currently playing back the data from the same data source 210 on remote machine 218. This technique is feasible since a single data source 210 can feed multiple consumer applications concurrently. Further, data consumer and data supplier can coexist on a single machine 219, and similarly supply other data consumers and data suppliers in the network. One example of a combined data consumer and data supplier will be described later in the discussion on filters and alarms.

DATA DISPLAY SUBSYSTEM IMPLEMENTATION

Instruments

An instrument occupies a rectangular area within the window that represents a console. Each instrument may plot up to 24 values simultaneously in the preferred embodiment, with the reading of all values taken at the same time. All values in that instrument must be supplied from the same remote host. This allows for live displays/recordings of statistics from remote hosts, as the processing overhead is minimized by maintaining this restriction.

The ability to dynamically add, change, or delete multiple data statistics to a monitoring instrument is a very powerful usability aid in visualizing the correlation between nominally disjoint parameters. This combinatorial feature coupled with the ability to display each parameter in a different color and presentation style (e.g., line, bar, area, skyline, etc.) in a live time graph, allows a very complex presentation of data that can still be comprehended with a minimum of explanation. In fact, a console of instruments can be constructed to show data from local and remote hosts, including statistics on individual processes. Additionally, custom data from applications that have registered with the Data Server daemon can be added to the viewing instruments that show normal system statistics (also from local or remote hosts). All of these operations can be done while the instruments are receiving data from the data supplier(s) and the display views are updated in real time (live). Data values of the same primary style can also be stacked and unstacked without disturbing the reception of data.

Figure 12D:
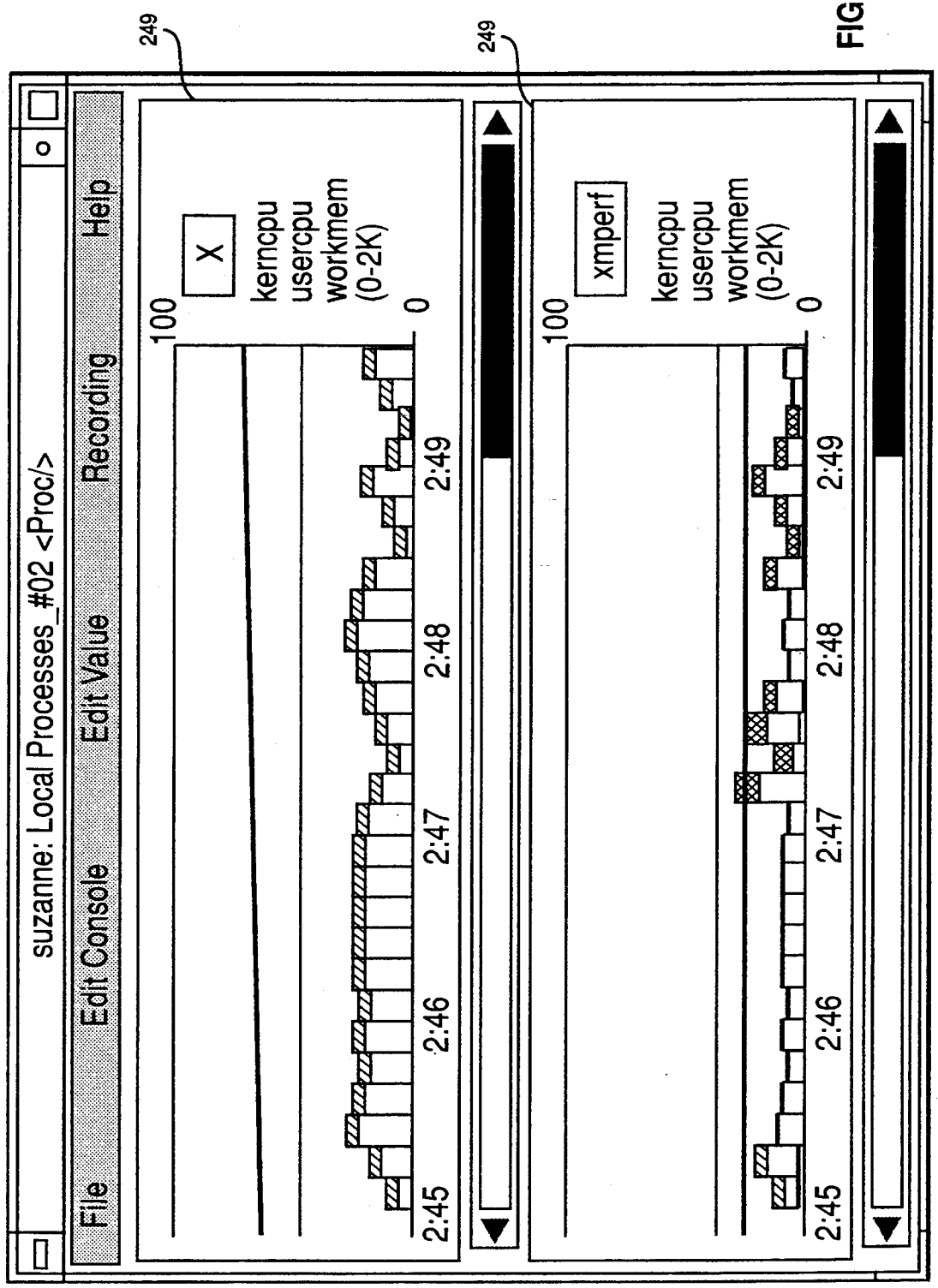

A recording graph/instrument shows statistics for a system resource over a period of time, as shown at 249 in FIG. 12d. Recording graphs have a time scale with the current time to the right. The values plotted are moved to the left as new readings are received.

Figure 12E:
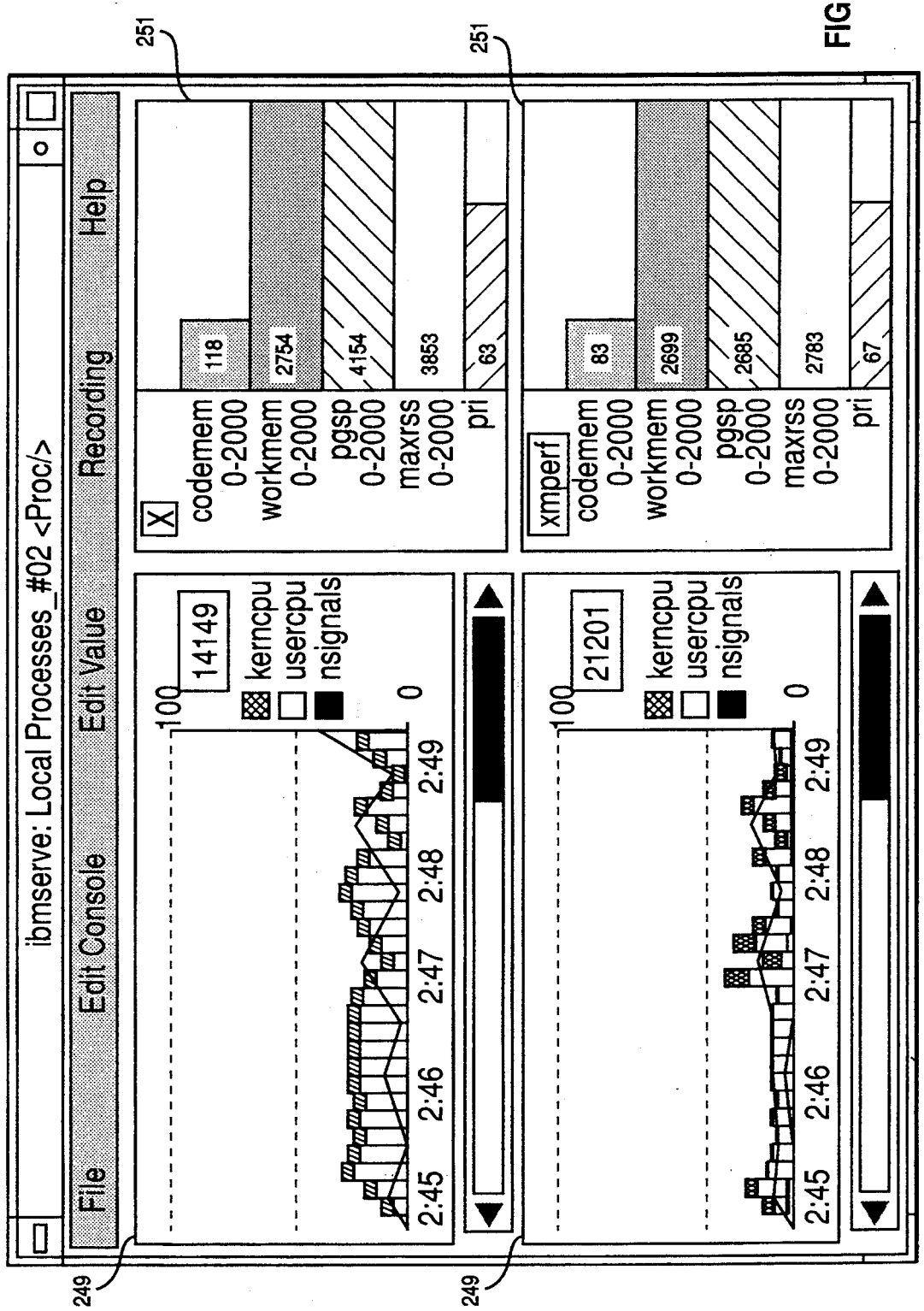

A state graph/instrument 251 of FIG. 12e shows the latest statistic for a system resource, optionally as a weighted average. They do not show the statistics over time, but collect this data in case it is desired to change the graph to a recording graph.

Instruments can be configured through a menu-based interface. In addition to selecting from values to be monitored with the instrument, the following properties are established for the instrument as a whole:

Style

The primary style of the graph. If the graph is a recording graph, not all values plotted by the graph need to use this graph style. In the case of state graphs, all values will be forced to use the primary style of the instrument.

Default=Area graph

Foreground

The foreground color of the instrument. Most noticeably used to display time stamps and lines to define the graph limits.

Default=White

Background

The background color of the instrument.

Default=Black.

Tile

A pattern (pixmap) used to "tile" the background of the instrument. Tiles are ignored for state light type instruments. When tiling is used, it is always done by mixing the foreground color and the background color of the instrument in one out of eleven available patterns.

Interval

The number of milliseconds between observations.

Default=2,500 milliseconds.

History

The number of observations to be maintained by the instrument. For example, if the interval between observations is 2,500 milliseconds and you have specified that the history is 1,000 readings, then the time period covered by the graph will be 1,000×2.5 seconds or approximately 42 minutes.

The history property has a meaning for recording graphs only. If the current size of the instrument is too small to show the entire time period defined by the history property can be scrolled to look at older values. State graphs show only the latest reading so the history property does not have a meaning for those. However, since the user can change the primary style of an instrument at any time, the actual readings of data values are still kept according to the history property. This means that data is not lost if the primary style is changed from a state graph to a recording graph. Since the graph image can be bigger in the viewing area (window), scrolling is accomplished by using a Motif scroll-bar widget to make the appropriate part visible. During scrolling, the data display subsystem continues to update the graph image with real time data. Therefore, data integrity is maintained during scrolling. This data is then presented to the user on the display using the GUI. The minimum number of observations is 50 and the maximum number is 5,000.

Default=500 readings.

Stacking

The concept of stacking allows data values to be plotted "on top of" each other. Stacking works only for values that use the primary style. To illustrate, think of a bar graph where the kernel-cpu and user-cpu are plotted as stacked. If at one point in time the kernel-cpu is 15% and the user-cpu is 40%, then the corresponding bar will go from 0-15% in the color of kernel-cpu, and from 16-55% in the color used to draw user-cpu.

If it is desired to overlay this graph with the number of page-in requests, one could do so by letting this value use the skyline graph style, for example. It is important to know that values are plotted in the sequence they are defined. Thus, if a user wanted to switch the cpu measurements above, they would simply define user-cpu before defining kernel-cpu. Values to overlay graphs in a different style, should always be defined last so as not to be obscured by the primary style graphs.

Default=No stacking

Shifting

This property is meaningful for recording graphs only. It determines the number of pixels the graph should move as each reading of values is received. The size of this property has a dramatic influence on the amount of memory used to display the graph since the size of the pixmap (image) of the graph is determined by the product:

$$history \times shifting \times graph\ height$$

If the shifting is set to one pixel, a line graph looks the same as a skyline graph, and an area graph looks the same as a bar graph. Maximum shifting is 20 pixels, minimum is 1 pixel.

Default=4 pixels

Spacing

A property used for bar graphs. It defines the number of pixels separating the bar of one reading from the bar of the next. Note that the width of a bar always is (shifting−spacing) pixels. The property must always be from zero to one less than the number of pixels to shift.

Default=2 pixels

In addition to the above properties that can be modified through a menu interface, four properties determine the relative position of an instrument within a console. They describe, as a percentage of the console's width and height, where the top, bottom, left and right sides of the instrument are located. In this way, the size of an instrument is defined as a percentage of the size of the monitor window.

The relative position of the instrument can be modified by moving and resizing it as is commonly done in a MOTIF-like user interface, and as described below.

For the state light graph type, foreground and background colors are used in a special way. To understand this, consider that state lights are shown as text labels "stuck" onto a background window area as though paper notes attached to a bulletin board. The background window area is painted with the foreground color of the instrument rather than with the background color. The color of the background window area never changes.

Each state light may be in one of two states: Lighted (on) or dark (off). When the light is "off", the value is shown with the label background in the instrument's background color and the text in the instrument's foreground color. Notice that if the instrument's foreground and background colors are the same, one would see only an instrument painted with this color—no text or label outline is visible. If the two instrument colors are different, the labels will be seen against the instrument background and label texts are visible.

When the light is on, the instrument's background color is used to paint the text while the value color is used to paint the label background. Thus, the special use of colors for state lights allows for the definition of alarms that are invisible when not triggered—or alarms that are always visible. The colors chosen depend on the selections made during setup.

Skeleton Instruments

Some computer system objects change over time. One prominent example of these changes is the set of processes running on a system. Because process numbers are assigned by the operating system as new processes are started, it is not known what process number an execution of a program will be assigned. Clearly, this makes it difficult to predefine consoles and instruments for processes in the configuration file.

To help cope with this situation, a special form of consoles can be used to define skeleton instruments. Skeleton instruments are defined in the configuration file as having a "wildcard" in place of one of the hierarchical levels in the path that define a value. For example, a user could specify that a skeleton instrument for processes which have the following two values defined:

Proc/*/kern

Proc/*/user

The wildcard is represented by the asterisk. In the above example, it appears in the place where a fully qualified path name would have a process ID. Whenever users try to start a console with such a wildcard, they are presented with a list of processes. From this list, the user can select one or more processes. Each process selected is used to generate a fully qualified path name. Each path name is then used to define either a value to be plotted or define a new instrument in the console.

Skeleton instruments are also useful for handling the problem of varying resource configurations across different systems or over time. A skeleton instrument could be defined in which the disk name was replaced by a wildcard, to permit monitoring of any disk configuration on any system.

The type of skeleton defined determines which one is selected. There are two types of skeletons, as described in the following sections.

The skeleton type named "All" is so called because an instrument of this type will include all instances of the wildcard which are selected into the instrument. In the case of processes, this would include all selected processes. A skeleton instrument creates one instance of an instrument and this instrument contains values for all selected processes.

Consoles may be defined with both skeleton instrument types but any non-skeleton instrument in the same console will be ignored. The relative placement of the defined instruments is kept unchanged. This may result in very crowded instruments when many processes are selected, but it is easy to resize the console. When only the "All" type skeleton instruments are defined, the performance tool will not resize the console.

The type of instrument best suited for "All" type skeleton instruments is the state bar, but other graph types may be useful if the user chooses to allow colors to be assigned to the values automatically. To do the latter, the color is specified as "default" by the user when the skeleton instrument is defined.

The "Each" skeleton type is so named because each instance of the wildcard object which is selected will create one instance of the instrument. In the case of processes, when five processes are selected by a user, each of the type "Each" skeletons will generate five instruments, one for each process.

Again, one console may define more than one skeleton instrument and consoles can be defined with both skeleton instrument types, while any non-skeleton instruments in the same console are ignored. The relative placement of the defined instrument is kept unchanged. This may result in very small instruments when many processes are selected, but it's easy to resize the console. If the generated instruments would otherwise become too small, the performance tool will attempt to resize the entire console.

The types of instruments best suited for the "Each" type skeleton instruments are the recording instruments (as exemplified in FIG. 12C). This is further emphasized by the way instruments are created from the skeleton:

1. The relative horizontal placement is never changed.
2. The relative vertical position defined by the skeleton is not changed, but the skeleton instrument is subdivided into the number of instruments to be created.

3. Each created instrument will have the full width of the skeleton instrument.
4. Each created instrument will have a height, which is the total height of the skeleton divided by the number of objects (e.g. processes) selected, as shown at 251 of FIG. 12e.

Wildcards must represent a section of a value path name which is not the end point of the path. It could represent any other part of the path, but it only makes sense if that part may vary from time to time or between systems. With the standard statistics, the following wildcards are used:

| | |
|---|---|
| PagSp/*/ . . . | Page Spaces |
| Disk/*/ . . . | Physical disks |
| NetIF/*/ . . . | Network (LAN) interfaces |
| Proc/*/ . . . | Processes |
| hosts/*/ . . . | Remote hosts |

When a console contains skeleton instruments, all such instruments should use the same wildcard. Mixing wildcards would complicate the selection process beyond the reasonable and the resulting graphical display would be incomprehensible.

An extension to the concept of single wildcard notation is to use multiple wildcards to specify all statistics for a class of system objects. This facility permits users to define generic skeleton consoles for monitoring classes of system objects (e.g. disks, processes, paging spaces, network hosts, etc.), without requiring users to identify specific instances of the class.

It allows multiple levels of specification of classes of system objects.

These skeleton consoles can then be instantiated at run-time to monitor whatever system objects exist on a particular machine or set of network machines at a particular time (e.g., hdisk0, X process,/dev/hd6, abc-.aus.ibm.com, etc., for all subnet nodes).

These skeleton consoles are defined in a text configuration file by specifying the following information:

1. All display parameters (e.g. colors, locations, sizes, graph styles, etc.)
2. The system object classes (e.g. disks or processes).
3. The particular statistics to be displayed on each graph.

For example, a configuration file line that could define a monitor consisting of a skeleton instrument for monitoring memory usage by individual processes on multiple network nodes would be:

monitor.Local Processes.1.each.1:
*/Proc/*/workmem

The above line has the information for the performance tool to monitor the working memory use of specific processes on multiple host machines. The host name and process ID are replaced with an asterisk (e.g., */Proc/*/workmem) to indicate to the performance tool that the particular hosts and processes are determined when the monitor is opened.

When all values in an instrument have all or part of the value path name in common, the performance tool determines the common part of the name from the value names displayed in the instrument and displays the common part in a suitable place. In determining how to do this, the performance tool examines the names of all values in the containing console. To illustrate, assume a single instrument is in a console, and that this instrument contains the values:

PagSp/paging00/% free

PagSp/hd6/% free

Names are checked as follows:
1. It is first checked whether all values in a console have any of the beginning of the path name in common. In this case, all values in the console have the part PagSp/ in common. Since this string is common for all instruments in the console, it can conveniently be moved to the title bar of the window containing the console. It is displayed after the name of the console and enclosed in angle brackets like this:

<PagSp/>

The remainder of the value names left to be displayed in the instrument thus are:

paging00/% free hd6/% free

2. Next, each instrument in the console is checked to see if all the value names of the instrument have a common ending. In the example, this is the case, since both values display % free. Consequently, the part of the value names to be displayed in the color of the values is reduced to:

paging00 hd6

The common part of the value name (without the separating slash) is displayed within the instrument in reverse video, using the background and foreground colors of the instrument. The actual place used to display the common part depends on the graph type of the instrument.

3. The last type of checking for common parts of the value names is only carried out if the end of the names do not have a common part. Using the example, no such checking would be done. When checking is done, it goes like this:

If the beginning of the value names (after having been truncated using the checking described in numbered point one above) have a common part, this part is removed from the value path names and displayed in reverse video within the instrument.

To illustrate, assume a console with two instruments. The first instrument has the values:

Mem/Virt/pagein

Mem/Virt/pageout while the second instrument has:

Mem/Real/% Work

Mem/Real/% free

The result of applying the three rules to detect common parts of the value names would cause the title bar of the console window to display <Mem/>. The first instrument would then have the text "Virt" displayed in reverse video and the value names reduced to:

pagein pageout

The second instrument would display "Real" in reverse video and use the value names:

% work

% free

Consoles

Consoles, like instruments, are rectangular areas on a graphical display. They are created in top-level windows of the OSF/Motif ApplicationShell class, which means that each console will have full OSF/Motif window manager decorations. These window decorations allow you to use the mwm window manager functions to resize, move, iconify, and maximize the console. The window manager Close function invokes the Exit xmperf function also available from the File menu.

Consoles are useful "containers" for instruments. A user can:

1. Move collections of instruments around in consoles, using the console as a convenient basket.
2. Resize a console and still retain the relative size and position of the instruments it contains.
3. Iconify a group of instruments so that historic data is collected and recording of incoming data continues even when the console is not visible. This also helps to minimize the load on the system.
4. Close a console and free all memory structures allocated to the console, including the historic data. Closed consoles use no system resources other than memory to hold the definition of the console.

Consoles may contain non-skeleton instruments or skeleton instruments but not both. Consequently, it makes sense to classify consoles as either non-skeleton or skeleton consoles. The two work a little differently, as will now be described.

Non-skeleton consoles may be in one of two states: open or closed. A console is opened by a user selecting it from the Monitor Menu. Once the console has been opened, it may be iconified, moved, maximized, and resized through mwm. None of these actions change the status of the console. It may not be visible on the display, but is is still considered open and if recording has been started, it continues.

After having opened one or more non-skeleton consoles, the name of the console on the Monitor Menu is now preceded by an asterisk. This indicates that the console is open. If a user selects on one of the names preceded by an asterisk, the corresponding console is closed.

Skeleton consoles themselves can never be opened. When a user selects one from the Monitor Menu, it is not opened, but rather causes the display of a list of names matching the wildcard in the value names for the instruments in the skeleton console. If a user selects one or more from this list, a new non-skeleton console is created and added to the Monitor Menu. This new non-skeleton console is automatically opened, and is given a name constructed from the skeleton console name suffixed with a sequence number.

Skeleton consoles are defined like any other console. Neither the keywords defining the console nor those defining the instruments are different. The only difference is in one keyword used to define the values in the instruments of the console. The keyword that is different is "input" keyword, which must be changed to one of "all" or "each".

The other thing that is different is that the path name of the value must contain one—and only one—wildcard, and that the path of all the "all" and "each" keywords in one console must be the same up to, and including the wildcard.

Whether to use one or the other of the keywords depends on what type of skeleton you want.

The following are two examples of skeleton definitions:

| | |
|---|---|
| monitor.Single-host Monitor.3.each.1: | hosts/*/CPU/kern |
| monitor.Single-host Monitor.3.each.2: | hosts/*/Syscall/total |
| monitor.Remote Mini Monitor.1.each.4: | NetIf/*ipacket |
| monitor.Remote Mini Monitor.1.each.5: | NetIf/*/opacket |
| monitor.Disk Monitor.1.all.1: | Disk/*/busy |

Note that skeleton types within a console can be mixed and that all paths up to the wildcard must be the same, not only in an instrument but for all instruments in a console.

Skeleton instruments of type "all" can, as has already been pointed out, only have one value defined. It follows that all values in the instantiated instrument will have the same color, namely as defined for the value in the skeleton instrument. This is rather dull. Worse though, is that it effectively restricts the "all" type skeletons to use the state bar graph type since otherwise you wouldn't be able to tell one value from another.

To cope with this, one can define the color for a value in a skeleton instrument of type "all" as "default". This will cause xmperf to allocate colors to the values dynamically as values are inserted during instantiation of the skeleton. Below is an example of a full value definition using this feature:

| | |
|---|---|
| monitor.Processes.1.all.1: | hosts/myhost/Proc/*/kerncpu |
| monitor.Processes.1.color.1: | default |
| monitor.Processes.1.range.1: | 0-100 |
| monitor.Processes.1.label.1: | cmd |

The non-skeleton console created from the skeleton is said to be an "instance" of the skeleton console; a non-skeleton console has been instantiated from the skeleton. The instantiated non-skeleton console works exactly as any other non-skeleton console, except that changes a user may make to it will never affect the configuration file. A user can close the new console and reopen it as often as desired, as well as resize, iconify, maximize, and resize it.

Each time a skeleton console is selected from the monitor Menu, a new instantiation is created, each one with a unique name. For each instantiation, the user is prompted to select values for the wildcard, so each instantiation can be different from all others.

If desired to change a created skeleton console into a non-skeleton console and save in the configuration file, the easiest way to change and save is to use the "Copy Console" function from the console menu. This will prompt a user for a name of the new console and the copy will be a non-skeleton console looking exactly as the instantiated skeleton console copied from. Once the console has been copied, a user can delete the instantiated skeleton console and save the changes in the configuration file.

All consoles are defined as OSF/Motif widgets of the XmForm class and the placement of instruments within this container widget is done as relative positioning.

To add an instrument to a console, a user can choose between adding a new instrument or copying one that is already in the console. If "Add Instrument" is chosen, the following happens:

1. It is checked if there is enough space to create an instrument with a height of 24% of the console. The space must be available in the entire width of the console. If this is the case, a new instrument is created in the space available.
2. If enough space is not available, the existing instruments in the console are resized to provide space for the new instrument. Then the new instrument is created at the bottom of the console.
3. If the new instrument has a height less than 100 pixels, the console is resized to allow the new instrument to be 100 pixels high.

If "Copy Instrument" is chosen, the following happens:

1. It is checked if there is enough space to create an instrument of the same size as the existing one. If this is the case, a new instrument is created in the space available. Unlike what happens when adding a new instrument, copying will use space that is just wide enough to contain the new instrument, as there is no need to have space available in the full console width.
2. If enough space is not available, the existing instruments in the console are resized to provide space for the new instrument. Then the new instrument is created. New space is always created at the bottom of the console, and always in the full width of the console window.
3. If the new instrument has a height less than 100 pixels, the console is resized to allow the new instrument to be 100 pixels high.

Once an instrument has been selected and chosen to be resized, the instrument goes away and is replaced by a rubber-band outline of the instrument. A user resizes the instrument by holding mouse button 1 down and moving the mouse. When the user presses the button, the pointer is moved to the lower right corner of the outline and resizing is always done by moving this corner while the upper left corner of the outline stays put.

When a user releases the mouse button, the instrument is redrawn in its new size. Note that it is normally a good idea to move the instrument within the console so that the upper left corner is at the desired position before resizing.

The position of the resized instrument must be rounded so that it can be expressed in percentage of the console size. This may cause the instrument to change size slightly from what the rubber-band outline showed.

Instruments cannot be resized so that they overlap other instruments. If this is attempted, the size is reduced so as to eliminate the overlap.

When an instrument is selected to be moved, the instrument disappears and is replaced by a rubber-band outline of the instrument. To begin moving the instrument, a user places the mouse cursor within the outline and presses the left mouse button. The button is held down while moving the mouse until the outline is at the desired location. Then, the button is released to redraw the instrument.

Instruments can be moved over other instruments, but are never allowed to overlap them when the mouse button is released. If an overlap would occur, the instrument is truncated to eliminate the overlap.

Referring initially to FIG. 4, the data display subsystem 40 takes inputs from the GUI subsystem 80, data value receiver subsystem 60, and the playback subsystem 50 and creates the displays needed to show the performance data in the format described by the configuration subsystem 30. It calls the configuration subsystem 30 to get the display format information from the configuration files and also to send requests for system configuration information to Data Supplier daemons 210.

Figure 16:
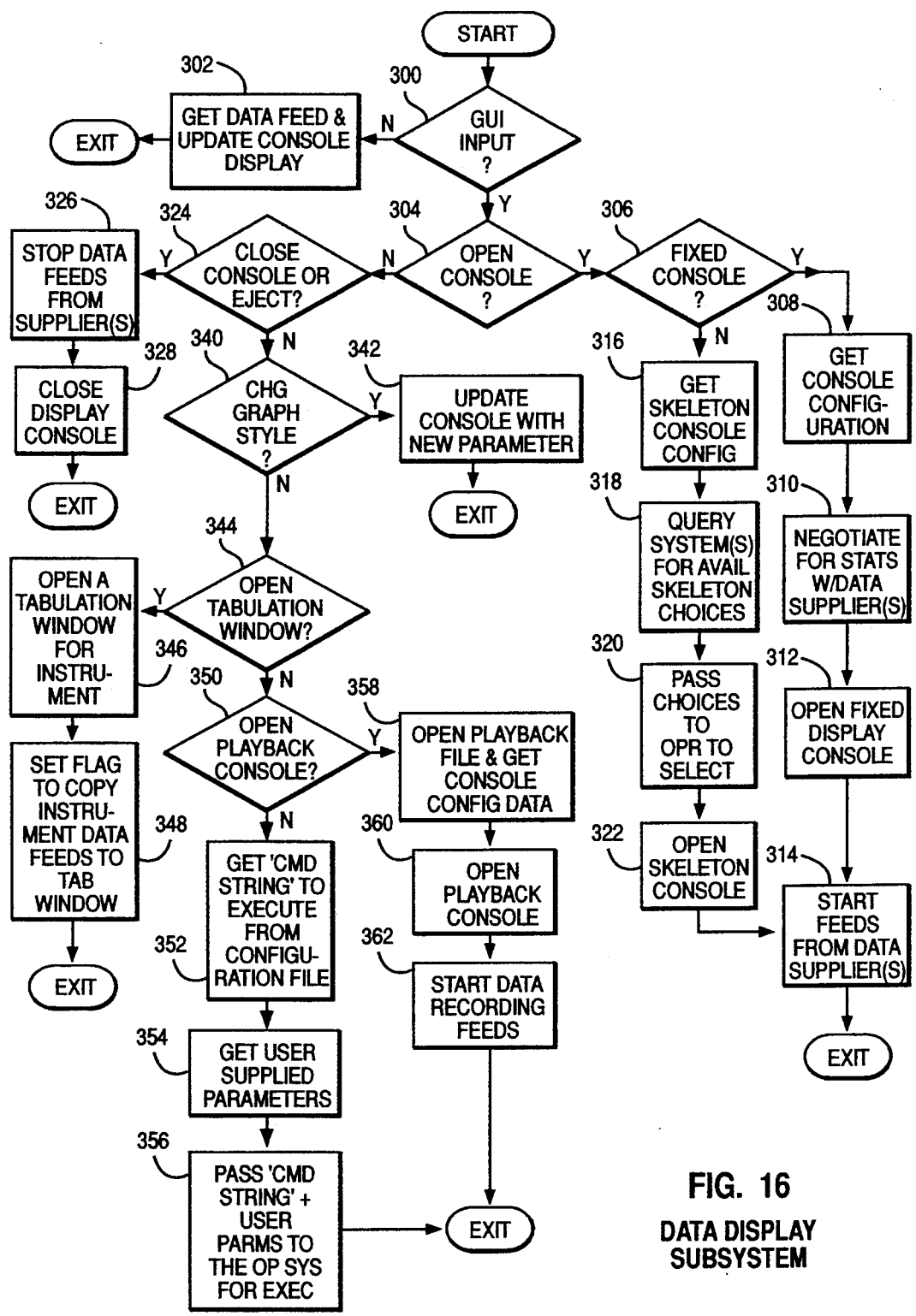
FIG. 16 is a flow diagram of the internal operations of the data display subsystem.

Referring now to FIG. 16, the data display subsystem checks if data was received from the data value received or playback subsystems at 300. The input data format from each of these subsystems will be identical, so no special code is necessary to distinguish where the data originated. It picks up the pointer to the display data and the corresponding console from the input parameters and updates the data in the display console instrument at 302, and then exits. For data received at 302, the data display subsystem was either invoked from the playback subsystem at 262 of FIG. 15, where an operator has requested to "Play" the data, or data is sent from the data value receiver subsystem at 408 of FIG. 18. In this state (302 of FIG. 16), the data display subsystem has minimal overhead to display statistical data, and the data display subsystem is able to present data from either a local or remote host with minimal impact on the system.

If the operator had opened a "console monitor" via a graphic button selection as determined at 304, the GUI subsystem would capture that input and pass it to the Display subsystem. If the selection was for a fixed console as determined at 306, then the configuration subsystem would be called at 308 to get the console configuration data to create the display console. The negotiation for statistics with data suppliers at 310 is initiated from the data display subsystem, but uses the configuration subsystem to obtain the data through the network send/receive interface. The Display Subsystem then would create and open the fixed display console at 312. It would then call the Network Send/Receive Interface to start the data feed from the Data Supplier Daemon at 314, and exit.

If the operator had opened a "Skeleton Console", as determined at 306, then the Data Display Subsystem would call the Configuration subsystem to get the console configuration data at 316, and then call the Network Send/Receive Interface to get the current skeleton parameters at 318, as specified by the skeleton template in the configuration file. Then it calls the GUI subsystem with the skeleton parameters to allow the operator to select which skeleton consoles they wish to view at 320. After receiving the operator choices from the GUI subsystem, it calls the Configuration subsystem to send a request to instantiate the skeleton console parameters to the Data Supplier Daemon(s) via the Network Send/Receive Interface. After receiving the data from the Data Suppliers, it creates and opens the skeleton display console at 322. Finally it sends a "start data feed" request to the Data Supplier daemon(s) via the Configuration and Network Send/Receive Interface subsystems at 314, and exits.

If the operator had selected the "close console" option via a graphic button selection as determined at 324, the GUI subsystem would pass that input to the Data Display subsystem. The Data Display subsystem would then send a "stop data feed" request to the Data Supplier Daemon(s) via the Configuration and Network Send/Receive interface subsystems at 326. Finally, it would close the Display Console at 328 and exit.

If the operator had selected one of the "change graph style" options as determined at 340, the GUI subsystem would capture that input and pass it to the Data Display subsystem together with the new graph style options selected. The Data Display subsystem would then change the display modes dynamically so that the current console, instrument, and value attributes would be updated and displayed with the new values at 342. The configuration file would not be updated until the operator explicitly requested the configuration file to be saved.

If the operator had chosen to open a "Tabulation window" (a numeric display of the graphic data in tabular format) at 344, the GUI subsystem would pass that input to the Data Display subsystem to open a tabulation window for the selected instrument at 346, and set a flag for the data values to be displayed in this window concurrently with the graphic data in the corresponding instrument at 348.

If the operator had chosen a button that should execute a command string that is defined in the configuration file as determined at 350, the GUI subsystem calls the Data Display subsystem which then calls the configuration subsystem to get the command string from the configuration file at 352. It also gets user supplied parameters at 354 and then it passes the command string to the host operating system to execute the command string at 356.

If the operator had chosen a button that should open a playback console as determined at 350, the playback file is opened and the console configuration data that had been previously saved is read at 358. Next, a playback console is opened on the display at 360, using this console configuration data. This action is initiated by the playback subsystem at 254 of FIG. 15, and provides the ability to automatically present the operator with the previously recorded data in the same context in which it was originally recorded, without requiring extensive operator interactions for setup of the context. Finally, data recording feeds are initiated at 362, where a request is sent to data suppliers to start data feeding. Data feeds received as a result of this request are processed at 302.

IMPLEMENTATION OF CONFIGURATION SUBSYSTEM

Referring initially to FIG. 3, the main functions of the Configuration Subsystem 30 are to take requests for data from the configuration file 110 and return requests or data to the caller. It also is the main interface to the Network Send/Receive Interface 70 to route data requests to the proper Data Suppliers.

When the xmperf performance tool is initially started, the configuration subsystem parses the configuration file and builds the initial configuration definition control blocks that determine how all the monitor and menus will look when created.

Figure 17:
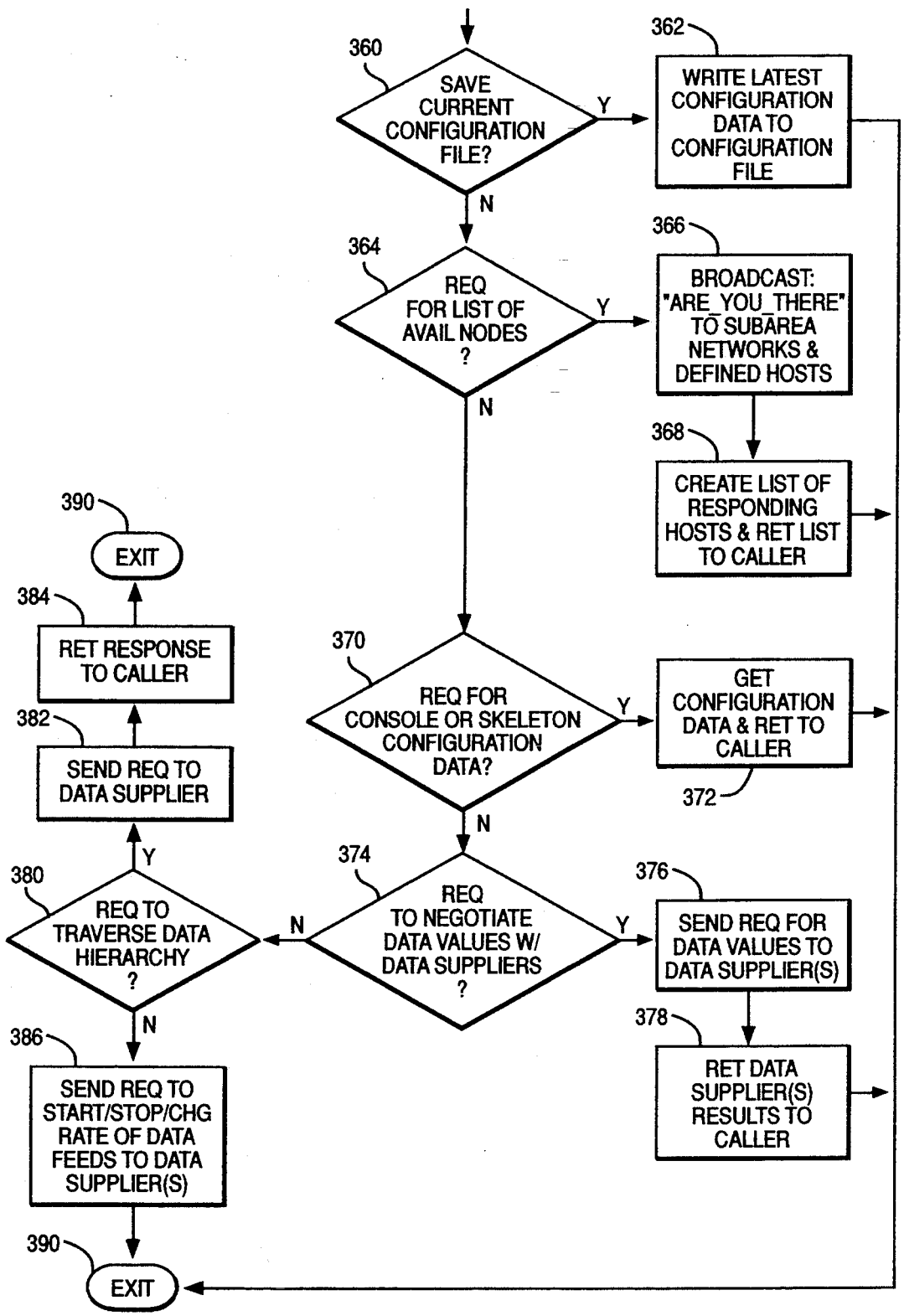
FIG. 17 is a flow diagram of the internal operations of the configuration subsystem.

Referring now to FIG. 17, if the data display subsystem calls for the configuration data that defines how a console is to look (size, shape, instruments, colors, values, etc.) or what information a skeleton console needs from the operator at 370, the Console subsystem retrieves that data from the configuration definition control block and returns that data to the caller at 372.

If the operator selects the "save configuration file" option, the GUI subsystem will pass this request to the Configuration subsystem at 360 (FIG. 17), which will then rename the current configuration file with a time-based name and then write the current configuration control block data to a new file that will be the active configuration file at 362, and then exit at 390.

If the GUI needs to present the operator with a list of network nodes, it calls the configuration subsystem at 364 to send this request to the Data Supplier daemons via the Network Send/Receive interface at 366. As the Data Suppliers respond to the request, a list of responding nodes is created and returned to the GUI subsystem at 368.

If a caller routine requests a "start", "stop", or "change data feed rate" be sent to the data supplier(s) as determined at by 374 and 380, the configuration subsystem sends this request to the Data Suppliers(s) via the Network Send/Receive Interface at 386, and then exits at 390.

If a caller routine wants to traverse the data hierarchy for data values as determined at 380, the configuration subsystem sends this request to the Data Supplier(s) via the network send/receive interface at and returns the data received to the caller at 384.

An example of a data context hierarchy is:

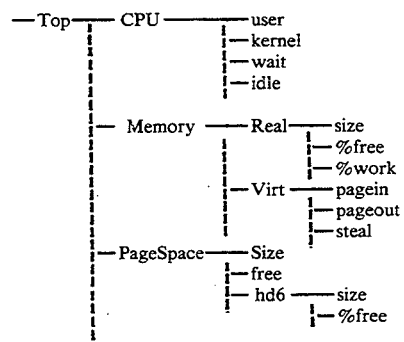

To traverse the data context hierarchy, a program would call RSiInstantiate to create (instantiate) all subcontexts of a context object. Next, it would call RSiPathGetCx to search the context hierarchy for a context that matches a path name. Then it would call RSiFirstCx to return the first subcontext of a context. RSiNextCx is called to get the next subcontext of a context. Statistics are at the leaf nodes of the context hierarchy. The statistics can be retrieved by calling RSiFirstStat to get the first statistic of a context and RSiNextStat gets the next statistics of a context.

IMPLEMENTATION OF THE DATA VALUE RECEIVER SUBSYSTEM

The data value receiver subsystem 60 of FIG. 7 receives all data feeds at 150 from the Network Send/Receive Interface 70. This data includes the StatSetID so that the incoming data can be matched to a specific instrument in an active display console.

Figure 18:
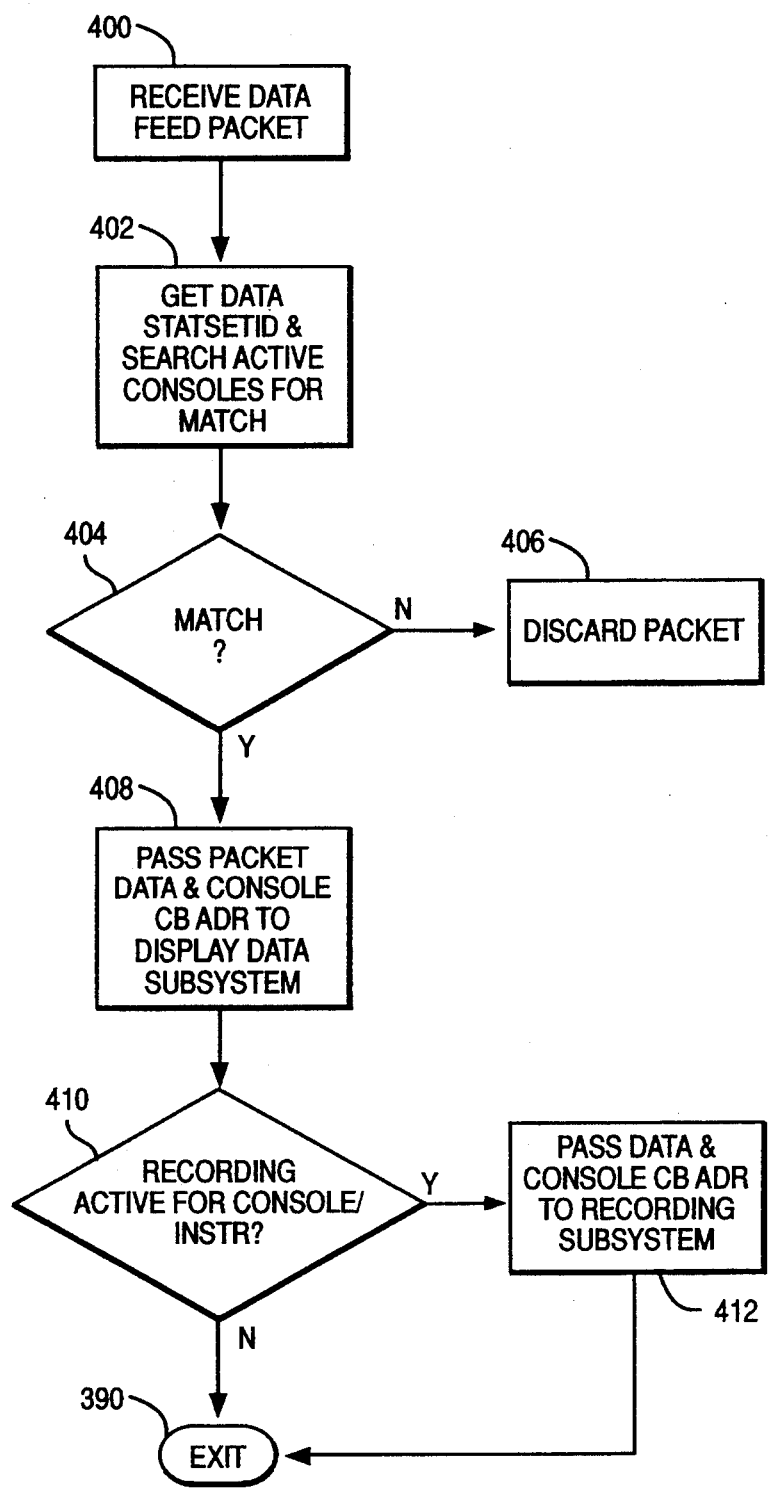
FIG. 18 is a flow diagram of the internal operations of the data value receiver subsystem.

Referring now to FIG. 18, upon receipt of a data feed packet 400, the data value receiver gets the StatSetID and searches the list of active display consoles looking for a matching StatSetID at 402. If the data value receiver does not find a match, it discards the data at 406.

If it finds a matching console, as determined at 404, it passes the data to the data display subsystem with a pointer to the console control block that it found at 408. If recording is active for the console or instrument, as determined at 410, then the data is also passed to the recording subsystem with a pointer to the console control block for the data to be saved in the recording file at 412.

Because of this single unidirectional flow of statistic data from the network send/receive interface, which contains both local and remote statistics, and because of the minimal amount of processing required by the data value receiver subsystem, real-time performance/statistical data can be sent to both the display and recording subsystems concurrently.

IMPLEMENTATION OF THE NETWORK SEND/RECEIVE INTERFACE

The main functions of the Network Send/Receive Interface 70 of FIG. 8 are to send network requests to Data Suppliers 210, receive their responses, and to pass data feed information to the Data Value Receiver Subsystem 60.

Figure 19:
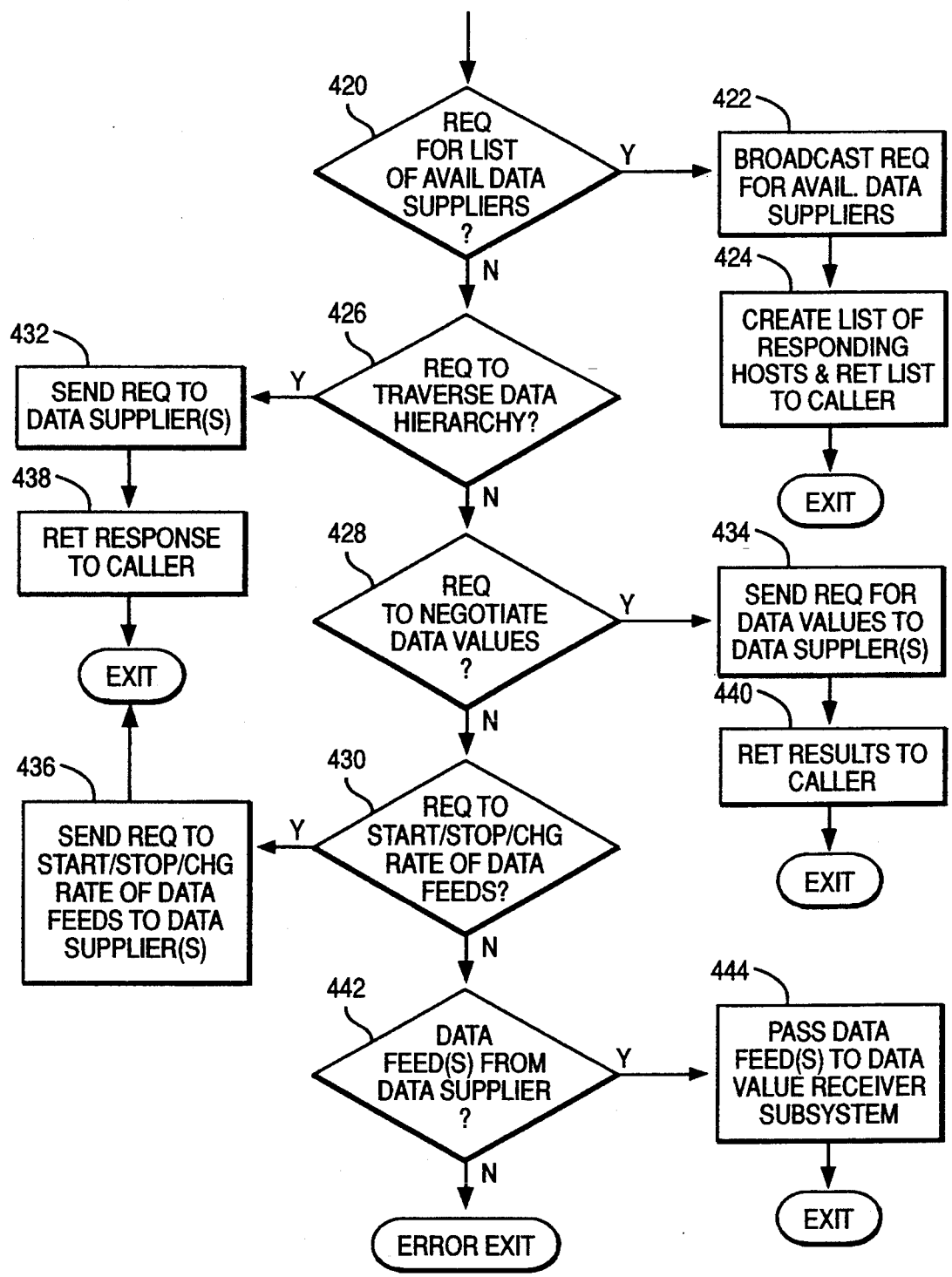
FIG. 19 is a flow diagram of the internal operations of the network send/receive interface.

Referring now to FIG. 19, if the network send/receive interface receives a call to identify all the data supplier daemons as determined at 420, the network send/receive interface broadcasts an "are_you_there" message to all the hosts in the local subarea network and any hosts specified in the hosts file at 422. The network send/receive interface waits for all the responses and then returns a list of all the responding hosts to the calling routine at 424.

If the Network Send/Receive interface receives a call to traverse a data hierarchy 426, negotiate an instrument data value 428, start, stop or change frequency of a data feed 430, it sends a request packet to the data supplier(s) daemons at 432, 434, or 436, respectively, waits for the response(s), and passes the response back to the configuration subsystem at 438 and 440. The data supplier daemon 210 can be at either a local or remote node. The underlying TCP/IP socket communication protocol masks the daemon location from the data requestor. The data requestor only specifies a node name and the communication protocol determines whether it is local or remote.

If the network send/receive interface receives a data feed from a data supplier daemon at 442, therefore passes the data to the Data Value Receiver subsystem at 444.

IMPLEMENTATION OF THE GRAPHICAL USER INTERFACE

Figure 20:
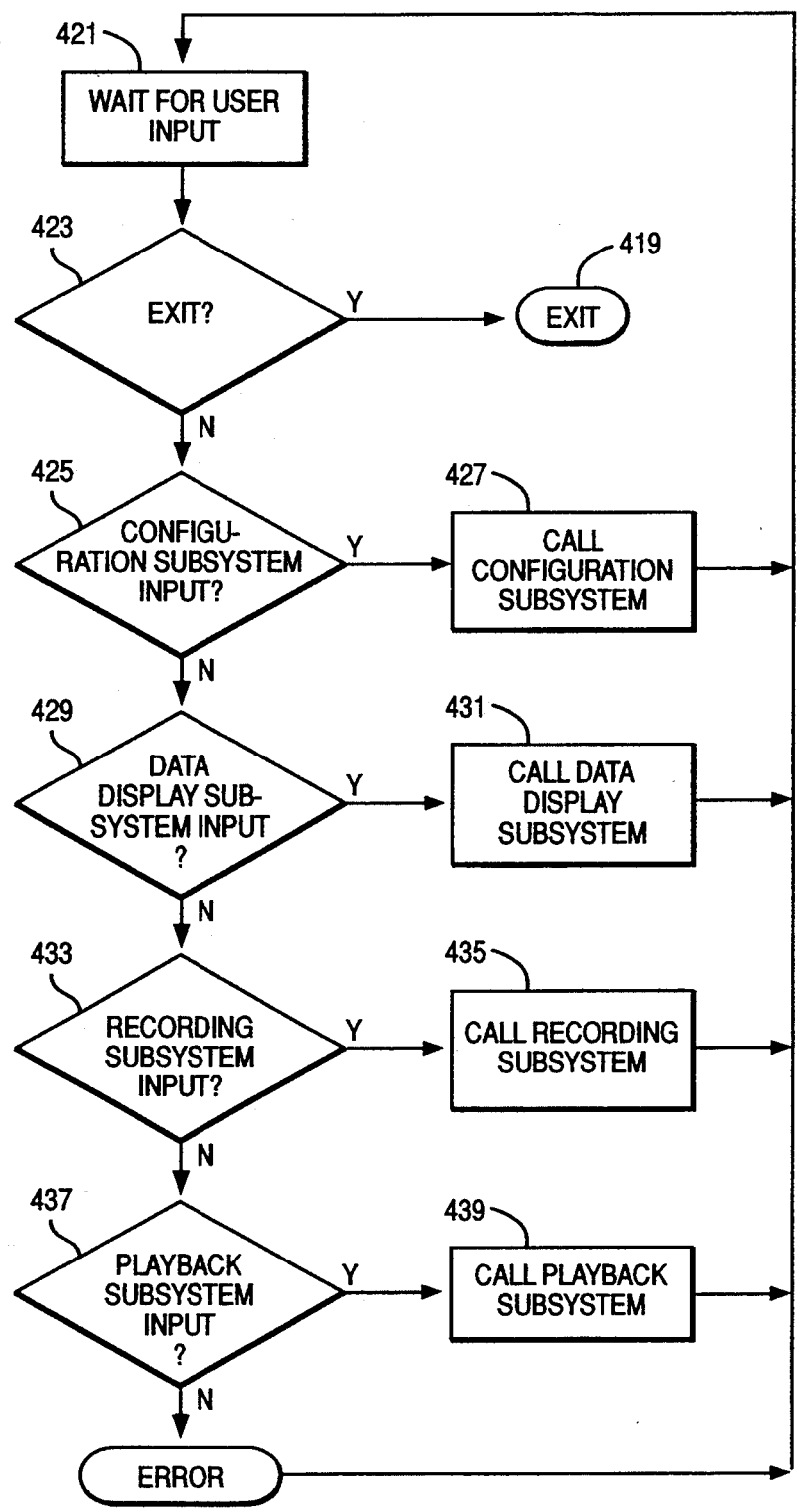
FIG. 20 is a flow diagram of the internal operations of the graphical user interface.

As depicted in FIG. 20, the graphical user interface 80 is simply an interface between a user and the performance tool, receiving user input and passing the information on to the appropriate performance tool subsystem. The interface waits to receive user input at 421. A check is then made if the user desires to exit the performance tool at 423. If so, the tool is terminated at 419.

Otherwise, processing continues at 425, 429, 433 and 437, where checks are made to determine if the input is destined for the configuration, data display, recording, or playback subsystems, respectively. The appropriate subsystem is called at 427, 431, 435 or 439, based upon the destination of the user input.

Figure 21:
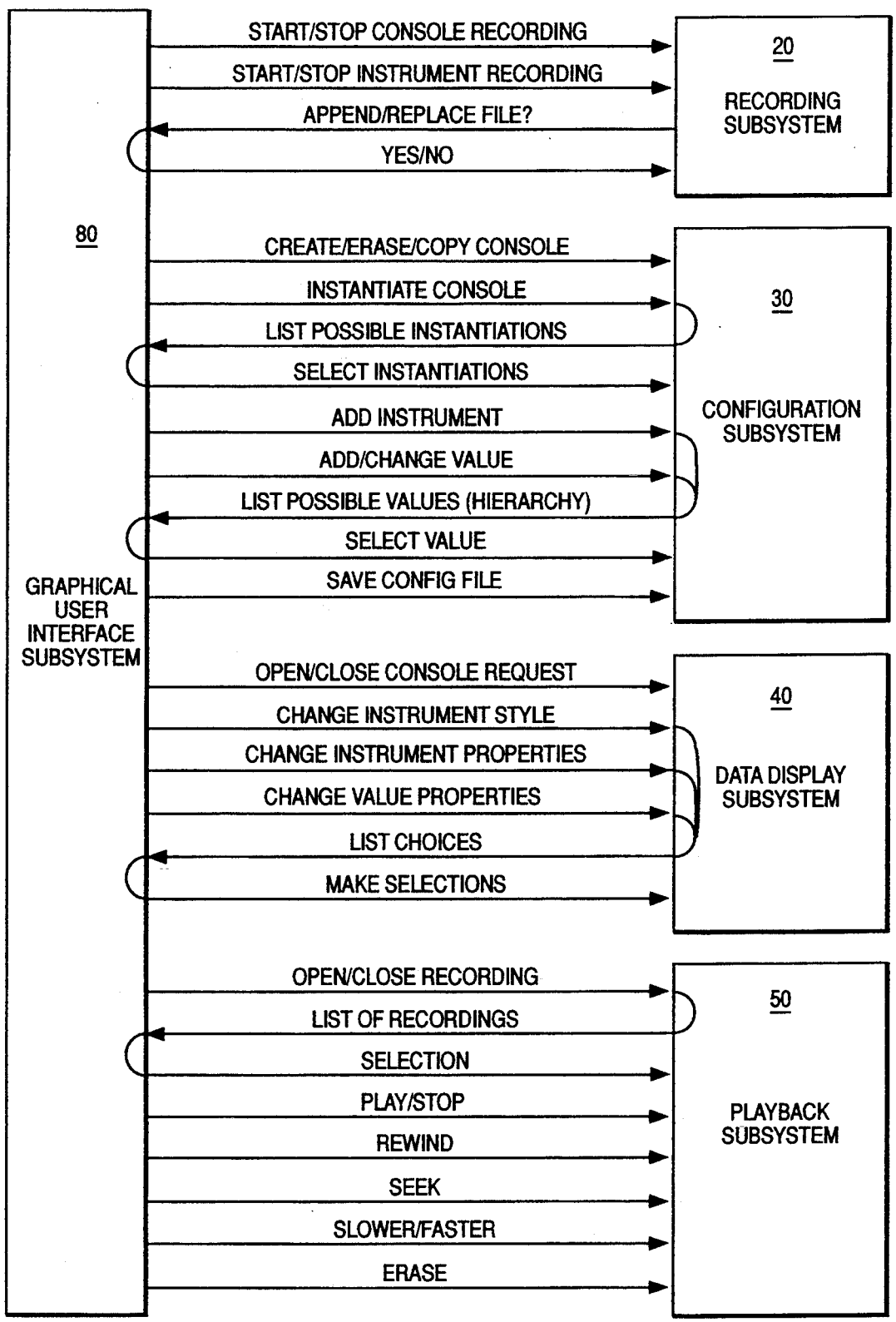
FIG. 21 depicts the graphical user interface subsystem interfaces to the overall performance tool system.

The particular interfaces between the GUI and the other subsystems are further shown in FIG. 21. The GUI interface to the recording system consists of the following. A user initiates a request to start/stop a console or instrument recording, which the GUI detects at 433 (FIG. 20) and sends to the recording subsystem. The recording subsystem sends a message to the GUI to prompt the user whether the user desires to append/replace an existing recording file and the user response to such inquiry is returned to the recording subsystem.

The GUI interface to the configuration subsystem comprises the following messages. First, a user initiated message to create/erase/copy a console can be sent to the configuration subsystem. A request to initiate a console can also be sent, with a response from the configuration subsystem being a message listing possible console instantiations. The user would then select from the list using the GUI, resulting in a message being sent from the GUI to the configuration subsystem indicating the selected instatiation(s). The user can also initiate a message to be sent to add an instrument, or to add/change a value, both of which result in a list of possible values to be presented to the user using the GUI. The user selects a value to be sent to the configuration subsystem. Finally, a user can initiate a request to save a configuration file.

The GUI interface to the data display subsystem comprises the following messages. A user can initiate a request to open/close a console. A user can initiate a message to change the instrument style or properties, or to change the value properties. The data display subsystem sends the GUI a message containing a list of possible choices to present to the user, whereupon the user makes a selection to be returned to the data display subsystem.

Finally, the GUI interface to the playback subsystem comprises the following messages. A user can initiate a message to instruct the playback subsystem to open/close a recording, and the playback subsystem responds with a list of recordings to be presented to the user for selection. The selection is returned to the playback subsystem. The user can also invoke actions which cause the GUI to send the playback subsystem various messages to play/stop, rewind, seek, play slower/faster, and erase a recording/playback file.

MONITORING REMOTE SYSTEMS

Figure 22:
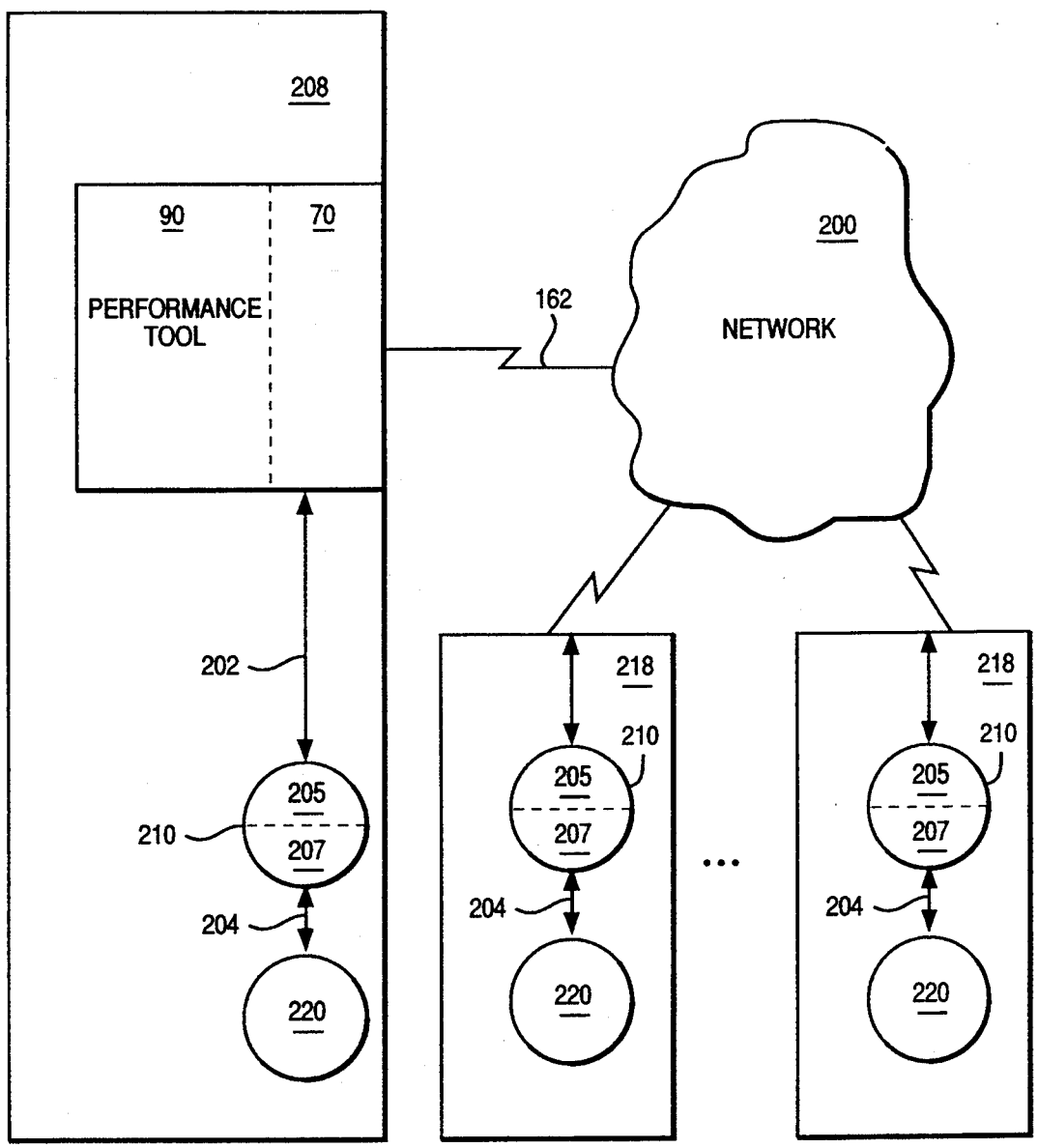
FIG. 22 depicts the interface between a data supplier daemon and a dynamic data supplier.

Referring to FIG. 22, the concept of separating the data collecting executable 210 from the data display executable 90 led to the concept of using a separate data supplier 220 capable of supplying statistics to data consumers 90 on a local 208 or on remote hosts 218. The performance tool 90 provides true remote monitoring by reducing the executable program on the system to be monitored remotely to a subset of the full performance tool. The subset, called xmservd 210, consists of a data retrieval part 207 and a network interface 205. It is implemented as a daemon that can be started manually, started from one of the system start-up files, or left to be started by the inetd super-daemon when requests from data consumers are received.

The obvious advantage of this approach is that of minimizing the impact of the monitoring software on the system to be monitored. Because one host can monitor many remote hosts, larger installations may want to use dedicated hosts to monitor many or all other hosts in a network.

Since the xmservd daemon can be ported to multiple (and differing) platforms, provisions are made to allow flexible adaptation to characteristics of each host where the daemon runs. This has several implications. First, the data supplier daemon 210 does not have any system dependent statistics imbedded in itself. Second, the system dependent statistics and functions to extract such statistics are provided in external executables 220. A protocol and method of cross-accessing statistics between these external executables and xmservd is defined. Third, an application programming interface is used to generalize the protocol and access mechanism. Thus, a customized tool similar to the performance tool described herein could be developed, and interface to the existing xmservd daemon.

The following explains in more detail how monitoring of remote systems takes place. For this discussion, the term data supplier host 218 describes a host that supplies statistics to another host, while a host receiving, processing, and displaying the statistics is called a data consumer 208.

The initiative to start remote monitoring always lies with the data consumer program 90.

The performance tool will attempt to contact potential suppliers of remote statistics in three situations, namely:

1. When the tool starts executing, it always attempts to identify potential data supplier hosts.
2. When five minutes have passed since the last attempt to contact potential data suppliers and the user creates an instrument referencing a data supplier host.
3. When five minutes have passed since the last attempt to contact potential data supplier hosts and the user activates a console containing a remote instrument.

The five-minute limit is implemented to make sure that the data consumer host 208 has an updated list of potential data supplier hosts 218. This is not an unconditional broadcast every five minutes. Rather, the attempt to identify data supplier hosts is restricted to times where a user wants to initiate remote monitoring and more than five minutes have elapsed since this was last done.

The five-minute limit not only gets information about potential data supplier hosts that have recently started; the limit also removes from the list of data suppliers such hosts which are no longer available.

Once the performance tool is aware of the need to identify potential data supplier hosts, it uses one or more of the following methods to obtain the network address(es) where an invitational are_you_there message can be sent. The last two methods depend on the presence of the file /usr/lpp/xmservd/hosts. The three ways to invite data supplier hosts are:

1. Unless prohibited by the user, the performance tool finds the broadcast address corresponding to each of the network interfaces of the host, as described below. The invitational message is sent on each network interface using the corresponding broadcast address. Broadcasts are not attempted on the Localhost (loop-back) interface 202 or on point-to-point interfaces such as X.25 or SLIP (Serial Line Interface Protocol) connections.
2. If a list of Internet broadcast addresses is supplied in the file /usr/lpp/xmservd/hosts, an invitational message is sent on each such broadcast address. Every Internet address given in the file is assumed to be a broadcast address if its last component is the number 255.
3. If a list of hostnames or non-broadcast Internet addresses is supplied in the file /usr/lpp/xmservd/hosts, the host Internet address for each host in the list is looked-up and a message is sent to each host. The look-up is done through a gethostbyname() call, so that whichever name service is active for the host where the performance tool runs is used to find the host address.

The file /usr/lpp/xmservd/hosts has a very simple layout. Only one keyword is recognized and only if placed in column one of a line. That keyword is:

nobroadcast and means that the are_you_there message should not be broadcast using method (1) above. This option is useful in situations where there is a large number of hosts on the network and only a well-defined subset should be remotely monitored. To indicate that no broadcasts should be attempted but direct contact to three hosts is needed, the /usr/lpp/xmservd/hosts file may look like that shown in Table 6.

TABLE 6

| Sample /user/lpp/xmservd/hosts File to Invite Specific Hosts |
| --- |
| nobroadcast |
| birte.austin.ibm.com |
| gatea.almaden.ibm.com |
| umbra |

Table 6 further shows that the hosts to monitor do not necessarily have to be in the same domain or on a local network.

Whenever monitoring remote hosts that are not on the same subnet as the data consumer host, the broadcast address of the other subnets or all the host names of those hosts must be specified in the /usr/lpp/xmservd/hosts file. The reason is that IP broadcasts will not propagate through IP routers or gateways.

Table 7 illustrates a situation where it is desired to broadcast on all local interfaces, to broadcast on the subnet identified by the broadcast address 129.49.143.255, and also to invite the host called umbra.

TABLE 7

| Sample /usr/lpp/xmservd/hosts File to Invite Subnets |
| --- |
| 129.49.143.255 |
| umbra |

The xmservd daemon 210 is designed to be started from the inetd "super daemon". The following sections describe how xmservd starts, terminates, and keeps track of data consumer programs.

The xmservd daemon 210 must be configured as an inetd daemon to run properly. If the daemon is manually started, it attempts to reschedule itself by invoking the program xmpeek and then exit. This will cause xmservd to be rescheduled via inetd. The line defining the daemon in /etc/inetd.conf must specify the "wait" option to prevent inetd from starting more than one copy of the daemon at a time.

The xmservd daemon is started by inetd immediately after a UDP datagram is received on its port. This is because inetd has been setup during the preliminary system configuration to specify that the xmservd daemon should be started when these datagrams are received. Note that the daemon is not scheduled by a request through the SMUX interface from the local SNMP agent (this interface is described later). The SNMP agent uses a different port number. Unless xmservd abends or is killed, it will continue to run as long as any data consumer needs its input or a connection to the SNMP agent is established and alive. When no data consumer needs its input and either no connection was established through the SMUX interface or any such connection is terminated, the daemon will hang around a number of minutes as specified with the −1 (lower case L) command line argument to xmservd. The default number of time‒to‒live minutes is 15.

Whenever a connection to the SNMP agent through the SMUX interface is active, the daemon will not timeout and die even when there are no data Consumers to supply. Then, the "time‒to‒live" limit is used only to determine when to look for inactive remote consumers that can be deleted from the tables in xmservd.

Like many other daemons, xmservd will interpret the receipt of the signal SIGHUP (kill −1) as a request to refresh itself. It does this by spawning another copy of itself via inetd and killing itself. When this happens, the spawned copy of xmservd is initially unaware of any data consumers that may have been using the copy of xmservd that received the signal. Consequently, all data consumer programs must request a resynchronizing with the spawned daemon to continue their monitoring.

The other signal recognized by xmservd is SIGINT (kill −2) that will cause the daemon to dump any MIB data.

When a data consumer program, such as the performance tool 90, uses broadcasts to contact data supplier hosts 218, most likely the data consumer program will define instruments with only a few of the daemons that respond. Consequently, most daemons will have been contacted by many data consumers but will supply statistics to only a few. This causes the host tables in the daemon to swell and, in the case of large installations, can induce unnecessary load on the daemon. To cope with this, the daemon will attempt to get rid of data consumers that appear not to be interested in its service.

The "time‒to‒live" parameter is used to check for inactive partners. A data consumer is removed from the daemon's tables if either of the following conditions are true:

1. No packet was received from the data consumer for twice the time‒to‒live period and no instruments were defined for the data consumer.

2. No packet was received from the data consumer for eight times the time‒to‒live period.

A data consumer that is subscribing to except‒rec messages (described below) is treated as if it had an instrument defined with the daemon.

Figure 23:
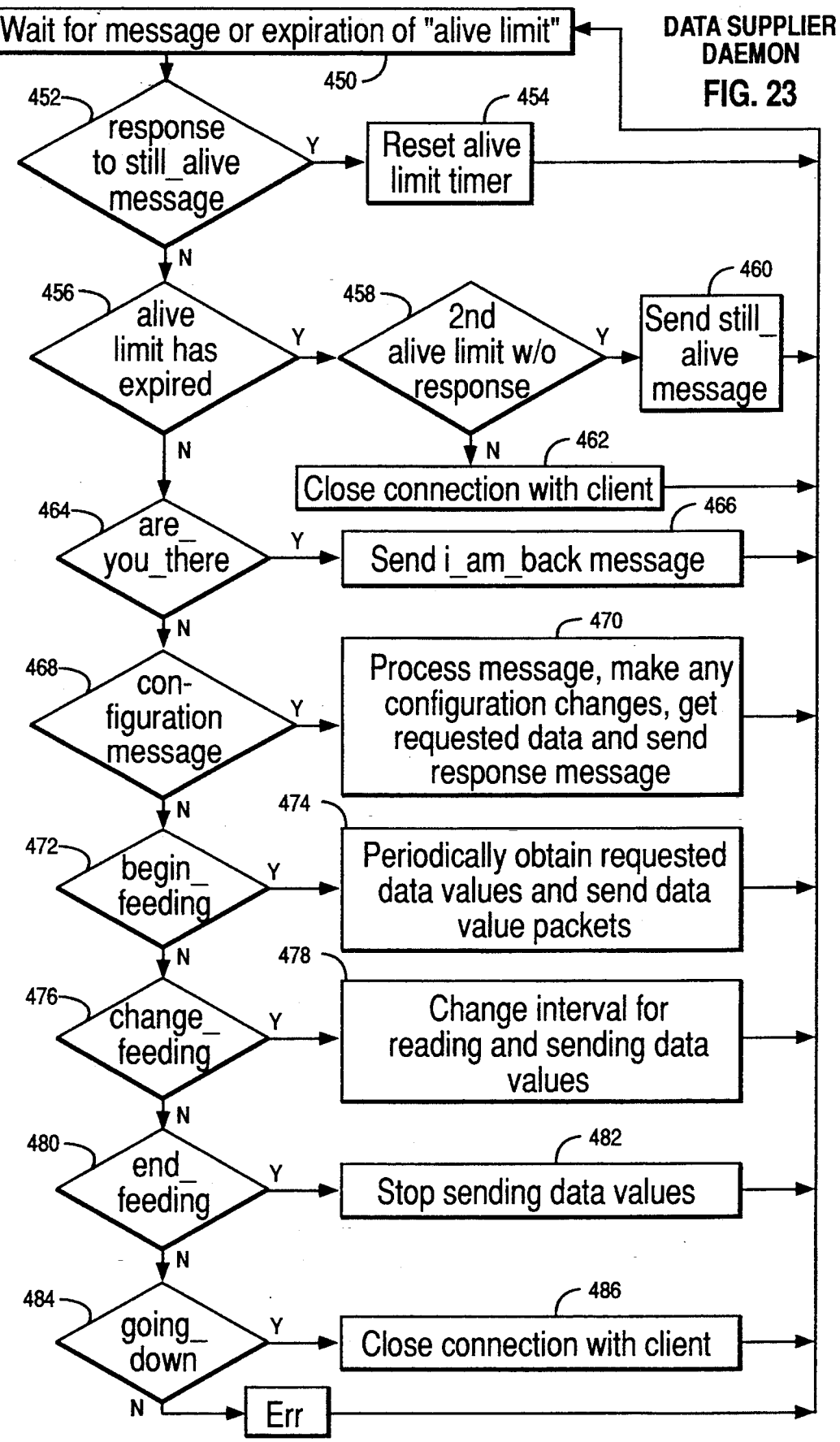
FIG. 23 is a flow diagram of the internal operations of the data supplier daemon.

Once xmservd is running and supplying input to one or more data consumers as shown in FIG. 23, it must make sure that the data consumers are still alive and needing its input. If not, xmservd would waste system resources to continue sending statistics across the network. The daemon uses an "alive limit" to determine when it's time to check that data consumer hosts are still alive. The alive limit is reset whenever the user makes changes to the remote monitoring configuration from the data consumer host, but not when data is fed to the data consumer.

While in a quiescent state, the xmservd daemon is waiting either to receive a message or for the expiration of the "alive limit" at 450. Then, a check is made to determine if the requested action is the receipt of message in response to a previously sent still‒alive message at 452. If so, the alive limit timer is reset at 454.

When the alive limit is reached at 456, xmservd sends a message of type still‒alive to the data consumer at 460. The data consumer program has "alive limit" seconds to respond. If a response is not received after "alive limit" seconds, as determined at 458, the daemon sends another still‒alive message at 460 and waits another "alive limit" seconds at 450. If there's still no response, the daemon assumes the data consumer to be dead or no longer interested and stops sending statistics to the consumer at 462. The default "alive limit" is 300 seconds (five minutes); the alive limit can be set with the −t command line argument to xmservd.

Through the program filtd (described later), exception conditions can be defined that can cause one or more actions to be taken. One such action is the execution of a command on the host where the daemon runs; another is the sending of an exception message. The message type except‒rec is used for the latter.

The contents of each exception message are:

1. The hostname of the host sending the exception message.
2. The time when the exception was detected.
3. severity of the exception, a number between 0 and 10.
4. The minimum number of minutes between two exception messages from a given exception definition.
5. A symbolic name describing the exception.
6. A more verbose description of the exception.

The xmservd daemon will send exceptions to all hosts it knows that have declared that they want to receive exception messages. The RSiOpen and RSiInvite function calls of the API (described below) are used by the data consumer application to declare whether it wants to receive exception messages.

Currently, the performance tool always requests exception messages. When one is received, the exception message is sent to the performance tool main window where it appears as a text message. No other action is taken by the performance tool.

If the xmservd daemon dies or is killed while one or more data consumers have instruments defined with it, the daemon will attempt to record the connections in the file /usr/lpp/xmservd/xmservd.state (the xmservd command line argument −d can be used to substitute a different directory for /usr/lpp). If this file exists when xmservd later is restarted, a message of type i_am_back is sent to each of the data consumer hosts recorded in the file. The file is then erased.

If the programs acting as data consumers are capable of doing a resynchronization, the interrupted monitoring can resume swiftly and without requiring manual intervention. The performance monitor can and does resynchronize all active monitors for a host whenever an i_am_back message is received from that host, by renegotiating startup dialogues with data suppliers.

Three types of messages that flow between data supplier hosts and data consumer hosts have already been described. The message type are organized in five groups as shown in Table 8.

TABLE 8

| Message Types for Remote Monitoring | |
|---|---|
| Configuration Messages | |
| create_stat_set | Type = 01 |
| del_set_stat | Type = 02 |
| first_cx | Type = 03 |
| first_stat | Type = 04 |
| instantiate | Type = 05 |
| next_cx | Type = 06 |
| next_stat | Type = 07 |
| path_add_set_stat | Type = 08 |
| path_get_cx | Type = 09 |
| path_get_stat | Type = 10 |
| stat_get_path | Type = 11 |
| Data Feed and Feed Control Messages | |
| begin_feeding | Type = 31 |
| change_feeding | Type = 32 |
| end_feeding | Type = 33 |
| data_feed | Type = 34 |
| going_down | Type = 35 |
| Session Control Messages | |
| are_you_there | Type = 51 |
| still_alive | Type = 52 |
| i_am_back | Type = 53 |
| except_rec | Type = 54 |
| Status Messages | |
| send_status | Type = 81 |
| host_status | Type = 82 |
| dynamic data supplier Messages | |
| get_supply | Type = 91 |

All the configuration messages (468 of FIG. 23) are specific to the negotiation between the data consumer 90 and the data supplier 218 about what statistics should be sent by the data supplier. All messages require a response at 470 (FIG. 23), and all are initiated by the data consumer.

Once the negotiation of what data to supply is completed, the data supplier host's xmservd 210 maintains a set of information about the statistics to supply at 470 (FIG. 23). A separate set is kept for each data consumer program. Feeding of data is not started until a begin_feeding message is received from the data consumer program at 472. The begin_feeding message includes information about the frequency of data feeds and the xmservd daemon 210 rounds this to a multiple of 500 milliseconds, then starts feeding data.

The daemon uses a timeout loop to determine when to feed data at 474. If more than one set of values is to be sent, xmservd uses a simple algorithm to prevent more messages than necessary to be sent at the same time. The message type used for sending data is data_feed.

Data feed to a data consumer continues until that data consumer sends an end_feeding message at 480 or until the data consumer no longer responds to still_alive messages. At that time data feeding stops at 482.

The frequency of data feeds can be changed by the data consumer program by sending the change_feeding message at 476. This message is sent whenever the user changes the interval property of an instrument, and results in the daemon changing the interval for reading and sending data values at 478.

The final message type in this group is going_down. This message is sent by a data consumer whenever it terminates in an orderly manner and whenever a program written to the API (see below) issues the RSiClose call. The message is sent to all data supplier hosts that data consumer knows about (or the host RSiClose is issued against) and when detected at 484 (FIG. 23) will cause the daemons 210 on the data supplier hosts 208 and 218 to erase all information about the terminating data consumer program (at 486 of FIG. 23).

Two of the session control message types have been discussed in previous sections. To recapture, are_you_there is sent from a data consumer to provoke potential data supplier hosts at 464 to identify themselves at 466. The still_alive message is the only message type apart from except_rec that is initiated by xmservd without input from a data consumer. It prompts remote monitors to respond and thus proves that they are still alive.

The third session control message is the i_am_back message which is always the response to the first message xmservd receives from a data consumer. When the i_am_back message is received by the data consumer host's performance tool, it responds by marking the configuration tables for the data supplier host as void. This is because the data supplier host's xmservd daemon has obviously restarted, which means that earlier negotiations about what statistics to send are now invalidated.

If an i_am_back message is received from a remote supplier while a remote instrument for that supplier is active, a renegotiation for that instrument is started immediately. If other remote instruments for the supplier are defined to the data consumer host, renegotiation for those instruments is delayed until the time each instrument is activated.

Renegotiation will not be started unless the performance tool 90 on the data consumer host 208 takes action. It is quite possible that a data supplier host is rebooted and its xmservd daemon therefore goes quietly away. The data consumer no longer receives data, and the remote instrument(s) stop playing. Currently, no facility will detect this situation, but a menu option allows the user to "resynchronize" with a data supplier. When this option is chosen, an are_you_there message is sent from the performance tool. If the data supplier daemon is running or can be started, it will respond with an i_am_back message and renegotiation starts.

Normally, xmservd induces only insignificant load on the system. If a large number of data consumer programs, each monitoring several statistics from one single data supplier host, the sheer number of requests that must be processed can result in more load on the data supplier host than is feasible.

Two features allow a user to control the daemon on any host for which they are responsible. The first one is a facility to display the status of a daemon, as described in this section. The other is the ability to control the access to the xmservd daemon.

Because the xmservd daemon runs in the background and may start and stop as required, special action is needed to determine the status of the daemon. Such action is implemented through the two message types send_status and host_status. The first can be sent to any xmservd daemon which will then respond by returning the message with total counts for the daemon's activity, followed by a message of type host_status for each data consumer it knows.

A utility called xmpeek is supplied as part of the performance tool. This utility allows to ask any host about the status of its xmservd daemon or get a list of all the data statistics available at that host node. The command line is simple, and shown in Table 9.

TABLE 9 xmpeek [{−a ¦ −1}] [hostname]

Both flags of the command are optional. If the flag −a is specified, one line is listed for each data consumer known by the daemon. If omitted, only data consumers that currently have instruments defined with the daemon are listed.

If a hostname is specified, the daemon on the named host is asked. If no hostname is specified, the daemon on the local host is asked. An example of the output from the xmpeek program is shown in Table 10.

TABLE 10

Statistics for xmservd daemon on * birte *

| Instruments currently defined: | | | | 1 | | |
| Instruments currently active: | | | | 1 | | |
| Remote monitors currently known: | | | | 2 | | |
| Instruments | | | | | | |
| De-fined | Active | Values Active | Packets Sent | Internet Address | Port | Host-name |
| 1 | 1 | 16 | 3344 | 129.49.115.203 | 4184 | birte |

Output from xmpeek can take two forms. It generally includes at least as much as is shown in Table 10, except that the single detail line for the data consumer on host xtra will only be shown if either the −a flag is used or if the data consumer has at least one instrument defined with the daemon. Note that xmpeek itself appears as a data consumer because it uses the API to contact the daemon. Therefore, the output always shows at least one known monitor.

In the fixed output, first the name of the host where the daemon is running is shown. Then three lines follow giving the totals for current status of the daemon. In the above example, only one instrument is defined and that it is active. Also, two data consumers are known by the daemon but that only one of them has an instrument defined with the daemon in birte. Obviously, this output was produced without the −a flag.

An example of more activity is shown in Table 11. The figure is produced with the command xmpeek −a birte as some detail lines show zero instruments defined. Such lines indicate that an are_you_there message was received from the data consumer, but that no instruments were ever defined or that any previously defined instruments were erased.

TABLE 11

Statistics for xmservd daemon on * birte *

| Instruments currently defined: | | | | 16 | | |
| Instruments currently active: | | | | 14 | | |
| Remote monitors currently known: | | | | 6 | | |
| Instruments | | | | | | |
| De-fined | Active | Values Active | Packets Sent | Internet Address | Port | Host-name |
| 8 | 8 | 35 | 10232 | 129.49.115.203 | 4184 | birte |
| 6 | 4 | 28 | 8322 | 129.49.246.14 | 3211 | umbra |
| 0 | 0 | 0 | 0 | 129.49.115.208 | 3861 | xtra |
| 1 | 1 | 16 | 3332 | 129.49.246.14 | 3219 | umbra |
| 0 | 0 | 0 | 0 | 129.49.115.203 | 4209 | birte |
| 1 | 1 | 16 | 422 | 129.49.115.208 | 3874 | xtra |
| 16 | 14 | 95 | 22308 | | | |

As can be seen, the same hostname may appear more than once. This is because every running copy of xmperf and every other active data consumer program is counted and treated as a separate data consumer, each identified by the port number used for UDP packets as shown in the xmpeek output.

The second detail line in Table 11 shows that one particular monitor on host umbra has six instruments defined but only four active. This situation would happen if a remote console is closed. When a data consumer is closed, it stays in the "Monitor" menu of the performance tool's main window and the definition of the instruments of that console remains in the tables of the data supplier daemon, but the instruments are not active.

Figures 24, 26:
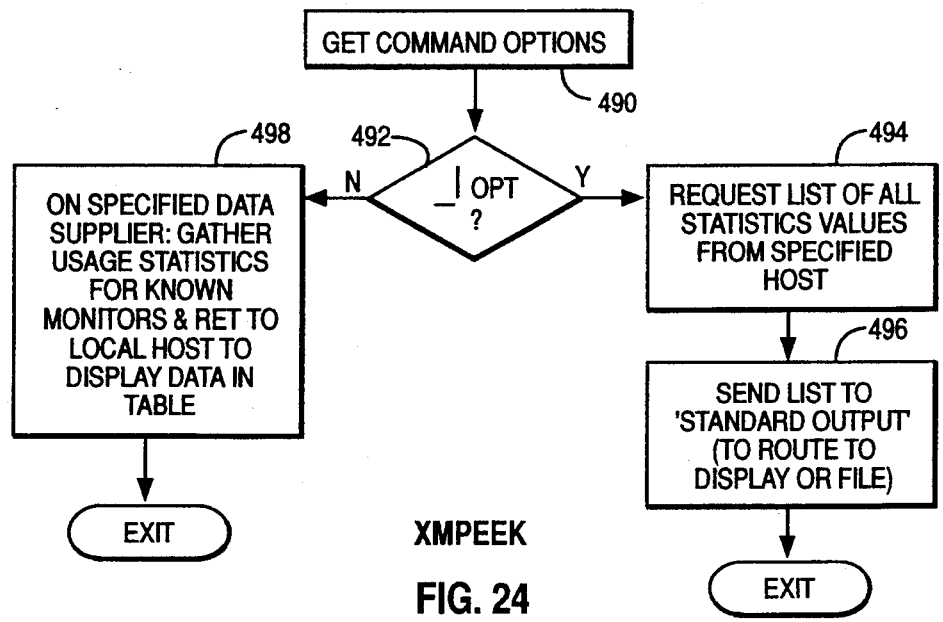
FIG. 24 is a flow diagram of the internal operations of the xmpeek utility.
FIG. 26 shows an example of output generated from the sample program listed in Appendix A.

As previously stated, the xmpeek program allows a user to see the activity of the data supplier daemon or get a list of all the data statistics available at that host node. Referring now to FIG. 24, if the '1' option is selected, the xmpeek program calls the network send/receive interface to request a list of all available data statistics to the Data Supplier daemon at 494, which can be local or remote. If the "host" is not specified, it is the local host by default. After the daemon receives the list of statistics, it sends it to the system's "standard output" at 496.

If the −1 option was not selected, then xmpeek calls the network send/receive interface to request a report on the activity of the Data Supplier daemon at 498. This includes all of the active monitors to which the daemon is supplying data, and the number of instruments it is feeding. After it receives this information, xmpeek displays this data in a table, also at 498.

Access to the xmservd daemon can be limited by supplying stanzas in a configuration file in "/usr/lpp/xmservd/xmservd.res". The three stanzas are shown below. Note that the colon is part of the stanza. The stanza must begin in column one of a line. There may be more than one line for each stanza type, but in case of the max: stanza, the last instance overrides any earlier.

ONLY:

When this stanza type is used, access to the daemon is restricted to hosts that are named after the stanza. Hostnames are specified separated by blanks, tabs or commas. Access from any host that is not specified in an only: line is rejected at the time an are_you_there message is received.

If one or more only: lines are specified, only hosts specified in such lines will ever get through to the data retrieval functions of the daemon.

ALWAYS:

When this stanza type is used, access to the daemon is always granted to hosts that are named after the stanza. Hostnames are specified separated by blanks, tabs or commas. The idea is to make sure that people users who need to do remote monitoring from their hosts can indeed get through, even if the number of active data consumers exceed the limit established.

However, if an only: stanza is also specified but the host is not named in such stanza line, access is denied even before the always: stanza can be checked. If the always: stanza is used, either refrain from using the only: stanza or make sure that all hosts named in the always: lines are also named in the only: lines.

MAX:

This stanza must be followed by the number of simultaneous data consumers that will be allowed to define instruments with the daemon at any one time. Any data consumers running from hosts named in always: lines are not counted when it is checked if the maximum is exceeded.

Access is denied at the time an instrument is defined, which will normally be when a remote console is opened from the data consumer host.

If no max: line is found, the maximum number of data consumers defaults to 16.

Table 12 shows a sample xmservd configuration file. Two only: lines define a total of nine hosts that can access the xmservd daemon. No other host will be allowed to request statistics from the daemon on the host with this configuration file.

Two always: lines name two hosts from where remote monitoring should always be allowed. Finally, a maximum of three data consumers at a time will be permitted to have instruments defined. Note that each copy of the performance tool counts as one data consumer (as it is possible to invoke multiple copies of this tool in a multiprocessing data processing system), no matter which host it runs on.

TABLE 12

| | |
|---|---|
| only: | srv1 srv2 birte umbra xtra jones chris |
| only: | savanna rhumba |
| always: | birte |
| always: | chris |
| max: | 3 |

Figure 25:
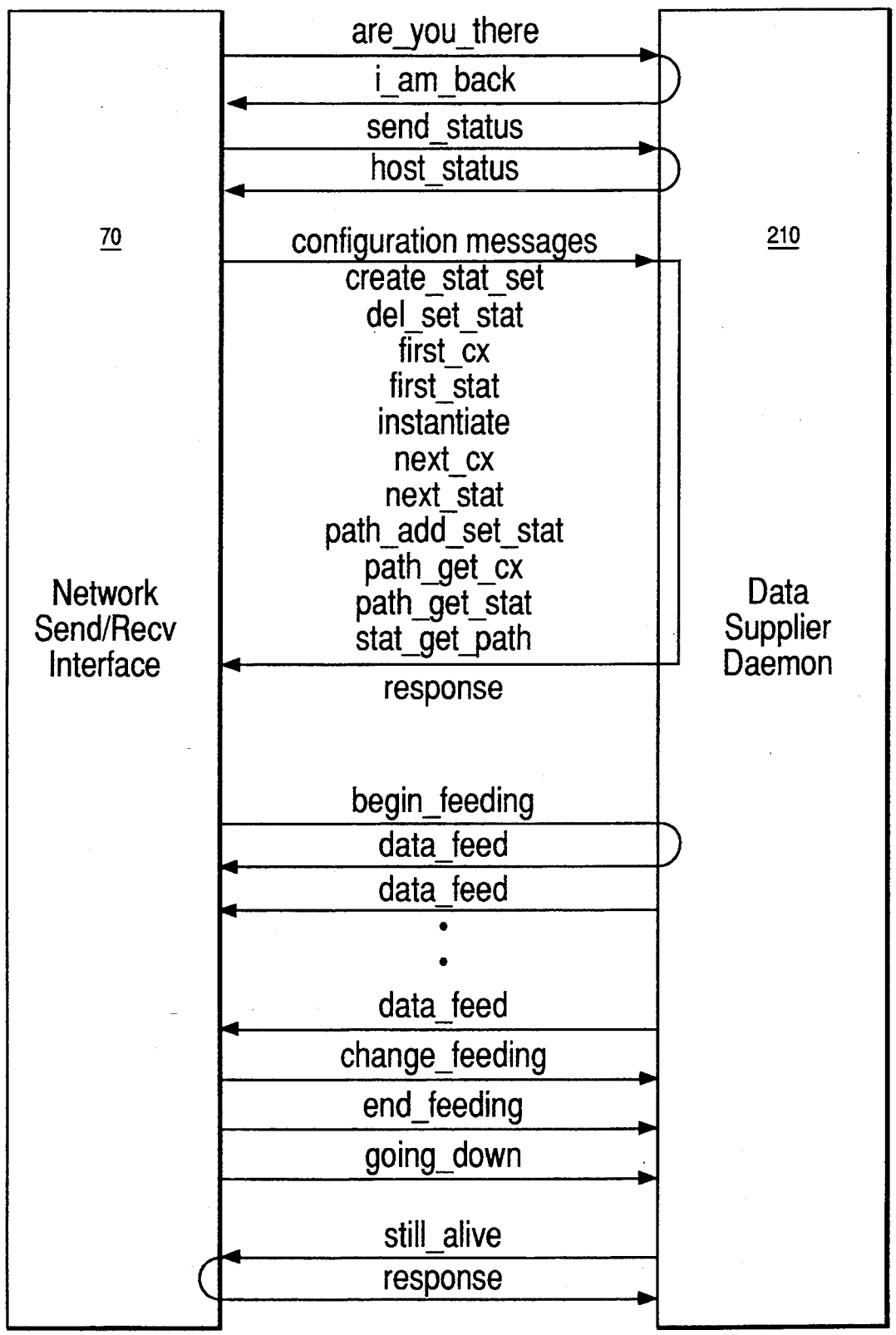
FIG. 25 depicts the data supplier daemon interfaces to the overall performance tool system.

The interface 162 and 202 (remote and local interfaces comprise the same messages) between a network send/receive interface 70 and a data supplier daemon 210 of FIG. 22 is additionally shown in FIG. 25. The network send/receive interface sends a message are_you_there, which results in an i_am_back response from the daemon. A request to send_status can be sent to the daemon 210, resulting in a host_status response. Numerous configuration messages previously described can be sent to the xmservd daemon, with resulting response messages. A begin_feeding messages to the daemon results in a plurality of data_feed packets being sent to the network send/receive interface. Change_feeding and end-feeding messages can also be sent to the daemon to modify or stop the data_feed being supplied by the daemon. A going_down message from the network send/receive interface is a unilateral status message not requiring a response. Lastly, the daemon can initiate a still_alive message to the interface 70, which seeks a response to ensure that the data consumer is still alive.

SNMP MULTIPLEX (SMUX) INTERFACE

The SNMP (Simple Network Management Protocol) is a protocol based upon the Internet protocol. As its name implies, its main purpose is to provide a protocol that allows management of networks of computers. Programs based upon SNMP are currently dominating the network management arena in non-SNA environments. The most widely used of the SNMP based network management programs are the programs in Hewlett Packard, Inc.'s Openview package (Openview is a trademark of Hewlett Packard, Inc.). An IBM implementation of the Hewlett Packard product is available as IBM NetView/6000. The SNMP protocols are defined in (i) Request for Comments (RFC) 1098: by J. Case, M. Fedor, M. Schoffstall, and J. Davin, April 1989, and (ii) Case, J., Fedor, M., Schoffstall, M., and Davin, J., "The Simple Network Management Protocol", RFC 1067, Univ. of Tennessee at Knoxville, NY-SERNet, Rensselaer Polytechnic, Proteon, August 1988, both hereby incorporated by reference as background material.

Network management is primarily concerned with the availability of resources in a network. As implemented on top of SNMP, it uses a client/server model where one or a few hosts in the network run the client programs (known as SNMP Managers) and all network nodes (if possible) run the server code. On most host types the server code is implemented as a daemon, snmpd, normally referred to as the SNMP Agent.

Communication between the manager and the daemon uses two protocol models. The first model is entirely a request/response type protocol; the other is based upon traps, which are unsolicited packets sent from a server (agent) to the client (manager) to inform the client of some event.

The request/response protocol supports tree request types:

Get Issued from the manager to an agent, requesting the current value of a particular variable. The agent will return the value if it's available.

Set Issued from the manager to an agent, requesting the change of a particular variable. By implication, the changing of a value will be interpreted by the agent as also meaning that the change of the value must be enforced. For example, if the number of memory buffers is changed, the agent is expected to implement this change on the system it runs on. A large number of system variables can not be set but are read-only variables.

Get next Issued from the manager to the agent, requesting the agent to go one step further in the hierarchy of variables and return the value of the next variable.

As is implied by the "get next" request type, variables are arranged in a hierarchy much like the hierarchy used to maintain the statistics provided by the xmservd daemon. Unlike the performance tool context hierarchy, however, even though an SNMP manager can traverse the hierarchy of variables to see what's available, it identifies those variables by a decimal coding system and is not able to convert these codes to textual descriptions by itself. To make the SNMP manager able to translate decimal coding into text, a file must be provided that describes the variables and the hierarchy. The file must describe the variables in a subset of the Abstract Syntax Notation(ASN.1) as defined by ISO in Open Systems Interconnect, Specification for Abstract Syntax Notation One (ASN.1)", International Organization for Standardization, International Standard 8824, December 1987, and hereby incorporated by reference as background material. The subset used by SNMP is defined in RFC 1065. A file that describes a (sub)set of variables and the hierarchy is referred to as a MIB file because it is said to describe a "Management Information Base" or "MIB". MIB is further discussed in McCloghrie, K. and Rose, M., "Management Information Base for Network Management of TCP/IP-based Internets", RFC 1066, TWG, August 1988, and hereby incorporated by reference as background material.

Normally, an SNMP agent will know what variables it is supposed to provide and uses a fixed set. In other situations, the SNMP agent's set of variables may need to be expanded because special programs or special hardware is installed. This can be done through a programming interface called SMUX (SNMP Multiplex), as described in Rose, M. T., "SNMP MUX Protocol and MIB", RFC 1227, May 1991, and hereby incorporated by reference as background material. The following describes how SMUX can be used by the xmservd daemon to expand the set of variables available from the SNMP agent.

The objective of the performance program suite is very much different from that of the IBM NetView/6000 programs. The latter are concerned primarily with supervision and corrective action aiming at keeping the network resources available and accessible. Generally, resource availability is of more concern than resource utilization. For example, IBM NetView/6000 tracks the amount of free space of a disk while the performance tool described herein is more concerned about the physical disk activity.

The xmperf program suite is primarily concerned with the continuous monitoring of resource utilization, aiming at:

○ Identifying and possibly improving performance-heavy applications
○ Identify scarce system resources and taking steps to provide more of those resources
○ Predicting loads as input to capacity planning for the future
○ Identifying acute performance culprits and taking steps to resolve the problems they cause.

Somewhere between the two products is a grey area in which both are interested. This means that certain of the variables (or statistics) must be available in both environments. It also means that if the two products do not share information, they both access the same information, inducing an overhead that could eliminated if they had a common access mechanism.

Such a common access mechanism is available through the xmservd/SMUX interface. It allows the xmservd daemon to present all its statistics to the SNMP agent as read-only variables. The xmservd daemon interface is invoked by placing a single stanza in the configuration file /user/lpp/xmservd/xmservd.res. The token must begin in column one of a line of its own and must be:

dosmux

Once the dosmux stanza is in effect, every statistic available to the xmservd daemon is automatically registered with the snmp daemon on the local host. Dynamic Data Suppliers can add to or delete from the hierarchy of statistics. Any non-volatile changes induced Dynamic Data Suppliers are communicated to the snmpd daemon immediately while volatile changes are registered with the snmpd daemon only when instantiated.

The xmservd daemon can produce an MIB file that describes all the variables currently exported to snmpd. This is done whenever a SIGINT is sent (kill −2) to the xmservd process. The MIB file is created in ASN.1 notation and placed in /usr/lpp/xmservd/xmservd.mib. Any old copy of the file is overwritten. The generated MIB file can be compiled with the mosy command to produce a file in the format required by IBM NetView/6000. This file can then be appended to whichever file the SNMP manager is reading to interpret textual information about the variables.

When a MIB file is needed by sending a SIGINT to the xmservd daemon, all relevant Dynamic Data Supplier programs should be running and registered with the daemon. There should also be at least one data consumer registered with the daemon. This makes sure the generated MIB file includes all possible statistics in this host.

One of the advanced features of the xmperf context hierarchy is that it allows instantiation in multiple levels. One context may define disks and the actual number of disks varies from host to host. Through instantiation, subcontexts are added for each disk present in a particular host.

The SNMP data structures allow for a similar facility, namely the definition of tables. In the above case, the table would be "Disks" and it would contain as many elements as there were disk drives, each element containing all the fields defined for a disk.

The performance tool can continue the instantiation at the next level in the context hierarchy. For example, each disk may have a variable number of logical volumes assigned to them, each with its identical set of statistics. Instantiation would then allow one to adjust the context hierarchy as logical volume assignment changes.

SNMP does not allow such a thing. A table is the only type of structure that can be instantiated and it must always be at the lowest level in the hierarchy. Because of this, we have adjusted the performance tool's context hierarchy so as to never instantiate in multiple levels. Otherwise the context hierarchy could not be exported to the SNMP agent.

Because of the differences between the performance tool and the MIB definitions for instantiation, it seems warranted to illustrate what instantiation looks like in the two cases. The two cases are illustrated by looking at the instantiation of disk drive statistics Table 13 shows the list of disk statistics clipped from the output of the command xmpeek −1. It can be seen that each disk (there are three of them) has four statistics defined. The corresponding context structure is shown graphically in Table 14.

TABLE 13

| Disk Instantiation in xmperf | |
|---|---|
| /nchris/Disk/hdisk0/ | Statistics for disk hdisk0 |
| /nchris/Disk/hdisk0/busy | Time disk is busy (percent) |
| /nchris/Disk/hdisk0/xfer | Transfers to/from disk |
| /nchris/Disk/hdisk0/rblk | 512 byte blocks read from disk |
| /nchris/Disk/hdisk0/wblk | 512 byte blocks written to disk |
| /nchris/Disk/hdisk1/ | Statistics for disk hdisk1 |

TABLE 13-continued

| Disk Instantiation in xmperf | |
|---|---|
| /nchris/Disk/hdisk1/busy | Time disk is busy (percent) |
| /nchris/Disk/hdisk1/xfer | Transfers to/from disk |
| /nchris/Disk/hdisk1/rblk | 512 byte blocks read from disk |
| /nchris/Disk/hdisk1/wblk | 512 byte blocks written to disk |
| /nchris/Disk/hdisk2/ | Statistics for disk hdisk2 |
| /nchris/Disk/hdisk2/busy | Time disk is busy (percent) |
| /nchris/Disk/hdisk2/xfer | Transfers to/from disk |
| /nchris/Disk/hdisk2/rblk | 512 byte blocks read from disk |
| /nchris/Disk/hdisk2/wblk | 512 byte blocks written to disk |

TABLE 14

Disk Instantiation in xmperf, Graphical view

```
—TOP——Disk———hdisk0———busy
       |         |      |—xfer
       |         |      |—rblk
       |         |      |—wblk
       |         |
       |         |—hdisk1———busy
       |         |      |—xfer
       |         |      |—rblk
       |         |      |—wblk
       |         |
       |         |—hdisk2———busy
       |         |      |—xfer
       |         |      |—rblk
       |         |      |—wblk
```

The SNMP perception of this context structure is somewhat different. As the structure is exported from xmservd through the SMUX interface it is converted to an MIB table. Using the command:

```
snmpinfo —md —v xmdDisk
``` to print the MIB table, the output is illustrated in Table 15.

TABLE 15

| Disk Instantiation | |
|---|---|
| xmdDiskEntryInstName.0 = " | hdisk0" |
| xmdDiskEntryInstName.1 = " | hdisk1" |
| xmdDiskEntryInstName.2 = " | hdisk2" |
| xmdDiskEntryBusy.0 = 20943 | |
| xmdDiskEntryBusy.1 = 679 | |
| xmdDiskEntryBusy.2 = 386 | |
| xmdDiskEntryXfer.0 = 11832 | |
| xmdDiskEntryXfer.1 = 444 | |
| xmdDiskEntryXfer.2 = 89 | |
| xmdDiskEntryRblk.0 = 73201 | |
| xmdDiskEntryRblk.1 = 2967 | |
| xmdDiskEntryRblk.2 = 6595 | |
| xmdDiskEntryWblk.0 = 137449 | |
| xmdDiskEntryWblk.1 = 1585 | |
| xmdDiskEntryWblk.2 = 105 | |

As can be seen, the retrieval sequence is inverted. Where xmpert retrieves all statistics for one disk before proceeding to the next disk, SMUX traverses the structure by reading one statistic for all disks before proceeding to the next statistic.

Also notice how the name of the instance (in this case the name of the disk drive) appears as another artificial type of statistic which always has the name InstName meaning "instance name".

Finally, in the conversion from the performance tool's context structure to MIB table, an artificial extra level is inserted. This is because of the MIB definition syntax. The extra level in "path name" is always set to Entry in the conversion from a performance tool context.

The MIB definition for disk statistics is shown in Table 16.

TABLE 16

MIB Description for Disk Instantiation

```
xmdDisk OBJECT-TYPE
    SYNTAX SEQUENCE OF XmdDisk
    ACCESS not-accessible
    STATUS mandatory
    DESCRIPTION
        "Disk and CD ROM statistics"
    ::= { xmd 4 }
xmdDiskEntry OBJECT-TYPE
    SYNTAX XmdDiskEntry
    ACCESS not-accessible
    STATUS mandatory
    DESCRIPTION
        "Element of above table"
    ::= { xmdDisk 1 }
XmdDiskEntry ::=
    SEQUENCE
    {
        xmdDiskEntryInstName DisplayString,
        xmdDiskEntryBusy Counter,
        xmdDiskEntryXfer Counter,
        xmdDiskEntryRblk Counter,
        xmdDiskEntryWblk Counter
    }
xmdDiskEntryInstName OBJECT-TYPE
    SYNTAX DisplayString
    ACCESS read-only
    STATUS mandatory
    DESCRIPTION
        "Instance Name"
    ::= { xmdDiskEntry 1 }
xmdDiskEntryBusy OBJECT-TYPE
    SYNTAX Counter
    ACCESS read-only
    STATUS mandatory
    DESCRIPTION
        "Time disk is busy (percent)"
    ::= { xmdDiskEntry 2 }
xmdDiskEntryXfer OBJECT-TYPE
    SYNTAX Counter
    ACCESS read-only
    STATUS mandatory
    DESCRIPTION
        "Transfers to/from disk"
    ::= { xmdDiskEntry 3 }
xmdDiskEntryRblk OBJECT-TYPE
    SYNTAX Counter
    ACCESS read-only
    STATUS mandatory
    DESCRIPTION
        "512 byte blocks read from disk"
    ::= { xmdDiskEntry 4 }
xmdDiskEntryWblk OBJECT-TYPE
    SYNTAX Counter
    ACCESS read-only
    STATUS mandatory
    DESCRIPTION
        "512 byte blocks written to disk"
    ::= { xmdDiskEntry 5 }
```

In the performance tool, a context may be defined as having an instantiation type of:

SiNoInst

Context is never instantiated, not even if requested.

SiCfgInst

Context is instantiated when xmservd is started. Further attempts to instantiate are done only when explicitly requested. Most Data Consumer programs will not attempt to instantiate contexts with this context type; xmperf does not. Examples of contexts with this instantiation type are disks and page spaces.

SiContInst

Context is instantiated when it is created and when instantiation is requested. Most Data Consumer programs should attempt to instantiate contexts with this context type, xmperf does. The classical example of a context with this instantiation type is the context defining processes.

When exporting contexts through SMUX, contexts with instantiation type of SiCfgInst or SiContInst are converted to tables.

For Dynamic Data Supplier programs, a special restriction applies to the use of SiCfgInst and SiContInst. Neither can be used for contexts that are at the top of the hierarchy of non-volatile contexts defined by a DDS. Also, neither may be used for contexts that are added as volatile extensions.

In general, since a request for instantiation is not passed to a Dynamic Data Supplier program (DDS), only SiNoInst should be used in DDS programs. If it is desired to use SiContInst, each of the subcontexts of the context with SiContInst should be a volatile context of the same type. For the context to be exported through SMUX as a table, one instance of the subcontext must be defined as part of the non-volatile context hierarchy of the DDS program.

APPLICATION PROGRAMMING INTERFACE TO ACCESS REMOTE DAEMONS

Data Consumer programs can get full access to the statistics of any host's xmservd daemon through the use of an application programming interface. The Remote Statistics Interface (or the RSi interface), consists of several groups of function calls as follows:

1. Initialization and termination

RSiInit
  Allocates or changes the table of RSi handles.
RSiOpen
  Initializes the RSi interface for a remote host.
RSiClose
  Terminates the RSi interface for a remote host and releases all memory allocated.
RSiInvite
  Invites data suppliers on the network to identify themselves and returns a table of data supplier hostnames.

2. Instantiation and traversal of context hierarchy

RSiInstantiate
  Creates (instantiates) all subcontexts of a context object.
RSiPathGetCx
  Searches the context hierarchy for a context that matches a context path name.
RSiFirstCx
  Returns the first subcontext of a context.
RSiNextCx
  Returns the next subcontext of a context.
RSiFirstStat
  Returns the first statistic of a context.
RSiNextStat
  Returns the next statistic of a context.

3. Defining sets of statistics to receive

RSiCreateStatSet
  Creates an empty StatSet.
RSiPathAddSetStat
  Adds a single statistic to a StatSet.
RSiAddAndInst
  Instantiates the context of a given statistic and adds the statistic to a StatSet.
RSiDelSetStat
  Deletes a single statistic from a StatSet.
RSiStatGetPath
  Finds the full path name of a statistic identified by a StatVals pointer.

4. Starting, changing and stopping data feeding

RSiStartFeed
  Tells xmservd to start sending data feeds for a StatSet.
RSiChangeFeed
  Tells xmservd to change the time interval between sending data feeds for a StatSet.
RSiStopFeed
  Tells xmservd to stop sending data feeds for a StatSet.

5. Receiving and decoding data feed packets

RSiMainLoop
  Allows an application to suspend execution and wait to get waked up when data feeds arrive.
RSiGetValue
  Returns data value for given StatVals pointer by extraction from data feed packet.
RSiGetRawValue
  Returns a pointer to a valid StatVals structure for a given StatVals pointer by extraction from data feed packet.

The following section explains the interface data structures and also introduces the commonalities of the library functions and some important design concepts.

The RSi interface is based upon control blocks (or data structures) that describe the current view of the statistics on a remote host and the state of the interaction between a Data Consumer program and the remote host's xmservd daemon 210. The requisite data structures are:

RSi handle—An RSi handle is a pointer to a data structure of type RSiHandleStruct. Prior to using any other RSi call, a Data Consumer program must use the RSiInit call to allocate a table of RSi handles. An RSi handle from the table is initialized when the logical connection to a host is opened. This RSi handle must be specified as an argument on all subsequent function calls to the same host. Only one of the internal fields of the RSi handle should be used by the Data Consumer program, namely the pointer to received network packets, pi. Only in very special cases will it ever be needed to use this pointer, which is initialized by RSiOpen and must never be modified by a Data, Consumer program. The RSi handle is defined in /usr/lpp/xmservd/API/x-mip.h.

StatVals—A single data value is represented by a structure defined in /usr/lpp/xmservd/API/Sdidef.h as struct StatVals. You should be aware that none of the pointers defined in the structure are valid in Data Consumer programs. Attempts at using the pointers will usually produce a segmentation fault. Only the last three fields can be safely used by Data Consumer programs. Those fields are:

val The latest actual contents of the statistics data field.
  val_change The difference (delta value) between the latest actual contents of the statistics data field and the previous value observed.
  error An error code as defined by the enum Error in include file /usr/lpp/xmservd/API/Sdidef.h. Note that the two value fields are defined as union Value, which means that the actual data fields may be long or float, depending on flags in the corresponding Stat structure. The Stat structure can not be accessed directly from the StatVals structure (the pointer is invalid, as already mentioned). Therefore, to determine the type of data in the val and val_change fields, one should have saved the Stat structure as returned by the RSiPathAddSetStat function call. This is rather clumsy so the function call RSiGetValue does everything for you and you needn't worry about keeping track of Stat structures.

Stat—This is a data structure to describe a statistics value. It is defined in /usr/lpp/xmservd/API/Sdidef.h as of type struct Stat. If information from this data structure is needed (apart from information that can be returned by the function RSiStatGetPath) the data should be saved as it is returned by the RSiPathAddSetStat function call. Please note that the pointer get_fun has no meaning in a Data Consumer program.

The RSiGetRawValue function call provides another way of obtaining access to a Stat structure, but can only do so when a data feed packet is being processed.

StatSet—The xmservd daemon will accept the definition of sets of statistics that are to be extracted simultaneously and sent to the Data Consumer program in a single data packet. The structure that describes such a set of statistics is defined in /usr/lpp/xmservd/API/Sdidef.h as of type struct StatSet. As returned by the RSiCreateStatSet function call, the StatSet pointer should be treated as a handle whose only purpose is to identify the correct set of statistics on several other function calls.

When returned in a data feed package, the StatSet structure holds the actual time (according to the remote host's clock) the data feed package was created and the elapsed time since the latest previous data feed package for the same StatSet was created. In both cases, the pointer in the structure is invalid for Data Consumer programs.

The RSi interface API has two distinctly different ways of operation. This section describes the RSi "request-response" protocol which sends a single request to xmservd and waits for a response. A timeout will occur if no response has been received within a specified time limit in which case one single retry is attempted. If the retry also results in a timeout, that is communicated to the caller by placing the constant RSiTimeout in the external integer field RSIErrno. If any other error occurred, the external integer field will have some other non-zero value.

If neither a communications error nor a timeout occurred, a packet will be available in the receive buffer pointed to by the pi pointer in the SDi handle. The packet will include a status code that tells whether the function call was successful at the xmservd side. Checking the status code in a packet is only required if it matters what exactly the code is, because the constant RSiBadStat will be placed in RSiErrno to indicate to a Data Consumer program that a bad status code was received.

An indication of error or success as defined for each function call can be used to determine if the function call succeeded or the external integer RSiErrno can be tested. If this field is RSiOkay, the function call succeeded; otherwise, it did not. The error codes returned in RSiErrno are defined in the enum RSiErrorType. RSiErrorType definitions are defined as:

RSiOkay=0: function call executed successfully
RSiTimeout: no response from data supplier after a retry
RSiBusy: RSi being opened
RSiSendErr: short package sent or could not send to socket address
RSiPollErr: error on poll or select call
RSiRecvErr: error in call to receive data from socket address
RSiSizeErr: short package received
RSiResync: data supplies requested resync
RSiBadStat: received a packet with an error status code
RSiBadArg: invalid argument to an RSi* call
RSiBadHost: cannot convert or cannot find internet address for host
RSiDupHost: Duplicate hostname
RSiSockErr: error in opening or preparing socket
RSiNoPort: error on getservbyname call
RSiNoMatch: cannot map a statval or statset to an active console
RSiInstErr: could not instantiate an object with a data supplier
RSiNoFeed: no data feed record
RSiTooMany: exceeded the max number of statistics for a network packet
RSiNoMem: Out of memory for RSiHandle table
RSiNotInit: Interface not initialized through RSiInit All the library functions (161 of FIG. 8) use the request-response interface, except for RSiMainLoop (which uses a network driven interface) and RSiInit, RSiGetValue, and RSiGetRawValue (which do not involve network traffic).

The xmquery protocol defines three types of data packets that are sent from the data supplier side (xmservd) without being solicited by a request packet. Those packet types are the still_alive, the data_feed, and the except_rec packets. The still_alive packets are handled internally in the RSi interface 160 and requires no programming in the Data Consumer program.

The data_feed packets are received asynchronously with any packets produced by the request-response type function calls. If a data_feed packet is received when processing a request-response function, control is passed to a callback function, which must be named when the RSi handle is created with the RSiOpen function call.

When the Data Consumer program is not using the request-response functions, it still needs to be able to receive and process data_feed packets. This is done with the RSiMainLoop function, which will invoke the callback function whenever a packet is received.

Actually, the data feed callback function is invoked for all packets received that can not be identified as a response to the latest request sent, except if such packets are of type i_am_back, still_alive, or except_rec. Note that responses to "request-response" packets that arrive after a timeout will be sent to the callback function. It is the responsibility of the callback function to test for the package type received.

The except_rec packets are received asynchronously with any packets produced by the request-response type function calls. If an except_rec packet is received when processing a request-response function, control is passed to a callback function, which must be named when the RSi handle is created with the RSiOpen function call.

When the Data Consumer program is not using the request-response functions, it still needs to be able to receive and process except_rec packets. This is done with the RSiMainLoop function which will invoke the callback function whenever a packet is received.

Note that the Data Consumer program will discard except_rec messages unless a callback function to process the message type was specified on the RSiOpen function call.

Network connections can go bad, hosts can go down, interfaces can be taken down and processes can die. This situation induces extra complexity in all network based programs. In the case of the xmservd protocol, such situations will normally result in one or more of the following:

Missing packets

Responses to outstanding requests will not be received, which will generate a timeout. A timeout fairly easy to cope with since the Data Consumer program will have to handle other error return codes anyway. It will also result in expected data feeds not being received. The proper way to handle this situation is to use the RSiClose function to release all memory related to the dead host and to free the RSi handle. After this RSihandle is freed, the Data Consumer program may attempt another RSiOpen to the remote system or may simply exit.

Resynchronizing requests

Whenever an xmservd daemon hears from a given Data Consumer program on a given host for the first time, it will respond with a packet of type i_am_back, effectively prompting the Data Consumer program to resynchronize with the daemon. Also, when the daemon attempts to resync with Data Consumer programs that it talked to when it was killed or died, the daemon will send an i_am_back packet. There are a few other situations, all involving internal errors detected by the xmservd daemon, which will also generate an i_am_back packet, but they are rare and can be safely disregarded.

It is, however, important to understand xmservd's perception of "first time contacted". It is based upon tables internal to the daemon. Those tables identify all Data Consumers about which the daemon knows. Be aware, that a Data Consumer program is known by the hostname of the host where it executes suffixed by the IP port number used to talk to the daemon. Each Data Consumer program running will be identified uniquely as will several running copies of the same Data Consumer program.

Whenever a Data Consumer program exits orderly, it will tell the daemon that it intends to exit and the daemon will remove the consumer from the internal tables. If, however, the Data Consumer program decides to not request data feeds from the daemon for some time, the daemon will detect that the Data Consumer has lost interest and will remove the Data Consumer from its tables. If the Data Consumer program decides later that it wants to talk to the xmservd again, the daemon will respond with an i_am_back packet.

The i_am_back packets are given special treatment by the RSi interface. Each time one is received, a callback function is invoked. This function must be defined on the RSiOpen function call.

Note that all Data Consumer programs can expect to have this callback invoked once during execution of the RSiOpen function call since the remote xmservd will not know the Data Consumer. This is normal and should not cause the Data Consumer program to panic. If the resynchronize callback is invoked twice during processing of the RSiOpen function, the open failed and could be retried, if appropriate.

The use of the API is illustrated by creating a small Data Consumer program to produce a continuous list of statistics from a remote host. The first version will access only cpu related statistics. It will assume that the statistics are from the local host unless you specify a hostname on the command line. The program will continue to display the statistics until it is killed. Source code for the sample program can be found in Appendix A.

The functions used to initialize and terminate the relationship with an xmservd daemon are shown in Tables 17, 18 and 19. Before any other call is executed, the program must issue the RSiInit call. The call's purpose is to:

1. Allocate a array of RSiHandleStruct structures and return the address of the array to the Data Consumer program, or
2. Increase the size of a previously allocated array of RSiHandleStruct structures and initialize the new array with the contents of the previous one.

TABLE 17

| RSiHandle RSiInit (int count) |
| --- |

If successful, the function returns the address of the allocated array. If an error occurs, an error text is placed in the external character array RSiEMsg and the function returns NULL. When used to increase the size of a previously allocated array, the function first allocates the new array, then moves the entire old array to the new area. Applications programs should refer to elements in the RSi handle array by index rather than by address if they anticipate the need for expanding the array. The array will only need to be expanded if the number of remote hosts a Data Consumer program talks to may increase over the life of the program.

An application that calls RSiInit repetitively will need to preserve the previous address of the RSiHandle array while the RSiInit call is reexecuted. After the call has completed successfully, the calling program should free the previous array using the free subroutine.

The argument to the function is:

count

Must specify the number of elements in the array of RSi handles. If the call is used to expand a previously allocated array, this argument must be larger than the current number of array elements. It must always be larger than zero. The size of the array should be specified to be at least as large as the number of hosts the Data Consumer program can talk to at any point in time.

Referring now to Table 18, the library function called RSiOpen's purpose is to:

1. Establish the Data Consumer program as a known Data Consumer on a particular host. This is done by sending an are_you_there packet to the host.

2. Initialize an RSi handle for subsequent use by the Data Consumer program.

TABLE 18
RSiOpen Function Call

```
int RSiOpen (RSiHandle rhandle,
             int wait,
             int bufsize,
             char *hostname,
             int (*feed__callb)(),
             int (*resy__callb)(),
             int (*excp__callb)())
```

If successful, the function returns zero and initializes the area of type RSiHandle pointed to by rhandle. If an error occurs, an error text is placed in the external character array RSiEMsg and the function returns a negative value.

The arguments to the function are:

rhandle

Must point to an element of the RSiHandleStruct array, which is returned by a previous RSiInit call. If the function is successful the structure will be initialized and ready to use as a handle for subsequent RSi interface function calls.

wait

Must specify the timeout in milliseconds that the RSi interface shall wait for a response when using the request-response functions. On LANs, a reasonable value for this argument is 100 milliseconds. If the response is not received after the specified wait time, the library functions 161 will retry the receive operation until five times the wait time has elapsed before returning a timeout indication. The wait time is zero or more milliseconds.

bufsize

Specifies the maximum buffer size to be used for constructing network packets. This size is generally least 2,048 bytes. The buffer size determines the maximum packet length that can be received by a data consumer program, and sets the limit for the number of data values that can be received in one data__feed packet. There's no point in setting the buffer size larger than that of the xmservd daemon since both must be able to handle the packets. If large sets of values are needed, the command line argument −b to xmservd can be used to increase its buffer size up to 16,384 bytes. The fixed part of a data__feed packet is 104 bytes and each value takes 32 bytes. A buffer size of 2,048 bytes, thus, will allow up to 60 values per packet.

hostname

Must be a character array containing the identification of the remote host whose xmservd daemon is contacted. The first "word" of the host identification (up to the first white space) is used as the hostname. The full host identification is stored in the RSiHandle field longname and may contain any description that helps the end user identify the host used. The hostname may be in long format (including domain name) or in short format.

feed__callb

Must be a pointer to a function that will process data__feed packets as they are received from the xmservd daemon. When this callback function is invoked, it will be passed three arguments as described below.

resy__callb

Must be a pointer to a function that will process i__am__back packets as they are received from the xmservd daemon. When this callback function is invoked, it will be passed three arguments as described below.

excp__callb

Must be NULL or a pointer to a function that will process except__rec packets as they are received from the xmservd daemon. If a NULL pointer is passed, the application will not receive except__rec messages. When this callback function is invoked, it will be passed three arguments as described below. This argument always overrides the corresponding argument of any previous RSiInvite or RSiOpen call and may itself be overridden by subsequent executions of either. In this way, the monitoring application can turn exception monitoring on and off. For an RSiOpen call to override the exception processing specified by a previous open call, the connection must first be closed with the RSiClose call.

The feed__callb, resy__callb, and excp__callb functions in the application are called with the following three arguments:

1. An RSiHandle. When a data__feed packet is received, the structure is guaranteed to represent the host sending the packet. In all other situations, the RSiHandle structure may represent any of the hosts to which the application is talking.
2. A pointer of type pack * to the input buffer containing the received packet. This pointer is used rather than the pointer in the RSiHandle structure.
3. A pointer of type struct sockaddr__in * to the Internet address of the originating host.

The library function RSiClose, shown in Table 19, is responsible for:

1. Removing the Data Consumer program as a known Data Consumer on a particular host. This is done by sending a going__down packet to the host.
2. Marking the RSi handle as not active.
3. Releasing all memory allocated in connection with the RSi handle.

TABLE 19
RSIClose Function Call

```
void RSiClose(RSHandle rhandle)
```

The function has no return value. The argument to the function is:

rhandle

Must be an RSiHandle, which was previously initialized by the RSiOpen function.

The macro RSiIsOpen can be used to test whether an RSi handle is open. It takes an RSiHandle as argument and returns TRUE (1) if the handle is open, otherwise FALSE (0).

The main function of the sample program uses the above three functions as shown in Table 20. The lines 12 through 15 use any command line argument to override the default hostname obtained by the uname function.

TABLE 20
DATA CONSUMER MAIN FUNCTION

```
[01]  extern char      RSiEMsg[];
[02]  extern int       RSiErrno;
[03]  char             host[64], apath[256], head[24][10], head2[24][10];
[04]  char             *nptr, **navn = &nptr, *dptr, **desc = &dptr;
[05]  struct utsname   uname_struct;
[06]  RSiHandle        *rsh;
[07]  struct StatVals  *svp[24];
[08]  int              lct = 99, tix = o;
[09]
[10]  main(int argo, char **argv)
[11]  {
[12]      uname(&uname_struct);
[13]      strcpy(host, uname_struct.nodename);
[14]      if (argc > 1)
[15]          strcpy(host, argv[1]);
[16]
[17]      if (!(rsh = RSiInit(1)))
[18]      {
[19]          fprintf(stderr, "unable to initialize RSi interface \ n");
[20]          exit(98);
[21]      }
[22]      if (RSiOpen(rsh, 100, 2048, host, feeding, resync, NULL0
[23]      {
[24]          if (strlen(RSiEMsg))
[25]              fprint(stderr, "%s", RSiEMsg);
[26]          fprintf(stderr, "Error contacting host \ "%s\ " \ n \ , host);
[27]          exit(-99);
[28]      }
[29]      signal(SIGINT, must_exit);
[30]      signal(SIGTERM, must_exit);
[31]      signal(SIGSEGV, must_exit);
[32]      signal(SIGQUIT, must_exit);
[33]
[34]      strcpy(apath, "hosts/");
[35]      strcat(apath, host);
[36]      strcat(apath, "/");
[37]      lststats(apath);
[38]      RSiClose(rsh);
[39]      exit(0);
[40]  }
```

Lines 17 through 28 initialize the RSi interface using the RSiInit and RSiOpen functions. Notice that the program exits if the initialization fails.

The following lines (29–32) make sure that the program detects any attempt to kill or terminate it. If this happens, the function must_exit is invoked. This function has the sole purpose of making sure the association with the xmservd daemon is terminated. Termination is does this by using the function shown in Table 21.

TABLE 21
Data Consumer Signal Processing

```
void must_exit()
{
    RSiClose(rsh);
    exit(-9);
{
```

Finally, lines 34 through 36 of Table 20 prepares an initial value path name for the main processing loop of the Data Consumer program. This is one way all value path names should be prepared. Next, the main processing loop in the internal function lststats is called. If, against odds, this function returns, an RSiClose call is issued and the program is exited.

As it is the intention that this sample Data Consumer program will be able to receive data feeds from the xmservd daemon, a StatSet should be prepared to define the set of statistics. This is done with the RSiCreateStatSet function shown in Table 22. The function simply:

1. Allocates a StatSet structure.

2. Initializes the structure as an empty StatSet.

TABLE 22
RSICreateStatSet Function Call struct StatSet *RSiCreateStatSet(RSiHandle rhandle)

If successful, the function returns a pointer to the created StatSet. If an error occurs the function returns NULL and an error text may be placed in the external character array RSiEMsg.

The argument to the function is:

rhandle

Must be an RSiHandle, which was previously initialized by the RSiOpen function.

In this sample program, the StatSet is created in the main processing function shown in Table 24.

Lines 12 through 19 in Table 24 invoke the local function addstat, which will find all the CPU related statistics in the context hierarchy and initialize arrays to collect and print the information. The first two lines expand the value path name passed to the function by appending CPU. The resulting string is the path name of the context where all CPU related statistics are held. The path name will have the format hosts/hostname/CPU without a terminating slash, which is what is expected by the function calls that take a value path name as argument. The function addstat is shown in Table 27. It uses three of the traversal functions to access the cpu related statistics. The first function call is RSiPathGetCx (Table 19), whose purpose is to:

1. Search the context hierarchy for a given path name of a context.
2. Return a handle to be used when subsequently referencing the context.

TABLE 23

RSiGetPathCx Function Call cx_handle *RSiPathGetCx(RSiHandle rhandle,
char *path)

If successful, the function returns a handle defined as a pointer to a structure of type cx_handle. If an error occurs, NULL is returned and an error text may be placed in the external character array RSiEMsg.

The arguments to the function are:

rhandle
  Must be an RSiHandle, which was previously initialized by the RSiOpen function.
path
  A path name of a context for which a handle is to be returned. The context path name must be the full path name and must not include a terminating slash. Note that context path names never start with a slash.

The use of RSiPathGetCx by the sample program is shown in lines 8 through 12 in Table 27. Next, in lines 14 through 30, two function calls retrieve the statistics values defined for the CPU context. This is done by using RSiFirstStat end RSiNextStat. These functions are described in Tables 25 and 26.

TABLE 24

Data Consumer Main Processing Function

| [01] | void lststats(char *basepath) |
| [02] | { |
| [03] |    struct StatSet   *ssp; |
| [04] |    char           tmp[128]; |
| [05] | |
| [06] |    if (!(ssp = RSiCreateStatSet(rsh))) |
| [07] |    { |
| [08] |       fprintf(stderr, "RSiPathGetCx can \'t create StatSet \ n"); |
| [09] |       exit(62); |
| [10] |    } |
| [11] | |
| [12] |    strcpy(tmp, basepath); |
| [13] |    strcat(tmp, "CPU"); |
| [14] |    if ((tix = addstat(tix, ssp, tmp, "CPU")) = −1) |
| [15] |    { |
| [16] |       if (strlen(RSiEmsg)) |
| [17] |          fprintf(stderr, "%s", RSiEMsg); |
| [18] |       exit(63); |
| [19] |    } |
| [20] | |
| [21] |    RSiStartFeed(rsh, ssp, 1000); |
| [22] |    while(TRUE) |
| [23] |       RSiMainLoop(499); |
| [24] | } |

The purpose of the RSiFirstStat function (Table 25) is to:

1. Validate that a context identified by the second argument exists.
2. Return a handle to the first element of the list of statistics defined for the context.
3. Return the short name and description of the statistic.

TABLE 25

RSiFirstStat Function Call struct StatLink *RSiFirstStat(RSiHandle rhandle,
cx_handle *context,
char **name,
char **descr)

If successful, the function returns a pointer to a structure of type struct StatLink. If an error occurs, NULL is returned and an error text may be placed in the external character array RSiEMsg.

The arguments to the function are:

rhandle
  Must be an RSiHandle, which was previously initialized by the RSiOpen function.
context
  Must be a handle of type cx_handle, which was previously returned by a successful RSiPathGetCx function call.
name
  Must be a pointer to a pointer to a character array. The pointer must be initialized to point at a character array pointer. When the function call is successful, the short name of the statistics value is returned in the character array pointer.
descr
  Must be a pointer to a pointer to a character array. The pointer must be initialized to point at a character array pointer. When the function call is successful, the description of the statistics value is returned in the character array pointer.

The purpose of the RSiNextStat function (Table 26) is to:

1. Validate that a context identified by the second argument exists.
2. Return a handle to the next element of the list of statistics defined for the context.
3. Return the short name and description of the statistic.

TABLE 26

RSiNextStat Function Call struct StatLink *RSiNextStat(RSiHandle rhandle,
                              cx_handle *context,
                              struct StatLink *link,
                              char **name,
                              char **descr)

If successful, the function returns a pointer to a structure of type struct StatLink. If an error occurs, NULL is returned and an error text may be placed in the external character array RSiEMsg.

The arguments to the function are:

rhandle

An RSiHandle, which was previously initialized by the RSiOpen function.

context

A handle of type cx_handle, which was previously returned by a successful RSiPathGetCx function call.

link

A pointer to a structure of type struct StatLink, which was previously returned by a successful RSiFirstStat or RSiNextStat function call.

name

A pointer to a pointer to a character array. The pointer is be initialized to point at a character array pointer. When the function call is successful, the short name of the statistics value is returned in the character array pointer.

descr

A pointer to a pointer to a character array. The pointer is initialized to point at a character array pointer. When the function call is successful, the description of the statistics value is returned in the character array pointer.

In lines 20-21 in TABLE 27, the short name of the context ("CPU") is saved and the short name of the statistic in two arrays for use when printing the column headings. Lines 22-24 construct the full path name of the statistics value by concatenating the full context path name and the short name of the value. This is necessary to proceed with adding the value to the StatSet with the function call RSiPathAddSetStat described in TABLE 28. The value is added by lines 25 and 26 in TABLE 27.

TABLE 27

Data Consumer Function addstat

```
[01]   int addstat(int ix, struct StatSet *ssp, char *path, char *txt)
[02]   {
[03]       cx_handle      *cxh;
[04]       int            i = ix;
[05]       char           tmp[128];
[06]       struct StatLink *statlink;
[07]
[08]       if (!(cxh = RSiPathGetCx(&rsh, path)))
[09]       {
[10]           fprintf(stderr, -"RSiPathGetCx can \ 't access host (path %s)  n,
[11]           host, path); exit(61);
[12]       }
[13]
[14]       if ((statlink = RSiFirstStat(&rsh, cxh, navn, desc)))
[15]       {
[16]           while (statlink)
[17]           {
[18]               if (i > 23)
[19]                   break;
[20]               strcpy(head1[i], txt);
[21]               strcpy(head2[2], *navn);
[22]               strcpy(tmp, path);
[23]               strcat(tmp, "/");
[24]               strcat(tmp, *navn);
[25]               if (!(svp[i] = RSiPathAddSetStat(&rsh, ssp, tmp)))
[26]                   return(-1);
[27]               i++;
[28]               statlink = RSiNextStat(&rsh, cxh, statlink, navn, desc);
[29]           }
[30]       }
[31]       return(i);
[32]   }
```

The purpose of the RSiPathAddSetStat function (Table 28) is to:

1. Add a single statistics value to an already defined StatSet.

TABLE 28

RSIPathAddSetStat Function Call struct StatVals *RSiPathAddSetStat(RSiHandle rhandle,
                                     struct StatSet *StatSet,
                                     char *path)

If successful, the function returns a pointer to a structure of type struct StatVals. If an error occurs NULL is returned and an error text may be placed in the external character array RSiEMsg. If you attempt to add more values to a StatSet than the current local buffer size allows, RSiErrno is set to RSiTooMany. If an attempt is made to add more values than the buffer size of the remote host's xmservd daemon allows, RSiErrno is set to RSiBadStat and the status field in the returned packet is set to too_many_hosts.

The external integer RSiMaxValues holds the maximum number of values acceptable with the Data Consumer's buffer size.

The arguments to the function are:

rhandle

An RSiHandle, which was previously initialized by the RSiOpen function.

statset

A pointer to a structure of type struct StatSet, which was previously returned by a successful RSiCreateStatSet function call.

path

The full value path name of the statistics value to add to the StatSet. The value path name should not include a terminating slash. Note that value path names never start with a slash.

The next part of the main processing function in Table 24 to explain consists of lines 21 through 23. The first line simply tells the xmservd daemon to start feeding observations of statistics for a StatSet. The next two lines define an infinite loop that calls the function RSiMainLoop to check for incoming data_feed packets. The two function calls involved are described in TABLES 29 and 30.

The purpose of the RSiStartFeed function (Table 29) is to:

1. Inform the xmservd of the frequence it is required to send data_feed packets with.
2. Tell the xmservd to start sending data_feed packets.

TABLE 29

RSiStartFeed Function Call int RSiStartFeed(RSiHandle rhandle,
              struct StatSet *statset,
              int msecs)

If successful, the function returns zero, otherwise it returns −1 and an error text may be placed in the external character array RSiEMsg.

The arguments to the function are:

rhandle

An RSiHandle, which was previously initialized by the RSiOpen function.

statset

A pointer to a structure of type struct StatSet, which was previously returned by a successful RSiCreateStatSet function call.

msecs

The number of milliseconds between the sending of data_feed packets. This number is rounded to a multiple of 500 milliseconds.

The purpose of the RSiMainLoop function (Table 30) is to:

1. Allow the Data Consumer program to suspend processing while waiting for data_feed packets to arrive from one or more xmservd daemons.
2. Tell the function that waits for data feeds to return control to the Data Consumer program so that the latter can check for and react to other events.
3. Invoke the function to process data_feed packets for each such packet received.

TABLE 30

RSiMainLoop Function Call void RSiMainLoop(int msecs)

The function call does not return any value. An error text may be placed in the external character array RSiEMsg.

The arguments to the function are:

msecs

The minimum elapsed time in milliseconds that the function should continue to attempt receives before returning to the caller. Notice that the program releases control for as many milliseconds specified but that the callback functions defined on the RSiOpen call may be called repetitively during that time.

If the data consumer program is the major event controller, this value should always be set to a non-zero value as in the example programs we show here. If the program has another major event controller, such at the XtMainLoop event loop of one of the X Windows toolkits, it's a good idea to specify a zero value. A timeout function can then trigger the execution of RSiMainLoop. Each time the RSiMainLoop is executed with a zero value for msecs, all available input packets are read and processed. As soon as there's no more input available, the function returns. An example of how to use RSiMainLoop in OSF/Motif applications is shown in Table 31.

TABLE 31

```
void xtimeout(void *something)
{
        xiid = XtAppAddTimeOut(XtWidgetToApplicationContext(top),
            xdelay, xtimeout, NULL);
        RSiMainLoop(0);
}
```

The two remaining function calls concerned with controlling the flow of data feeds from xmservd will now be described. This is done in reference to TABLES 32 and 33.

The purpose of the RSiChangeFeed function (Table 32) is to:

1. Change the frequency at which the xmservd daemon is sending data_feed packets.

TABLE 32

RSIChangeFeed Function Call int RSiChangeFeed(RSiHandle rhandle,
              struct StatSet *statset,
              int msecs)

If successful, the function returns zero, otherwise −1. A null error text is placed in the external character array RSiEMsg regardless of the function's success or failure.

The arguments to the function are:

rhandle

An RSiHandle, which was previously initialized by the RSiOpen function.

statset

A pointer to a structure of type struct StatSet, which was previously returned by a successful RSiCreateStat- Set function call. Data feeding should have been started for this StatSet via a previous RSiStartFeed function call.

msecs

The number of milliseconds between the sending of data_feed packets. This number is rounded to a multiple of 500 milliseconds.

The purpose of the RSiStopFeed function. (Table 33) is to:

1. Tell the xmservd daemon to stop sending data_feed packets for a given StatSet. If the daemon is not told to erase the StatSet, feeding of data can be resumed by issuing the RSiStartFeed function call for the StatSet.
2. Optionally tell the daemon and the API library functions to erase all their information about the StatSet. Subsequent references to the erased StatSet are invalid.

TABLE 33

| RSiStopFeed Function Call |
| --- |
| int RSiStopFeed(RSiHandle rhandle, struct StatSet *statset, boolean erase) |

If successful, the function returns zero, otherwise −1. A null error text is placed in the external character array RSiEMsg regardless of the function's success or failure.

The arguments to the function are:

rhandle

To a structure of type RSiHandle, which was previously initialized by the RSiOpen function.

statset

A pointer to a structure type struct StatSet, which was previously returned by a successful RSiCreateStatSet function call. Data feeding must have been started for this StatSet via a previous RSiStartFeed function call.

erase

If this argument is set to TRUE, the xmservd daemon will discard all information about the named StatSet. Otherwise, the daemon will maintain its definition of the set of statistics.

Whenever a data_feed is detected by the RSi interface the data feed callback function defined in the RSiOpen function call is invoked, passing the RSi handle as an argument to the callback function. Our sample program's callback function for data feeds is shown in TABLE 34. Most of the lines in the function are concerned with printing headings after each 20 detail lines printed. This is in line numbers 9 through 19 and 26.

TABLE 34

| Data Consumer Processing of Data Feeds | | |
| --- | --- | --- |
| [01] | void feeding(RSiHandle rsh, pack *p) | |
| [02] | { | |
| [03] | int | i; |
| [04] | float | f; |
| [05] | long | v; |
| [06] | | |
| [07] | if (p—>type != data_feed) | |
| [08] | return | |
| [09] | if (lct > 20) | |
| [10] | { | |
| [11] | printf ("\n\n"); | |

TABLE 34-continued

| Data Consumer Processing of Data Feeds | | |
| --- | --- | --- |
| [12] | for (i = o; i < tix; i++) | |
| [13] | printf("%08s, head1[i]); | |
| [14] | printf("\n"); | |
| [15] | for (i = o; i < tix; i++) | |
| [16] | printf ("\n"); | |
| [17] | printf ("\n"); | |
| [18] | lct = o; | |
| [19] | } | |
| [20] | for (i = o; i < tix; i++) | |
| [21] | { | |
| [22] | v = RSiGetValue(rsh, svp[i] * 10.0; | |
| [23] | printf("%6d.%d", v/10, v%10); | |
| [24] | } | |
| [25] | printf ("\n"); | |
| [26] | lct++; | |
| [27] | } | |

Actual processing of received statistics values is done by the lines 20–24. It involves the use of the library function RSiGetValue which:

1. Finds a StatVals structure in the received data packet based upon the second argument to the function call. This involves a lookup operation in tables maintained internally by the RSi interface.
2. Determines the format of the data field as being either SiFloat or SiLong and extracts the data value for further processing based upon its data format.
3. Determines the value as either of type SiQuantity or SiCounter. If the former is the case, the data value returned is the val field in the StatVals structure. If the latter type is found, the value returned by the function is the val_change field divided by the elapsed number of seconds since the previous data packet's time stamp.

TABLE 35

| RSiGetValue Function Call |
| --- |
| float RSiGetValue(RSiHandle rhandle, struct StatVals *svp) |

If successful, the function returns a non-negative value, otherwise, it returns a negative value less than or equal to −1.0. A null error text is placed in the external character array RSiEMsg regardless of the function's success or failure.

The arguments to the function are:

rhandle

Must be an RSiHandle, which was previously initialized by the RSiOpen function.

svp

A handle of type struct StatVals, which was previously returned by a successful RSiPathAddSetStat function call.

FIG. 26 shows an example of output generated from the sample program listed in Appendix A.

If there is a need to know more about the data received in data feed packets than what RSiGetValue gives, the library function RSiGetRawValue (Table 32) can be used. This function gives the following:

1. Finds a StatVals structure in the received data packet based upon the second argument to the function call. This involves a lookup operation in tables maintained internally by the RSi interface.
2. Updates the struct Stat pointer in the StatVals structure to point at a valid Stat structure.
3. Returns a pointer to the StatVals structure. The returned pointer points to a static area and is only valid until the next execution of RSiGetRawValue.
4. Updates an integer variable with the index into the ValsSet array of the data feed packet, which corresponds to the second argument to the call.

TABLE 36
---
RSiGetRawValue Function Call struct StatVals RSiGetRawValue(RSiHandle rhandle,
                    struct StatVals *svp,
                    int *index)

If successful, the function returns a pointer, otherwise NULL is returned and an error text may be placed in the external character array RSiEMsg.

The arguments to the function are:

rhandle
A RSiHandle, which was previously initialized by the RSiOpen function.
svp
A handle of type struct StatVals, which was previously returned by a successful RSiPathAddSetStat function call.
index
A pointer to an integer variable. When the function call succeeds, the index into the ValsSet array of the data feed packet is returned. The index corresponds to the element that matches the svp argument to the function.

If we wanted to also list the statistics with the short name xfer for all the disks found in the system where the daemon runs, additional function calls to traverse contexts are needed.

The purpose of the RSiFirstCx function (Table 37) is to:

1. Validate that a context identified by the second argument exists.
2. Return a handle to the first element of the list of subcontexts defined for the context.
3. Return the short name and description of the subcontext.

TABLE 37
---
RSiFirstCx Function Call struct CxLink *RSiFirstCx(RSiHandle rhandle,
                    cx_handle *context,
                    char **name,
                    char **descr)

If successful, the function returns a pointer to a structure of type struct CxLink. If an error occurs, NULL is returned and an error text may be placed in the external character array RSiEMsg.

The arguments to the function are:

rhandle
A RSiHandle, which was previously initialized by the RSiOpen function.
context
A handle of type cx_handle, which was previously returned by a successful RSiPathGetCx function call.
name
A pointer to a pointer to a character array. The pointer is initialized to point at a character array pointer. When the function call is successful, the short name of the subcontext is returned in the character array pointer.
descr
A pointer to a pointer to a character array. The pointer is initialized to point at a character array pointer. When the function call is successful, the description of the subcontext is returned in the character array pointer.

The purpose of the RSiNextCx function (Table 38) is to:

1. Validate that a context identified by the second argument exists.
2. Return a handle to the next element of the list of subcontexts defined for the context.
3. Return the short name and description of the subcontext.

TABLE 38
---
RSiNextCx Function Call struct CxLink *RSiNextCx(RSiHandle rhandle,
                   cx_handle *context,
                   struct CxLink *link,
                   char **name,
                   char **descr)

If successful, the function returns a pointer to a structure of type struct CxLink. If an error occurs, NULL is returned and an error text may be placed in the external character array RSiEMsg.

The arguments to the function are:

rhandle
Points to a structure of type RSiHandle, which was previously initialized by the RSiOpen function.
context
A handle of type cx_handle, which was previously returned by a successful RSiPathGetCx function call.
link
A pointer to a structure of type struct CxLink, which was previously returned by a successful RSiFirstCx or RSiNextCx function call.
name
A pointer to a pointer to a character array. The pointer is initialized to point at a character array pointer. When the function call is successful, the short name of the subcontext is returned in the character array pointer.
descr
A pointer to a pointer to a character array. The pointer is initialized to point at a character array pointer. When the function call is successful, the description of the subcontext is returned in the character array pointer.

The purpose of the RSiInstantiate function (Table 39) is to:

1. Validate that a context identified by the second argument exists.

2. Instantiate the context so that all subcontexts of that context are created in the context hierarchy. Note that this function call currently makes sense each subcontext to the StatSet in turn. A program that wanted to traverse all levels of subcontexts below a start context could easily create a recursive function.

TABLE 40

Data Consumer Context Traversal
(C) Copyright IBM Corporation, unpublished, all rights reserved

```
[01]  int addisk(int ix, struct StatSet *ssp, char *path
[02]  {
[03]      int              i = ix;
[04]      char             tmp[128];
[05]      cx_handle        *cxh;
[06]      struct StatLink  *statlink;
[07]      struct CxLink    *cxlink;
[08]
[09]      if (((cxh = RSiPathGetCx(rsh, path)) = NUX) ||
[10]          (!cxh) || (!cxh —>cxt))
[11]      {
[12]          if (strlen(RsiEMsg))
[13]              fprintf(stderr, "%s", RSiEMsg);
[14]          fprintf(stderr, "RSiPathGetCx can \'t access host %s (path %s) \ n",
[15]              host, path);
[16]          exit(64);
[17]      }
[18]      if (rsh—>pi—>data.getcx.context.inst_freq = SiContInst)
[19]      {
[20]          if ((i = RSiInstantiate(rsh, cxh)))
[21]              return(-1);
[22]      }
[23]      if ((cxlink = RSiFirstCx(rsh, cxh, navn, desc)))
[24]      {
[25]          while (cxlink)
[26]          {
[27]              strcpy(tmp, path);
[28]              if (strlen(tmp))
[29]                  strcat(tmp, "/");
[30]              if (*navn)
[31]                  strcat(tmp, *navn);
[32]              if ((i = addstat(i, ssp, tmp, &navn)) = -1)
[33]              {
[34]                  if (strlen(RSiEMsg));
[35]                      fprintf(stderr, "%s", RSiEMsg);
[36]                  exit(63);
[37]              }
[38]              cxlink = RSiNextCx(rsh, cxh, cxlink, navn, desc);
[39]          }
[40]      }
[41]      return(i);
[42]  }
``` id the context's SiInstFreq is set to SiContInst or SiCfgInst since all other contexts would have been instantiated whenever the xmservd daemon was started.

TABLE 39

RSiInstantiate Function Call int RSiInstantiate(RSiHandle rhandle,
 cx_handle *context)

If successful, the function returns a zero value, otherwise it returns an error code as defined in SiError and an error text may be placed in the external character array RSiEMsg.

The arguments to the function are:

rhandle

Points to a structure of type RSiHandle, which was previously initialized by the RSiOpen function.

context

A handle of type cx_handle, which was previously returned by a successful RSiPathGetCx function call.

TABLE 40 shows how these three function calls are combined with RSiPathGetCx to make sure all subcontexts are accessed. The sample program's internal function addstat (Table 27) is used to add the statistics of Three RSi function calls were not used or mentioned above. One of those is described in a later section. The two others are described below.

The first is RSiDelSetStat (Table 41) whose purpose is to:

1. Validate that the StatSet identified by the second argument exists and contains the StatVals statistic identified by the third argument.
2. Delete the StatVals value from the StatSet so that future data_feed packets do not include the deleted statistic.

TABLE 41

RSiDetSetStat Function Call int RSiDelSetStat(RSiHandle rhandle,
 struct StatSet *ssp,
 struct StatVals *svp)

If successful, the function returns a zero value, otherwise it returns a non-zero value and an error text may be placed in the external character array RSiEMsg.

The arguments to the function are:

rhandle

A RSiHandle, which was previously initialized by the RSiOpen function.

ssp

A pointer to a structure type struct StatSet, which was previously returned by a successful RSiCreateStatSet function call.

svp

A handle of type struct StatVals as returned by a successful RSiPathAddSetStat function call.

The purpose of the RSiStatGetPath function call (Table 42) is to:

1. Validate that the StatVals statistic identified by the second argument does exist.
2. Return a pointer to a character array containing the full value path name of the statistic.

TABLE 42

RSiStatGetPath Function Call char *RSiStatGetPath(RSiHandle rhandle,
struct StatVals *svp)

If successful, the function returns a pointer to the path name, otherwise it returns NULL and an error text may be placed in the external character array RSiEMsg. The arguments to the function are:

rhandle

A RSiHandle, which was previously initialized by the RSiOpen function.

svp

A handle of type struct StatVals as returned by a successful RSiPathAddSetStat function call.

Sometimes it is desirable to design programs that can present the end user with a list of potential data supplier hosts rather than requiring the user to specify which host to monitor. The RSiInvite function call (Table 43) allows a user to create such programs.

The purpose of the function call is to broadcast are—you—there messages on the network to provoke xmservd daemons on remote hosts to respond.

TABLE 43

RSiInvite Function Call char **RSiInvite(int (*resy—callb)(),
int (*excp—callb)())

If successful, the function returns an array of character pointers, each of which contains a hostname of a host that responded to the invitation (the host ID of each responding host is included in that host's response to the are—you—there message). In addition, the external integer variable RSiInvTabActive contains the number of hostnames found. The returned pointer to an array of hostnames should not be freed by the function call. The calling program should not assume that the pointer returned by this function call remains valid after subsequent calls to RSiInvite. If not successful, an error text is placed in the external character array RSiEMsg, an error number is placed in RSiErrno, and the function returns NULL.

The arguments to the function are:

resy—callb

Either NULL or a pointer to a function that will process i—am—back packets as they are received from the xmservd daemons on remote hosts for the duration to the RSiInvite function call. When the callback function is invoked, it will be passed three arguments as described below.

If this argument is specified as NULL, a callback function internal to the RSiInvite function receives any i—am—back packets and uses them to build the table of hostnames the function returns.

excp—callb

NULL or a pointer to a function that will process except—rec packets as they are received from the xmservd daemons on remote hosts. If a NULL pointer is passed, the application will not receive except—rec messages. When this callback function is invoked, it will be passed three arguments as described below.

This argument preferably overrides the corresponding argument of any previous RSiInvite or RSiOpen call and may itself be overridden by subsequent executions of either in this way, the application can turn exception monitoring on and off. For an RSiOpen to override the exception processing specified by a previous open call, the connection should first be closed with the RSiClose call.

The resy—callb and excp—callb functions in the application are called with the following three arguments:

1. An RSiHandle. When a data—feed packet is received, the structure thus pointed to is guaranteed to represent the host sending the packet. The RSi handle thus pointed to is almost certain not to represent the host that sent the package. This argument should be ignored, and use only the second one: the pointer to the input buffer.
2. A pointer of type pack * to the input buffer containing the received packet. Always use this pointer rather than the pointer in the RSiHandle structure.
3. A pointer of type struct sockaddr—in * to the Internet address of the originating host.

The RSiInvite function uses one or more of the methods previously described to obtain the Internet addresses whereto an invitational are—you—there message can be sent.

If the RSiInvite function detects that the nameserver is inoperational or has abnormally long response time, it returns the Internet addresses of hosts rather than the hostnames. If the nameserver fails after the list of hosts is partly built, the same host may appear twice, once with its Internet address and once with its hostname.

The execution time of the RSiInvite function call depends primarily on the number of broadcast addresses placed in the /usr/lpp/xmservd/hosts file. Each such address will increase the execution time with roughly 50 milliseconds plus the time required to process the responses. The minimum execution time of the function call is roughly 1.5 seconds, during which time the application will get control if callback functions are specified and if packets arrive that are given to those callback functions.

Dynamic Data Supplier

Although the above description describes both the API's implementation as well as how to use the API, it still lacks a certain degree of flexibility. At some future date, it might be possible that other types of resource statistics (not yet known) might exist for future processes and/or applications. As the performance tool's interface to the xmservd daemon provides the basic framework for requesting and receiving data statistics for local and remote processes, it would be useful to further define an interface between the xmservd daemon an another application/process which has statistics that may be of interest to a user of the performance tool. For example, some future database or multimedia application program may define certain parameters or statistics that would be useful to monitor when trying to optimize the application program's execution on a data processing system. If these statistics could be supplied to the xmservd daemon in a definable fashion, the existing utility of the performance tool in conjunction with the xmservd could be used to extend the range of statistics to be captured, recorded, displayed, and played back to include those statistics for this yet to be developed application program.

FIG. 22 represents this interface 204 between a "Dynamic Data Supplier", (the application program providing new statistics to monitor) and the xmservd daemon.

The implementation of a DDS interface consists of two parts, a UDP-based protocol and a shared memory protocol. The UDP-based protocol is an extension of the UDP-based "xmquery" protocol, which was described above. The extension consists of a single packet type ("get_supply") used by each DDS to inform xmservd that statistics are available. The packet is used only once per DDS to initially inform xmservd that the DDS is active. The remaining handshake between the DDS and xmservd is done through the shared memory protocol. The "get_supply" packet is used by each Dynamic Data Supplier to inform the Data Supplier daemon that data statistics are available and to pass the name and ID key of the shared memory segment that it will use to communicate with the Data Supplier daemon.

Statistics are defined in the shared memory segment whose address is passed from a DDS to xmservd in the initial UDP packet. Xmservd uses this information to add the new statistics in one or more sub-trees under which the statistics are already known to xmservd. After initialization, statistics are collected by the DDS and placed in the shared memory area from where xmservd can extract data values as required to feed its data consumers (e.g. the performance tool).

The two parties sharing the memory (xmservd and the DDS) keep each other updated through a simple protocol based upon fields in the shared memory area. The types of handshaking that can take place include:

- xmservd tells the DDS that it (xmservd) intends to exit.
- xmservd detects that the shared memory segment is gone.
- the DDS tells xmservd that additional statistics have become available.
- the DDS tells xmservd that previously added statistics are no longer available.

The following describes in detail the above interface for extending the set of statistics available from the xmservd daemon on a host. A Dynamic Data Supplier (DDS) program which, when executed, contacts the xmservd daemon and exports its statistics. Any program that gets its statistics from this extended xmservd daemon can access the additional statistics provided by the DDS. DDS programs must execute on the same host as the one running the xmservd whose set of statistics is to be extended.

A Dynamic Data Supplier program is intended to extend the set of statistics that data consumer programs can be supplied with from the xmservd daemon of a host. A Dynamic Data Supplier can add statistics as permanent (non-volatile) or dynamic (volatile) contexts with subcontexts and statistics. To illustrate this concept, assume the xmservd daemon has a set of contexts and statistics as pictured in Table 44.

TABLE 44
Start Set of Statistics in xmservd

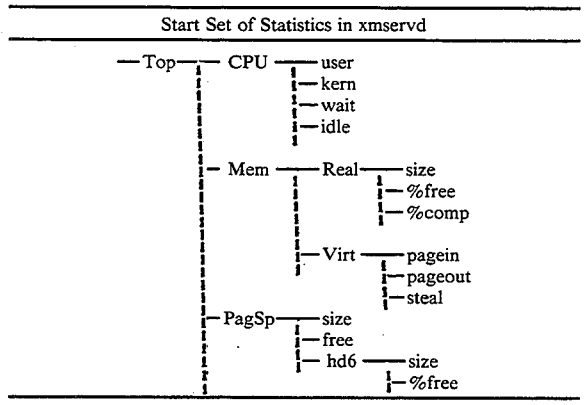

Now assume that access to other statistics is available and the statistics are to be added to the set. A Dynamic Data Supplier should be created. For example, a few statistics could be added at the top level. This could extend the tree structure of contexts and statistics as shown in Table 45.

TABLE 45
Extended Set of Statistics in xmservd

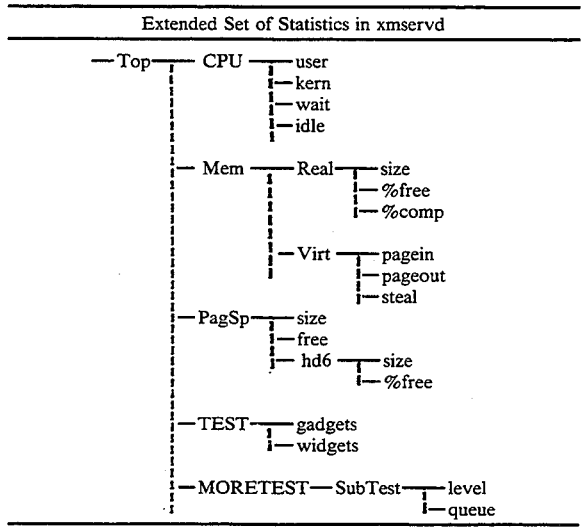

As can be seen, two contexts have been added at the top level, namely TEST and MORETEST. The first of these contexts has two statistics called gadgets and widgets. The second has no directly descendent statistics but has a subcontext called SubTest which in turn has two statistics: level and queue.

For this first scenario, assume that the added contexts and statistics are non-volatile and as such can be added as permanent statistics. This requires the use of only one library function and the following programming steps:

1. Declare data structures to describe statistics.

2. Declare data structures to describe contexts.
3. Declare other data areas as required.
4. Initialize the xmservd interface.
5. Initialize exception handling.
6. Initialize statistics fields.
7. Create main loop.

Statistics are described in a simple structure of type struct Stat. A table of statistics must be created for each of the contexts that are defined as having statistics. The definition of the statistics, gadgets and widgets would look as shown in Table 46.

TABLE 46

DDS — Definition for Two Statistics Values

```
static const struct Stat PUStats[] = {
{   "gadgets", "Fake counter value", 0, 100, SiCounter
    SiLong, NULL, SZ_OFF(dat, a, SiULong)},
{   "widgets", "Another fake counter value", 0, 100, SiCounter,
    SiLong, NULL, SZ_OFF(dat, b, SiULong)},
};
```

The fields in the structure are the following:

1. Short name of statistic, 32 bytes character data.
2. Description of statistic, 64 bytes character data.
3. Lower range for plotting, numeric, less than upper range.
4. Upper range for plotting, numeric, higher than lower range.
5. A symbolic constant defining the way data values should be interpreted. Currently, only the following are defined:
   SiCounter Value is incremented continuously. Normally, data consumers will show the delta (change) in the value between observations.
   SiQuantity Value represents a level, such as memory used or available disk space.
6. A symbolic constant describing the format of data as it must be delivered to the data consumers. The data format must be one of the types defined by the "enum" DataType in the include file Sdidef.h. Currently, only the types SiLong and SiFloat are valid. If any other type is specified, SiFloat is assumed.
7. This field provides compatibility with internal data tables. It should be specified as NULL.
8. The macro SZ_OFF takes three arguments as follows:
   a. Name of a structure containing the source data field for this statistics value.
   b. Name of the source data field for this statistics value in the structure named above.
   c. Data format of the source data field.

Since it is desired to actually add two sets of statistics at two different places in the context hierarchy, the second set should also be declared. Table 47 shows how that can be done.

TABLE 47

DDS — Defining Another Two Statistics Values

```
static CONST struct Stat FakeMemStats[] = {
{   "level", "Fake quantity value", 0, 100, SiQuantity,
    SiLong, NULL, SZ_OFF(dat, c, SiULong)},
{   "queue", "Another fake quantity value", 0, 100, SiQuantity,
    SiLong, NULL, SZ_OFF(dat, d, SiULong)},
};
```

After the statistics are declared, they should be linked to their parent contexts. This is also done by defining a table of data structures. A single table of structures is defined to hold all the contexts desired to define as permanent contexts. Each context requires one element of the type cx_create. To create the three added contexts, the contexts would be declared as shown in Table 48.

TABLE 48

DDS — Declaring Non-Volatile Contexts

```
static CONST cx_create cx_table[] = {
    {"TEST", "Bogus Context Number 1", sizeof(struct Context),
     "Top", PUStats, STAT_L(PUStats), NULL, 0, NULL,
     SiContInst},
    {"MORETEST", "Bogus Context Number 2", sizeof(struct
     Context), "Top", NULL, 0, NULL, 0, NULL,
     SiContInst},
    {"SubTest", "Bogus Context Number 3", sizeof(struct
     Context), "MORETEST", FakeMemStats,
     STAT_L(FakeMemStats), NULL, 0, NULL, SiNoInst},
};
```

Each context element should have the following fields:

1. Short name of context, 32 bytes character data.
2. Description of context, 64 bytes character data.
3. This field provides compatibility with internal data tables. It must be specified as sizeof(struct Context).
4. Short name of parent context, 32 bytes character data. If this context should be added at the top level, specify the name as Top, otherwise specify the short name of another context in this same table.
5. Pointer to the table of statistics for this context or NULL if none are defined.
6. Count of elements in the table of statistics for this context or zero if none are defined. If statistics are defined, use the macro STAT_L to get the number of table elements.
7. This field provides compatibility with internal data tables. It must be specified as NULL.
8. This field provides compatibility with internal data tables. It must be specified as zero.
9. This field provides compatibility with internal data tables. It must be specified as NULL.
10. A symbolic constant describing the type of instantiation available for this context. If the context being defined will never be extended by addition of subcontexts dynamically, specify the constant SiNoInst, otherwise use the constant SiContInst. The last of the three instantiation types has no meaning for &dds. statistics.

The Dynamic Data Supplier program must define its own data areas as required. Example structure and fields are shown in Table 49.

TABLE 49

Declaring Structures and Data Fields

```
struct dat
{
    u_long    a;
    u_long    b;
    u_long    c;
    u_long    d;
};
static int CxCount = CX_L(cx_table);   /* Count of
                                          contexts defined */
```

TABLE 49-continued

| Declaring Structures and Data Fields | | |
|---|---|---|
| static SdiShare *dataarea = NULL; | /* | Shared memory pointer */ |
| static struct dat *d = NULL; | /* | Pointer to stats data area */ |
| static struct timezone tzone; | | |

The first lines define the data structure where the raw statistics are calculated to present to xmservd. The data area should hold all the data fields referenced by non-volatile statistics.

Then a counter is defined, which uses a macro (CX_L) to initialize with the number of static contexts to be added. Finally, a pointer is defined that will be eventually initialized to point to the data area to be shared with the xmservd daemon.

As discussed above, the xmservd daemon and the DDS use shared memory to communicate between themselves. There are several important points to make regarding the shared memory area:

Shared Memory Structured Fields: The shared memory area is created by library functions and its control information and generated data structures should (with few exceptions) generally not be used or manipulated by the DDS program directly. The fields that should be used by the DDS program are:

SiShGoAway

This flag is set by xmservd when it terminates. Normally, when a DDS sees this flag, it should release its shared memory and then either exit or prepare itself for registering with xmservd when the daemon starts up again. Failure to free shared memory will render it impossible to register with a restarted xmservd.

SiShT

A time stamp which should be updated by the DDS program each time the shared data area is updated. The xmservd daemon checks this field to see when the DDS was last active. If more than 15 seconds elapse without the time stamp being updated, xmservd will assume the Dynamic Data Supplier has died, will the SiShGoAway flag and will release its access of the shared memory area.

SiShArea

The address of the data area in the shared memory segment. The DDS program must load a pointer with this field and use that pointer to access the shared memory data area.

Shared Memory Data Area: The shared memory data area is where the DDS is supposed to place its statistics values as they are calculated. The calculations could be done directly in the area allocated in shared memory or they may be done in local data fields with the result then moved to shared memory. One important thing is to be aware that the shared memory area is guaranteed to be large enough to contain the last of those fields in the data structure that are referenced in any one of the tables defining statistics.

Thus, if the structure data as defined in Table 49 had additional data fields, those would not be available in shared memory because no declared statistics reference them. Attempts to access such fields would cause segmentation faults.

Now that all required declarations are in place, the xmservd daemon needs to be registered. This is done through a single library function called SdiDInit. The function is defined as shown in Table 50. Its purpose is to:

1. Determine how large a shared memory area is required and create a shared memory segment of that size,
2. Move all static contexts and all referenced statistics to shared memory,
3. Contact the xmservd daemon and ask the daemon to add all the static contexts to its context tree.

TABLE 50

| SdiDinit Function Call |
|---|
| SdiShare * SdiDInit(cx_create *cxtab, |
| int cxcnt, |
| cx_create *ixtab, |
| int ixcnt, |
| char *name) |

If successful, the function returns the address of the shared memory control area. If an error occurs, an error text is placed in the external character array SdiEMsg and the function returns NULL.

The arguments to the function are:

cxtab
Pointer to the table of non-volatile contexts to add.
cxcnt
Count of elements in the table of non-volatile contexts. Use the macro CX_L to find this value.
ixtab
Pointer to the table of volatile contexts to add. If none are defined, specify NULL.
ixcnt
Count of elements in the table of volatile contexts. Use the macro CX_L to find this value. If none are defined, specify zero.
name
Specifies the file name to use when creating the shared memory segment. At execution time, the file should exist and be writeable by the process running the DDS for the library function call to succeed. If the file does not exist it is created. If the creation fails, the function returns an error.

For the purpose of example, the function would be invoked with the statements shown in Table 51.

TABLE 51

| Registering with xmservd |
|---|
| dataarea = SdiDInit(cx_table, CxCount, NULL, 0, "/mydir/mydds"); |
| if (!dataarea) |
| { |
|     fprintf ("%s", SdiEMsg); |
|     exit(−1); |
| } |
| d = (struct dat *)&dataarea—>SiShArea[0]; |

As a DDS uses shared memory to talk to xmservd, it is very important to make sure the shared memory area is released when a DDS program dies. The best way to assure this happens is to catch the signals that indicate that the DDS program dies. The same function used to process the signals can conveniently be used for normal program exit. This could be done as shown in Table 52.

TABLE 52

DDS — Exception Handling and Normal Termination
(C) Copyright IBM Corporation, unpublished, all rights reserved

```
void SdiStopMe()
{.
    if (dataarea)
        shmctl(dataarea—>SiShMemId, IPC_RMID, NULL);
    dataarea = NULL;
    exit(0);
} signal(SIGTERM, SdiStopMe);
signal(SIGSEGV, SdiStopMe);
```

The function SdiStopMe makes sure the shared memory area is freed and then exits. The two lines defining the signal handler should be placed around the place in the DDS program where the program registers with xmservd.

In most cases, statistics values are a combination of the types SiCounter and SiQuantity. Data consumers normally are interested in delta values for the former. First, take the first reading and initialize the statistics fields in shared memory. That way, even the first delta values read by a data consumer are likely to be valid.

Updating data fields always requires updating the time stamp so in this case, the lines used to give the initial field values could follow the scheme in Table 53.

TABLE 53

DDS — Initializing Data Values

```
gettimeofday(&dataarea—>SiShT, &tzone);
    d—>a = ...;
    d—>b = ...;
    d—>c = ...;
    d—>d = ...;
```

Note that in this example, we are presuming to be working directly in the shared memory data area.

The main loop is normally very simple and is conveniently made as a while loop. One of the conditions that should be included in the while loop is a test for the SiShGoAway flag. Others may represent alternative ways to terminate the program as required by the application. The example main loop in Table 54 only tests for the flag.

TABLE 54

DDS — The Dynamic Data Supplier's Main Loop

```
while(!dataarea—>SiShGoAway)
{
    usleep(499000);
    gettimeofday(&dataarea—>SiShT, &tzone);
    d—>a = ...;
    d—>b = ...;
    d—>c = ...;
    d—>d = ...;
}
SdiStopMe();
```

Although the main loop can be as simple as shown above, such simplicity may cause the DDS program to update the values in the shared memory area more often than required. In situations where the DDS has defined values but the xmservd daemon is not using any of the values, updating the data fields may be unnecessary.

Two fields allow for the addition of a little more finesse to the Dynamic Data Supplier program. Both fields are Shared Memory Structured Fields and can be accessed through the pointer returned by SdiDInit:

SiShInterval

An integer having the number of milliseconds between requests for data values from xmservd. Since different requestors of values may request with different intervals, this value reflects the smallest interval of those defined, e.g., the interval defined for the instrument that runs fastest.

SiShSubscrib

The number of data values currently being requested from xmservd.

Obviously, if SiShSubscrib is zero, nobody is requesting continuous supply of data values and the update frequency in the DDS can be reduced accordingly. It is recommended to not stop the updating of the data fields, but rather to reduce updates with intervals of five to ten seconds.

If SiShSubscrib is nonzero, somebody is requesting continuous supply of data values and the update frequency should be adjusted to match the request frequency as given in SiShInterval.

A main loop that uses these principles could look as shown in Table 55.

TABLE 55

DDS — The Dynamic Data Supplier Main Loop
(C) Copyright IBM Corporation, unpublished all rights reserved

```
while(!dataarea—>SiShGoAway)
{
    if (dataarea—>SiShSubscrib)
        usleep(dataarea—>SiShInterval * 1000);
    else
        sleep(5);
    gettimeofday(&dataarea—>SiShT, &tzone);
    d—>a = ...;
    d—>b = ...;
    d—>c = ...;
    d—>d = ...;
}
SdiStopMe();
```

The SiShSubscrib field normally holds a count of all Data Consumer programs currently subscribing to data values in the shared memory area. However, to allow a program that acts both as a Data Consumer and a Data Supplier, the port number of the port assigned can be moved to the Data Consumer side of the program to the field SiShPortNo which is another shared memory structured field. A Data Consumer/Data Supplier program could use a statement like the following to insert the port number:

dataarea—>SiShPortNo=rsh—>portno;

where rsh is the RSiHandle for the host. The field portno in the RSiHandle structure is updated by the library function RSiOpen. When the port number is inserted in the shared memory area, the xmservd will not count subscriptions for data values in the shared memory area that originate at that port number on the local host.

The above program segments are combined into a working DDS program as shown in FIGS. 27A–27B.

Volatile Statistics

In the previous sections, a Dynamic Data Supplier program was created to extend the set of statistics with permanent contexts and statistics. Next, expanding the sample program previously described to allow contexts and statistics to be added and deleted dynamically.

There are quite a few situations where it is natural to add and delete statistics as the environment changes. For example, assume the DDS is concerned with monitoring of the response times between pairs of network hosts. On even a small network, it would be quite excessive to define all possible host pairs and keep track of them all. At any point in time, a limited number of sessions are active, but this number changes as do the host pairs involved. If this volatility is reflected in the statistics presented, the ability to add and delete statistics dynamically is required.

To illustrate the use of the two library functions used to add and delete contexts dynamically, the context hierarchy shown in Table 45 is extended to look like the hierarchy shown in Table 56.

TABLE 56

Dynamic Extention of Statistics in xmservd

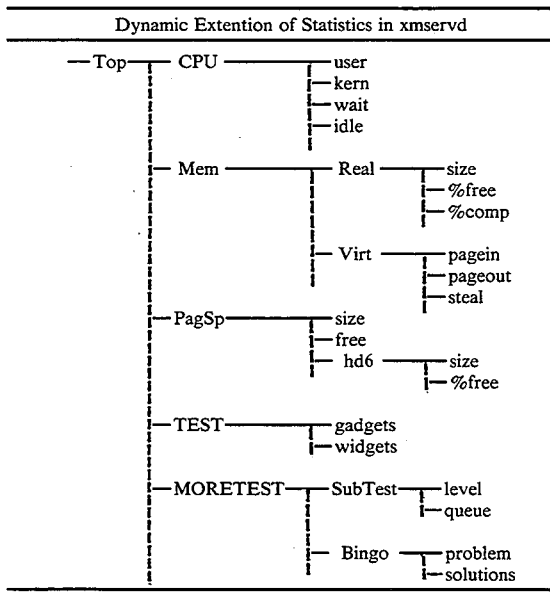

As can be seen, a context called Bingo is being added to the hierarchy with the previously added context MORETEST as parent of the new context. The context to be added will have two statistics values, namely problems and solutions. The context are to be added and deleted dynamically, as determined by the time of day.

The following additional steps should be made to the previous example program:.

1. Declare data structures to describe dynamic statistics.
2. Declare data structures to describe dynamic context.
3. Declare other data areas as required.
4. Modify registration with xmservd performance tool.
5. Modify main loop to add and delete dynamic context.

Statistics are defined almost the same way whether they are to be added permanently or dynamically. It is still true that all statistics for a context must be defined in one array. That array may be referenced by more contexts, if appropriate, but most likely is not. The only real difference is that each set of statistics meant to be added dynamically must reference a separate data structure as source of its data fields. This is quite different from permanent statistics where all statistics source fields must reside in a common structure.

Obviously, there is a reason for the need for a dynamic data structure. Static data values occur only once. They all reside in one contiguous area in shared memory. Dynamic data values, on the contrary, may exist in multiple instances and may come and go. They are allocated dynamically in shared memory when they are required and when the values are deleted, their shared memory areas are returned to the free list.

For the example in Table 56, the definition of statistics to add the "problems" and "solutions" values is shown in Table 57.

TABLE 57

DDS — Definitions for Dynamic Statistics Values

```
static CONST struct Stat InstStats[] = {
  { "problems", "Fake counter value", 0, 100, SiCounter,
    SiLong, NULL, SZ_OFF(inst, a, SiFloat)},
  { "solutions", "Another fake counter value", 0, 100, SiCounter,
    SiLong, NULL, SZ_OFF(inst, b, SiLong)},
};
```

Notice that this time the structure "dat" used previously (and defined in Table 49) is not referenced, but a different structure called "inst", yet to be defined.

In this example, only a single context is added. Many more could be added, but for each context, which the DDS program may want to add, one element must be defined in a table of contexts. No context can be dynamically added unless it was defined in a table and passed to the SdiDInit function when the DDS registered with xmservd. The table has exactly the same format as the table of permanent contexts, but is not the same table. Table 58 shows how to define the single context.

TABLE 58

DDS — Definitions for Dynamic Context

```
static CONST cx_create inst_table[] = {
  {"INST1", "Instantiable Context Number 1", sizeof(struct
   Context), "MORETEST", InstStats, STAT_L(InstStats),
   NULL, 0, NULL, SiNoInst},
};
```

The structure referenced by the declared statistics and a pointer to be used for accessing the allocated shared data area should be defined. For convenience, an integer is also defined to hold the number of dynamic contexts:

TABLE 59

DDS — Other Data Areas for Dynamic Extension

```
struct inst
{
    float     a;
    u_long    b;
};
int   InstCount = CX_L(inst_table);  /* Count of
                                         contexts defined */
struct inst   *pt1 = NULL;           /* Pointer to stats
                                         data area    */
```

Registration with the xmservd daemon is almost unchanged. The library function should know where the dynamic context table is and how many elements it has. This is shown in Table 60.

TABLE 60

DDS — Registering with xmservd

```
dataarea = SdiDInit(cx_table, CxCount, inst_table, InstCount,
"/mydir/mydds");
if (!dataarea)
{
    fprintf("%s", SdiEMsg);
    exit(-1);
}
d = (struct dat *)&dataarea—>SiShArea[0];
```

Table 61 shows the modified main loop. The loop has been extended with three pieces of code. The first one uses a library function SdiSAddCx to add the context. The second code segment uses SdiDDelCx to delete the context again, and the third updates the values in the shared data area whenever the context and its statistics are active.

TABLE 61

DDS — The Modified Dynamic Data Supplier Main Loop
(C) Copyright IBM Corporation, unpublished, all rights reserved

```
while(!dataarea—>SiShGoAway) {
    if (dataarea—>SiShSubscrib)
        usleep(dataarea—>SiShInterval * 1000);
    else
        sleep(5);
    gettimeofday(&dataarea—>SiShT, &tzone);
    d—>a = ... ;
    d—>b = ... ;
    d—>c = ... ;
    d—>d = ... ;
    if (((dataarea—>SiShT.tv_sec % 59) = 0) && (!pt1))
    {
        if (!(pt1 = (struct inst *)SdiDAddCx(0, "MORETEST",
                        "Bingo", "Dynamically added")))
            fprintf(stderr, "Add failed: \ "%s \" \ n",
                    SdiEMsg);
    }
    if (((dataarea—>SiShT.tv_sec % 120) = 0) && (pt1))
    {
        if (i = SdiDDelCx((char *)pt1))
            fprintf(stderr, "Delete failed: \ "%s \" \ n",
                    SdiEMsg);
        else
            pt1 = NULL;
    }
    if (pt1)
    {
        pt1—>a = ... ;
        pt1—>b = ... ;
    }
}  SdiStopMe()
```

The library function called SdiDaddCx is defined as shown in Table 62. Its purpose is to:

1. Use the shared memory area to inform xmservd that a context is available to be added to the context hierarchy,
2. move a copy of the context to shared memory,
3. allocate memory for the data area.

TABLE 62

DDS — SDiDAddCx Function Call

```
char * SdiDAddCx(ushort ix,
                 char *parent,
                 char *name,
                 char *descr)
```

If successful, the function returns the address of the shared memory area. If an error occurs, an error text is placed in the external character array SdiEMsg and the function returns NULL.

The arguments to the function are:

ix

The element number of the context to be added in the table of dynamic contexts. No context is added if the table of dynamic contexts were not defined in the SdiDInit function call. The first element of the table is element number zero.

parent

The short name of a context that is to be the parent context of the context to be added. The name should be either "Top" or the short name of an existing context in the table of static contexts (Table 48).

name

The short name to be given to the context to be added. Note that this name must be unique within the parent context. If the same context is to be added multiple times under the same parent, change the name for each instantiation.

descr

The description of the context to add as it will be presented to data consumers such as xmperf.

The library function SdiDDelCx is defined as shown in Table 63. Its purpose is:

1. If the xmservd daemon has not detected that the context to delete was previously added dynamically, remove the context from the "to-be-added" list and return the allocated shared memory to the free list, otherwise;
2. Indicate to the xmservd daemon that a context and its associated statistics values must be removed from the context hierarchy and that any allocated shared memory must be returned to the free list.

TABLE 63

DDS — SdiDDelCx Function Call

```
int SdiDDelCx(char *area)
```

If successful, the function returns zero. If an error occurs, an error text is placed in the external character array SdiEMsg and the function returns a non-zero value.

The argument to the function is:

area

The address of the previously allocated shared memory data area as returned by an SdiDAddCx function call.

Recognizing Volatile Extensions

When the Dynamic Data Supplier program adds or deletes volatile extensions, this is indicated to xmservd through fields in the shared memory area. No UDP packets are generated by the library functions. The xmservd daemon does not become aware of the DDS changes until some event prompts it to look in the shared memory area.

This approach was chosen because it keeps the updating of the context structure to a minimum. The changes are implemented if somebody needs them. The following is a list of events that will cause xmservd to check the shared memory area for changes to volatile extensions:

1. Whenever the RSiPathGetCx function is used on any of the contexts defined by the DDS. That is, whenever a program attempts to find a context pointer from a value path name. This function is normally required for any traversal of the context hierarchy.

2. Whenever the RSiFirstCx function is used on any of the contexts defined by the DDS. That is, whenever a program starts traversing the subcontexts of a context in the DDS.
3. Whenever the RSiFirstStat function is used on any of the contexts defined by the DDS. That is, whenever a program starts traversing the statistics of a context in the DDS.
4. Whenever the RSiInstantiate function is used on any of the contexts defined by the DDS. That is, whenever a program explicitly asks for instantiation of any of the contexts defined by the Dynamic Data Supplier program.

ANNOTATION FEATURE IMPLEMENTATION

This section describes an extension of the record/playback mechanism of the performance tool which permits the marking and annotation of recorded performance data. This facility allows the user to scientifically catalog and document program "pathologies" and the context in which they were recorded, much as a field scientist would gather, mark, and annotate field samples of specimens collected.

Annotated recordings can be useful in a variety of ways, these include:

1. Collection of performance data in the field, which can be transmitted to an expert at a another site for analysis.
2. Construction of a casebook of prototypical examples, to be used for comparison and diagnosis of performance problems.
3. Generation of educational examples to be used in conjunction with performance analysis classes.

The marking and annotation facility involves extensions to the following subsystems previously described and depicted in FIG. 1:

1. Recording Subsystem to permit recording of marker tokens and annotations
2. Playback Subsystem to permit identifying marker tokens and retrieving annotations
3. Display Subsystem to permit display of marker tokens and annotations
4. GUI to support insertion of marker tokens, the creation/editing/viewing of annotation records, processing of marker tokens during playback, and the addition of multimedia inputs (audio/visual-graphics and image) and outputs for annotation.

The marking and annotation facility satisfies the following requirements:

1. Since events happen quickly on computer systems, the user should be able to mark events quickly and accurately, in real time.
2. To permit the capture of all relevant information, it is necessary to be able to attach possibly lengthy annotations to event marks and entire recordings.
3. The creation and editing of annotation records should be possible at any time. This would permit the "quick" marking of a short sequence of events, and subsequent lengthy annotation of these events.
4. Event marks (marker tokens) should be easily visible during playback, but should be compact, so as not to obscure graphs.
5. Annotation records should be displayed only when the user wishes to view them. This might be when editing an annotation record or when stopped at a mark during playback.
6. Marking and annotation of events should be possible during both record and playback operations.
7. During playback, a user should be able to scan to a specific event mark or to the next mark.

To permit the accurate marking of events, in real time, marking should be a quick, one-step operation. This can be accomplished as follows:

1. The user begins recording an instrument or console in the normal way.
2. From the instrument or console recording submenu, the user selects the Marking On button. This puts the selected instruments in a marking mode, in which mouse-clicks on the instrument are interpreted as requests to insert marker tokens. This operation is only permitted for instruments which are being recorded.
3. Whenever the user clicks the mouse on an instrument which is in the marking mode, a marker token is created by the performance tool. This is represented as an arrow-head and a label, which are displayed on the specified instrument, at the time associated with the mouse-click. The label is a short machine-generated unique label (a two-digit symbol should typically be sufficient). The marker token moves with the time graph. The user can provide annotation while the graph is recording or at a later time, as the annotation is maintained in a separate file to which this token has a pointer.
4. The user can generate a sequence of marker tokens by repeatedly clicking the mouse button with the mouse pointer in the appropriate instrument.
5. The user selects the Marking Off button to exit marking mode.

Annotation of existing marks is possible at any time during recording. It is accomplished as follows:

1. The uses selects the Annotate button from the instrument or console recording submenus.
2. The performance tool then presents the user with a time-sorted selection list of marker tokens which exist in the current recording. Each entry in the list consists of the mark's time, the label, and the ID of the instrument in which the mark was inserted. The first entry in the list should be the annotation for the overall recording.
3. When the user selects an entry from the list, the performance tool displays a dialog for editing an annotation record associated with the marker token, using Motif conventions. This dialog contains the following fields:
    a) The label—this is an editable field, and editing this field changes the label which is displayed on the instrument.
    b) The time—this is not an editable field during recording.
    c) A scrollable text-entry field in which the user can enter any desired textual information.

4. The user can also elect to delete specific marks at this time (this is another menu button).
5. When the user ends recording for a console, in the normal way, he is asked if he would like to add any annotations. If so, he is permitted to annotate the recording until he ends the recording again. During this period no recording is taking place, but the recording file is still open.

Since there is no real-time marking problem during playback, marking and annotation during playback can be done at the same time. This is accomplished as follows:

1. The user stops the playback at the desired time.
2. The user can then add a mark by selecting the instrument's Mark menu button.
3. When the user inserts a mark, the performance tool immediately displays the annotation record editing dialog, as during recording.
4. The dialog is identical to that displayed during recording but in this case, it is possible to edit the time field, and thus move the mark to a different time in the recording. After editing the time field, the displayed values for the statistics automatically change accordingly.
5. The user can edit the text field of the annotation record in the same way as in record.
6. The user can also edit/view the annotation for existing marks or delete them by selecting the appropriate buttons, when the recording is stopped at the time of the mark.
7. The user can seek to existing marks by selecting them from a list, or seeking to the next/previous mark.
8. For state graphs, the marks should be visible for a short time (e.g. 2 seconds), when the recording is played back at actual speed. As an alternate embodiment, the mark can be dimmed at times in this interval other than the mark's exact time.

To facilitate the quick locating and movement of marker tokens during playback, it is best to keep a "mark table" (summary of marker token records) in memory during playback and recording, and to store it at the end of the file when the file is written.

Figure 28A:
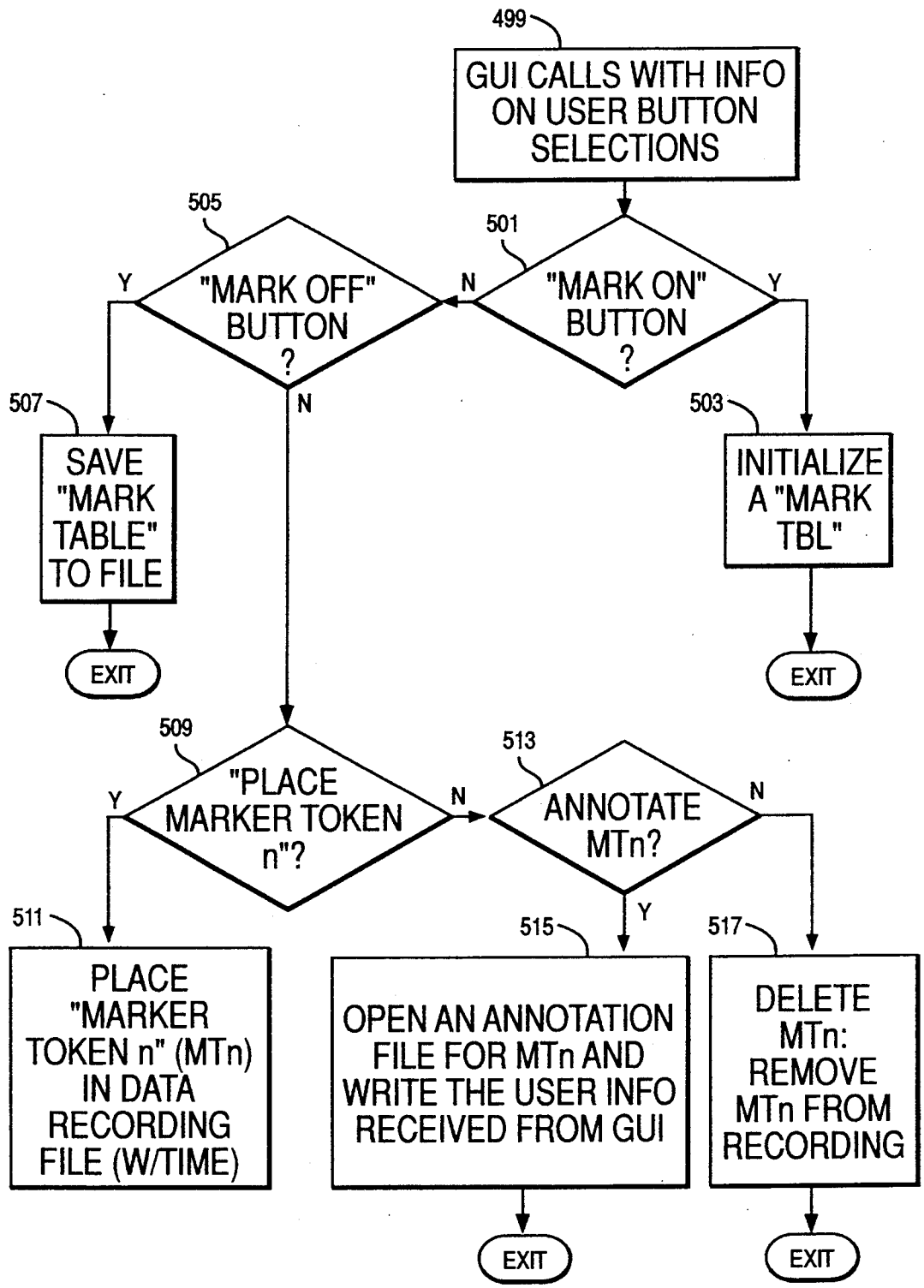
FIGS. 28a–28b are flow diagrams of the internal operation for annotation and marking of data.

Reference is now made to FIG. 28a, where the internal operations of the recording subsystem to provide annotation support is shown. When a GUI message is received by the recording subsystem having one of the annotation buttons selected at 499, a check is made to see if the mark button was selected by an operator at 501. If so, a mark table is initialized at 503. If not, a check is made at 505 to determine if the user selected to disable previous marking by selecting a "mark off" selection. If so, the mark table is complete, and saved at 507. If not, a check is made at 509 to determine if the user selected to place a marker token n, n being the next successive integer, on the data being captured. If so, a marker token n is placed in the data recording file 100 at 511. If not, a check is made at 513 to determine if the user has selected to annotate either the current or an otherwise existing marker token n (MTn). If so, an annotation file corresponding to this MTN is opened at 515. User annotation information supplied by the user and passed via the GUI is written to this annotation file at 515. If not, it is assumed (since this is the only other annotation button choice) that the user desires to delete a marker token MTn and the selected MTn is deleted at 517.

Figure 28B:
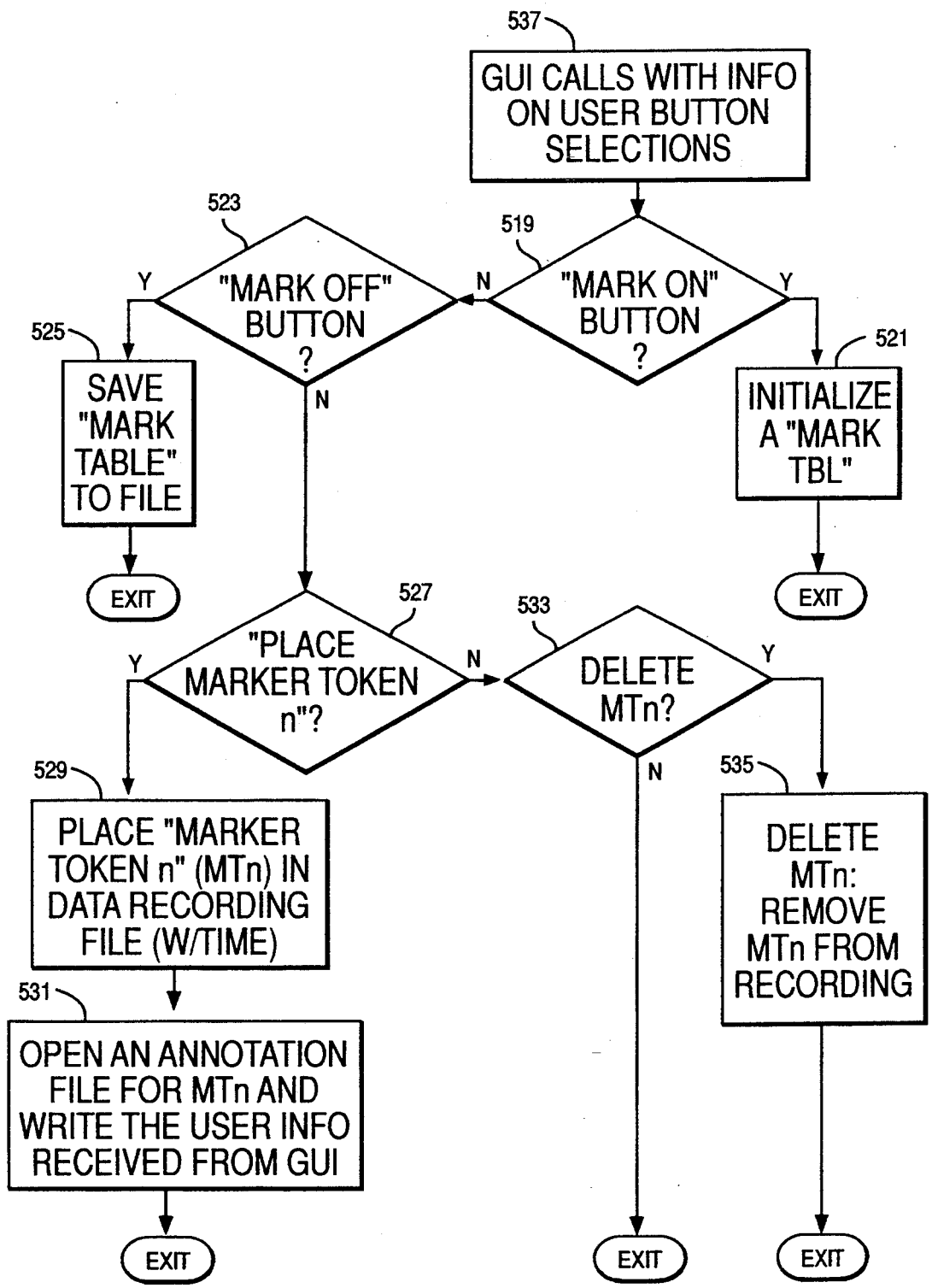

FIG. 28b is the flow diagram for a portion of the playback subsystem when a GUI message is received at 537 having one of the annotation button selections active. A check is made at 519 to see if the, mark button was selected by an operator. If so, a mark table is initialized at 521. If not, a check is made at 523 to determine if the user selected to disable previous marking by selecting a mark off selection. If so, the mark table is complete and saved at 525. If not, a check is made at 527 to determine if the user selected to place a marker token n on the data being captured. If so, a marker token n is placed in the data recording file 100 at 529. Since there is no real-time marking problem during playback, marking and annotation during playback can be done at the same time. Thus, the annotation file for MTn is opened for writing annotation information by the user at 531. If the user did not select to place a marker token n, a check is made at 533 to determine if the user selected to delete a marker token MTn. If so, the selected MTn is deleted at 535. If not, the routine returns.

Figure 32:
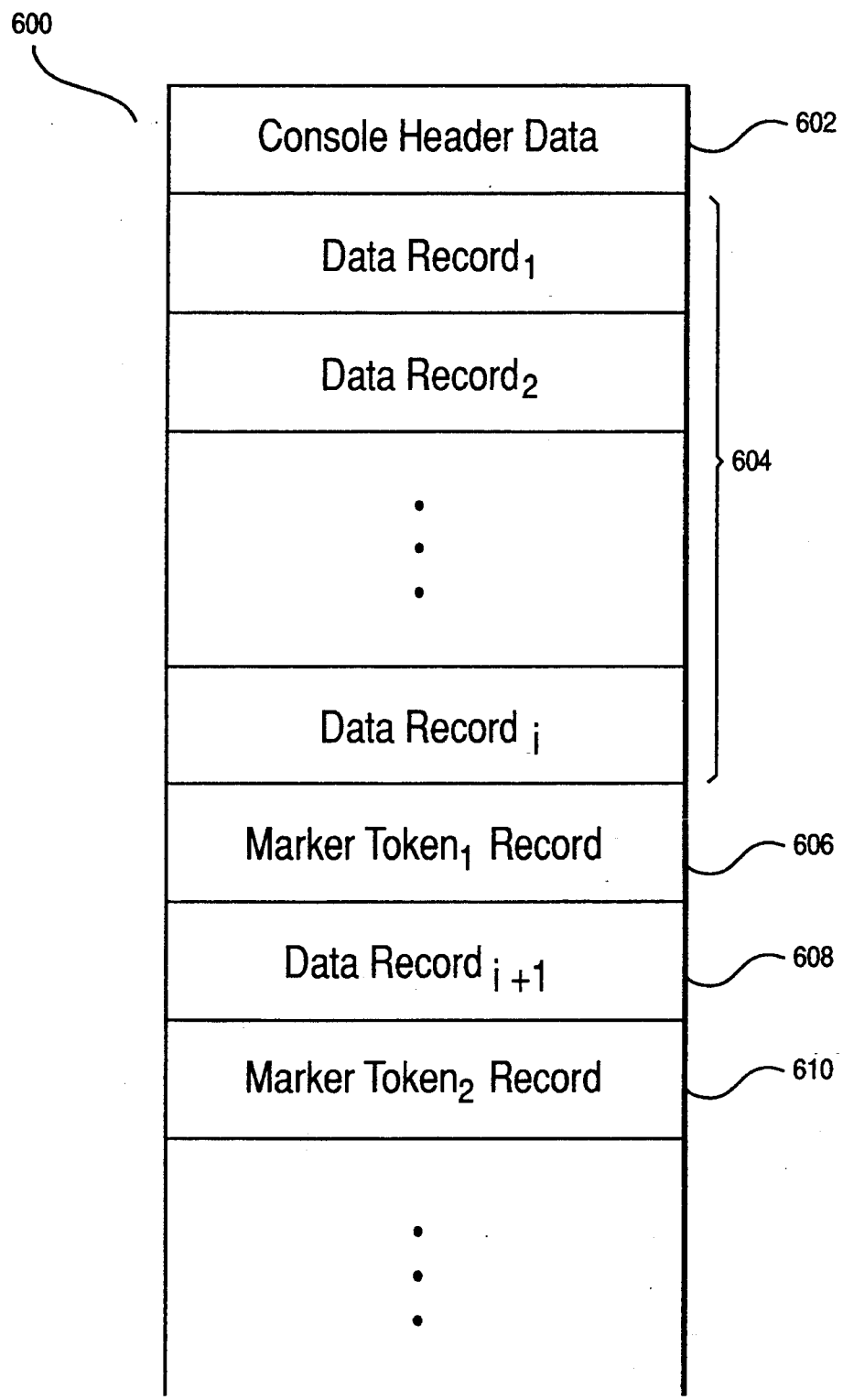
FIG. 32 depicts a data recording file having marker token for supporting annotations.

A data recording 600 having a marker token record is shown in FIG. 32. The data recording to be saved in recording file 100 is initiated with console header data 602. Data records 1-i are shown to have been captured at 604. A user selected to annotate the recorded data after record i 604, so a marker token 1 record 606 is recorded after the ith data record. The data continues to be recorded, from i+1 onward at 608, until another annotation is requested from a user. A second marker token 2 record is then saved at 610. In this manner, markers can be quickly placed in the recorded data stream without disrupting the data recording of real-time data for subsequent annotation by a user.

The marker token record (606 and 610) contains the following fields:

- marker ID
  an integer value from 0 to n
- a label
  a text character string that can be edited by a user.
- a timestamp
  the system time when the marker was placed
- an annotation file name

PATHOLOGY LIBRARY AND SEARCH FUNCTIONS

The science of Computer System performance monitoring and tuning is much like any other scientific field in that it depends on:

1. observations and analysis of normal and abnormal phenomenon,
2. experiments to validate hypotheses & theorems, and
3. procedures to consistently correct anomalies or undesirable effects.

An analogy can be made between computer performance monitoring, analysis, and tuning operations and observations, diagnosis, and treatment of illnesses and diseases known from the medical professions. It is in that context that a graphical computer system performance pathology library is a key part of the process to gather information on system performance pathologies, or "diseases", identify their operational characteristics, name them and store them in data repositories that can be accessed by the community of "computer performance physicians." Following this "scientific methodology", many tools, models, theories and practices can be utilized from the medical and biological fields. Pathology is known to mean something abnormal, or a deviation from an assumed normal state of something.

Once constructed, the purpose of a performance pathology library is to provide wide and easy access to the body of knowledge of computer and network performance problems and solutions. This knowledge can then become the basis for advancing the state of the art in developing intelligent machines that can know when they are in a "poor performance" mode, take corrective action, and monitor the corresponding results in a closed feedback loop.

The following discussion assumes the existence of a performance tool as described above to observe, record, annotate, and playback some record of system performance. The record, annotate, and playback facilities allow for textual, graphical, or multi-media (including voice and image) data records and are stored on computer accessible media. The recordings can be n-dimensional (e.g. 2D, 3D, over time, with other attributes such as color, presentation style, or annotations that carries additional information) and there is a high fidelity playback mechanism that preserves the context of all dimensions. The context is maintained in that each recording has header information stored with the recording that preserves the n-dimensional attributes of the recording, such as 2D or 3D data over time, colors, presentation styles, recording frequency, or audio/textual annotation. Changes made to these attributes are also incorporated in the recording file using the data structures previously described for the recording header records with appropriate extensions made for the additional features as appropriate. Users of the library may require many organized views of the recordings so that they can access the data by many different search categories.

Figure 29:
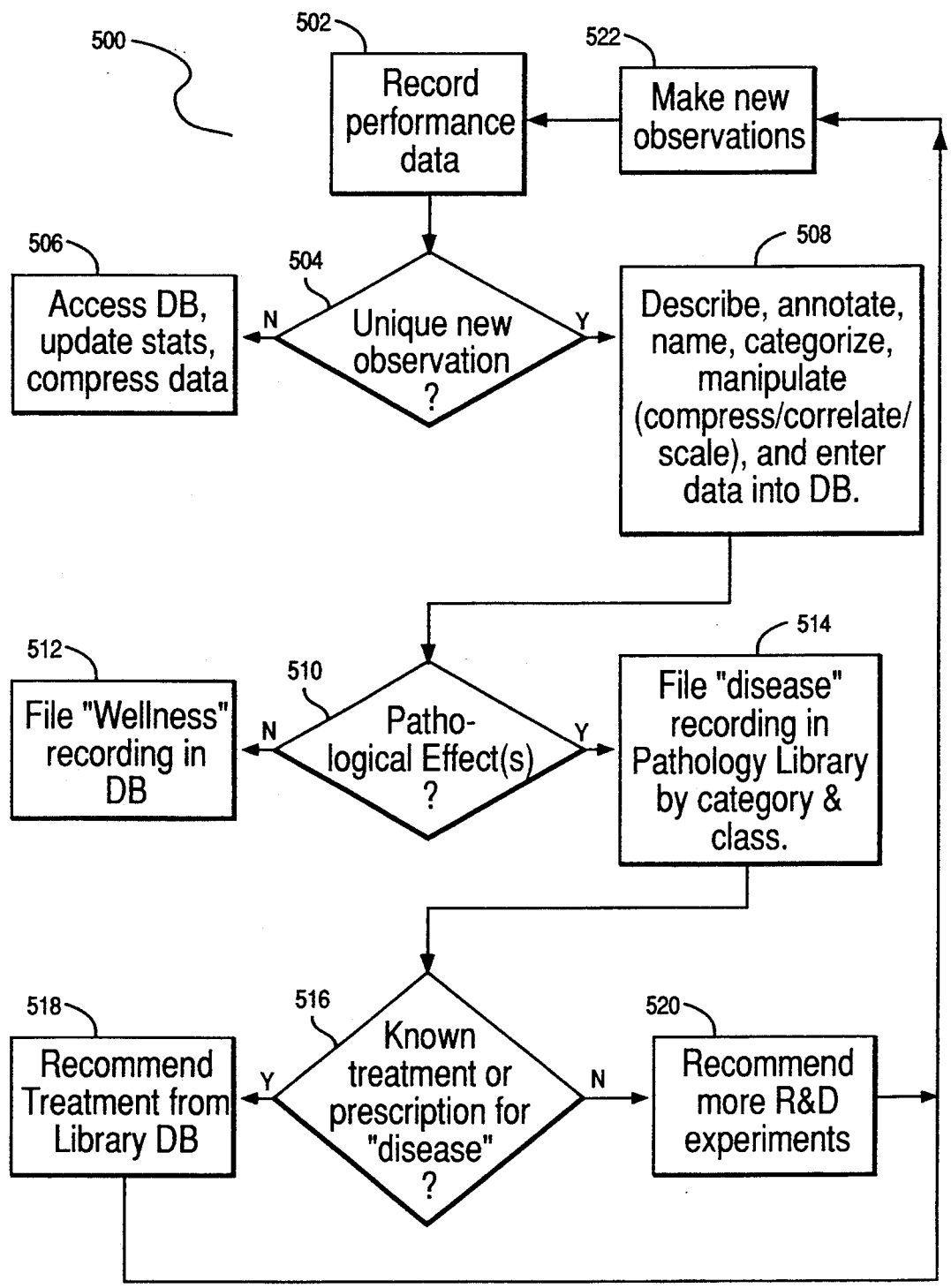
FIG. 29 is a flow diagram of the internal operation for a pathology library system.

This environment is conveniently provided by the recording/playback facilities described above with the enhancement provided through the annotation facility. The flow diagram in FIG. 29 portrays a general procedure 500 for establishing and using a system performance pathology library to help identify, diagnoses, and treat network and computer system performance problems.

A pathology library can have several scopes: large central library, satellite libraries, and special collection private libraries. "Librarians" for the central library are be responsible for gathering the largest sets of recordings, diagnosis, and treatments known to the user community in a central repository. They are be responsible for keeping up to date on the latest knowledge pool and archiving out of date materials. Librarians have reference access to satellite libraries and "private collections" when authorized. Satellite libraries contain general references and topics of interest to the local user community. Private collections are kept and maintained at the discretion of the private user.

The first phase of creating the library is to gather performance recordings, analysis, and "treatment" data at 502. Using the prerequisite recording/playback tools, performance "scientists" would go about to various configurations of their systems and make recordings of raw performance data e.g., CPU, Memory, Disk, Network, etc. utilization. Recordings are made of pathological cases that were artificially constructed "in vitro" experiments or live "in vivo" field observations of performance problems. During this first phase 502, almost all the recordings will be new observations. As the recording data base (DB) grows, additional observations that can be grouped with known pathologies should be saved in a compressed format so that statistical profiles can be generated from the captured data at 506. Unique new observations are processed in the second phase 504.

The second phase of library creation is the systematic description, annotation, analysis, categorizing, naming, and manipulating of the recording data before entering them into the library at 508. Two major categories are the "wellness" DB and the "diseases" DB. This second phase sorts the recordings into these two major categories at 510 by detecting and associating pathological effects to each recording. For example, a recording may show a "runaway" process running at 100% CPU utilization when it should be idling. Or a "thrashing" recording may show excessive disk paging for a process that has large resident set memory requirements in a memory constrained system. The key characteristic factors in these scenarios would be described, annotated on the recording, named, categorized, and possibly filtered compressed, scaled, correlated to other known phenomenon before placed in the "wellness" 512 or "disease" 514 DB.

The third phase 516 of library creation is the collection of known treatments for identified "diseases". Many diseases have well known treatments, e.g., "kill", or cancel/stop, a runaway process, add a faster processor if the CPU is overloaded, add more memory if the system is always thrashing, defragment disks that have become highly fragmented, increase the number and sizes of buffers when bottlenecks decreases data throughput). This phase 518 includes the correlation and linking of diseases to treatments. For unknown treatments, further study and analysis is recommended at 520 and new observations are made at 522.

After a pathology library has been established, it needs an efficient access mechanism to be useful for library users. Raw performance recordings by themselves have limited usage and only for specialized group of people. The main search mechanism is a conventional computer based query data base commonly known in the art, such as the Oracle Relational Data Base Management System (RDBMS), described in "Oracle for IBM RISC System/6000 Installation and User's Guide", ver 6.0, part number 5687-v6.0.31, dated 1991 and hereby incorporated by reference as background material. The database has all the key information on each recording. Recordings themselves may still have the markings and annotations of the original observer, but the salient characteristics of the recordings need to be part of the search data base.

Users are able to search the recording index:

- by category/class of pathology:
  - CPU
  - memory
  - disk
  - paging
  - network
  - character I/O
- by "name" of known "diseases":
  - CPU overload
  - memory leaks
  - disk fragmentation

- thrashing
- network beaconing
- excessive error retries
- excessive path lengths
- unbalanced resource utilization
- fork loops
- by symptoms:
  - poor keyboard response
  - low throughput w slow display update
  - I/O bound
- and by "recording pattern":
  - graphical or algorithmic patterns that correspond to known events).

After identifying the desired recordings, the user can easily access the recordings for playback, examination and analysis of the data.

As "cures" are found for these performance "diseases", they are also stored in the database, and linked to the corresponding disease(s). A recording of the new "healthy" response is also stored so a user can see what the system should look like after application of the "cure". As observations become more precise, automatic data filters can be used to automatically correlate and cross correlate data patterns to help automate the data analysis process. The data filter takes specific system performance data at each sample point and runs it through a correlation procedure to see if the data values can be correlated to some known pathological pattern. The filtering process may need to sample the data over time to match a data trend in addition to individual sampled values. The filtering process includes combinations of arithmetic and boolean operators on the data variables. The data filter may generate a value that sets off an alarm or some other user specified process. For example, a data filter may set an alarm when paging space on the host machine is less than 10 percent free or there is less than 100 pages of free paging space. The filter procedure for this scenario could be expressed in the following manner:

$$\text{alarm} = (\text{PagSp \% free} < 10) \mid\mid (\text{PagSp\_free} < 100)$$

The filters can also be wired into a feedback system that automatically tunes for optimal system performance under a wide variety of loads. The output of a data filter can be used to detect out of specification performance and feed that data back into a performance tuning system component to modify and improve the system performance. An example of this feedback system would be for a data filter to monitor and detect an overrun of a communication buffer, and to use that data to increase the size of the buffer to meet the new peak demands of the system, as described below.

DATA REDUCTION AND ALARMS

An additional tool is provided to allow further flexibility in extracting desired statistics and initiating actions, e.g., commands when certain conditions are met. The following describes a special utility that allows a user to define new statistics from existing ones by data reduction and to define alarms that are triggered by user-defined conditions and which may execute any desired command.

Figure 30:
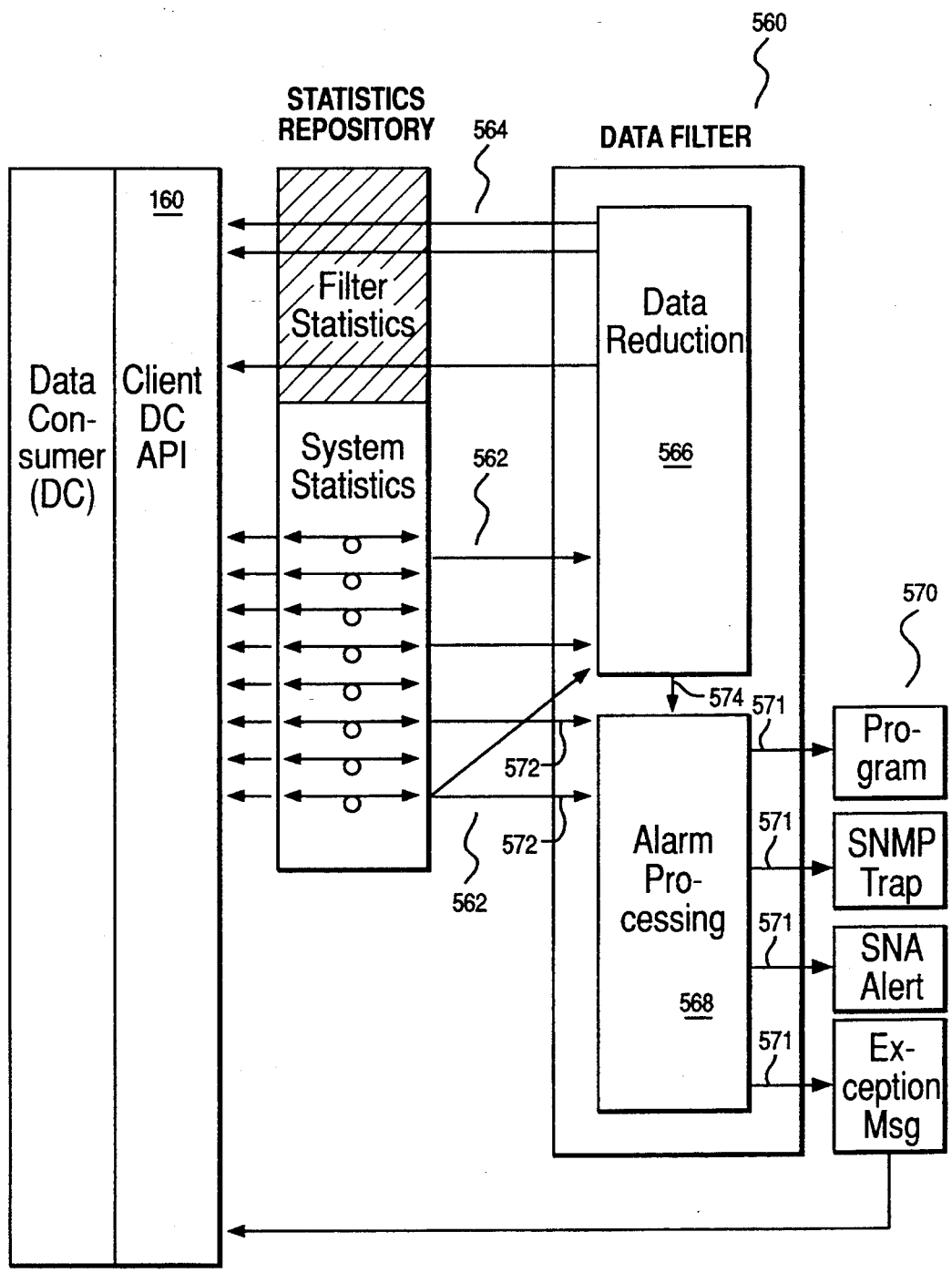
FIG. 30 is a block diagram of the filtering and alarm capabilities of the performance tool.

The implementation is a utility called filtd 560, as shown in FIG. 30. It is using the Application Programming Interfaces 160 and 204 previously described and acts as both a Dynamic Data Supplier and a Data Consumer. The utility reads statistics from the xmservd daemon on the local system at 562 and defines new statistics back to xmservd at 564. The filtd utility also allows a user to define conditions at 568 to trigger the execution of a command 570. Conditions may depend on raw statistics 572 from xmservd, as well as new statistics 574 defined by the data reduction part 566 of the utility.

The statistics being filtered and alarmed may be normal system statistics. However, these statistics may also be statistics defined by an application, or user-generated, program running on a particular machine, using the xmservd to DDS interface previously described. Thus, an application program can easily be added to an existing filtering and alarm system in the future, even though its particular statistics to be monitored are currently unknown to the filtering and alarm utility. The application program would merely modify the configuration file (defined below) to add its own filtering and alarm conditions for its own application statistics and/or system statistics.

The filtd utility is designed to run as a daemon. It takes three command line arguments, all of which are optional, and shown in Table 64.

TABLE 64

| Command Line Arguments for filtd |
| --- |
| filtd [-f config_file] [-l log_file] [-p trace_level] |

- −f Overrides the default configuration file name. If this option is not given, the file name is assumed to be /usr/lpp/xmservd/filter.cf. The configuration file is where filtd is told what data reduction and alarm definitions are,desired.
- −l (Lower case L) overrides the name of the log file used by the program. The default name is /usr/lpp/xmservd/filter.log, which is taken as meaning that logging will alternate between the files /usr/lpp/xmservd/filter.log1 and /usr/lpp/xmservd/filter.log2. Any file name specified is treated the same way.
- −p Specifies the level of detail written to the log file. The trace level must be between 1 and 9. The higher the trace level, the more is written to the log file. If this option is not specified, the trace level is set to zero.

Figure 31:
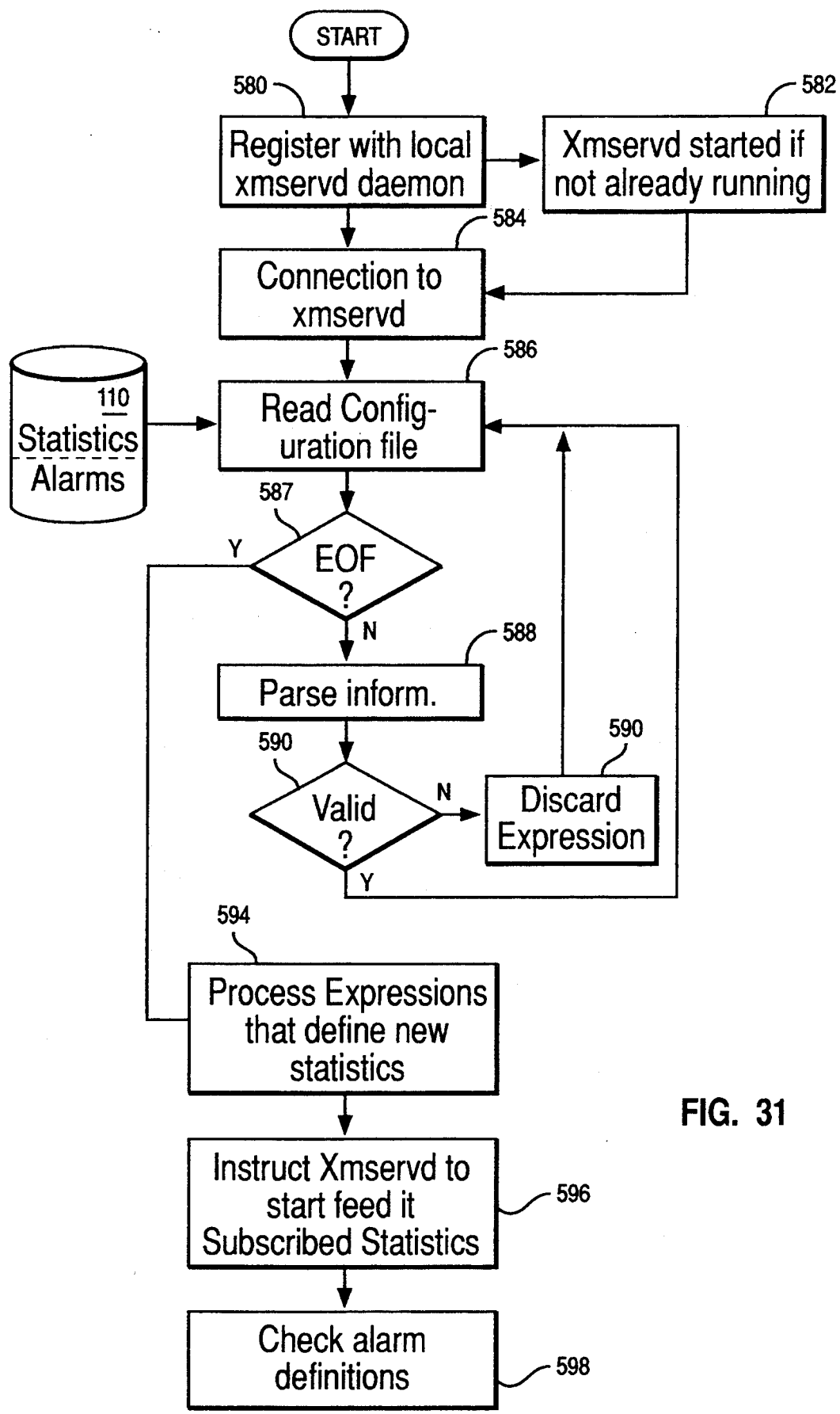
FIG. 31 is a flow diagram of the internal operations of the filtering and alarm utility filtd.

Referring now to FIG. 31, when filtd is started, it immediately issues an RSiOpen() call (as previously described) to register with the local xmservd daemon at 580. This will cause xmservd to start if it is not already running at 582. Following a successful connection to xmservd at 584, filtd then reads the configuration file at 586 and parses the information supplied in this file at 588.

The configuration file 110 contains expressions, which either define new statistics from existing ones or define alarms from statistics. Each time the name of a statistic is encountered while parsing an expression, it is checked with the xmservd daemon whether it is valid at 590. If not, the entire expression is discarded at 592 and filtd proceeds to parsing the next expression in the configuration file at 586, if any. Errors detected are reported to the log file.

When all expressions have been parsed, as determined at 587, filtd processes all expressions that define new statistics at 594. First, it registers its subscription for statistics it needs to build the new ones with xmservd. Then it registers with xmservd as a Dynamic Data Supplier. At this point, filtd is both a consumer and a supplier of statistics. At the end of this initialization phase, filtd instructs xmservd to start feeding the statistics it subscribed to at 596.

The last phase of initialization parses through any alarm definitions (as defined in Table 66) at 598. No new statistics are defined at this point. Alarms may refer to statistics that are defined by the previous phase, i.e. the parsing of the expressions.

Whenever new statistics are defined through the filtd configuration file, raw data statistics are initially requested from xmservd every five seconds. As long as no Data Consumer program subscribed to the new statistics, the sampling intervals remains at five seconds or some smaller value as required to meet the minimum requirements for alarm duration as described below.

When other Data Consumer programs subscribe to one or more of the new statistics, the sampling interval is adjusted to match the Data Consumer program that requires the fastest sampling. Again, if the requirements of an alarm's duration dictates a smaller interval, a new interval is selected.

For most purposes, sampling intervals can safely be set at two seconds or more. Understand that if thirty new statistics have been defined, but only one is subscribed to, all thirty are calculated each time a data feed is sent for the one subscribed to.

Since filtd is a Dynamic Data Supplier program, it is preferred to always have it running when the xmservd daemon runs. This can be caused to happen by adding a line to the xmservd configuration file and specifying the full path name of the filtd program and any command the line arguments. For example:

/usr/bin/filtd —p5

Although the term data reduction is used, the data reduction facilities 566 of filtd can actually be used to do exactly the opposite. As many new statistics as desired can be defined. However, it is anticipated that the most common use of the data reduction facility will be to reduce a large number of statistics to a reasonable set of combined values.

Whether defining many new statistics, or combining existing ones into fewer new ones, expressions are entered into the configuration file. The general format of expressions for defining new statistics is shown in Table 65.

TABLE 65

Expression Format For Data Reduction with filtd target = expression description
target:
Unqualified name of non-existing variable. Must start with alpha and contain only alpha-numeric characters and percent sign.
expression:
{variable | wildcard | const} operator {variable wildcard | const} . . .
variable:
Fully qualified xmperf variable name with slashes replaced by underscores; valid names have at least one underscore. Each name component should start with alpha and contain only alpha-numeric characters and percent sign. The referenced variable should already exist (can NOT be defined in this configuration file).
wildcard:
Fully qualified xmperf variable name with slashes replaced by underscores; valid names have at least one underscore. Each name component should start with alpha and contain only alpha-numeric characters and percent sign or must be a TABLE 65-continued Expression Format For Data Reduction with filtd wildcard. The wildcard character should appear in place of a context name, should only appear once, and should be one of the characters '+', '*', '#', '>', '<'.
operator:
One of {*, /, %, +, −}
cont:
[[digits].digits
description
Text describing the defined target variable. Should be enclosed in double quotes.

The expression may contain as many parentheses as are required to make the expression unambiguous. Note the use of "wildcards". It is a way of referring to multiple instances of a given statistic with one name, but, more important, it makes the expression independent of the actual configuration of the system it is used on. For example, the expression:

allreads=Disk_+_rblk could evaluate to different expressions on different machines, such as:

allreads=((Disk/cd0/rblk+Disk/hdisk1/rblk)-+Disk/hdisk0/rblk)

allreads=Disk/hdisk0/rblk

All numeric constants specified in an expression are evaluated as floating point numbers. Similarly, the resulting new statistics (the "target") will always be defined as floating point numbers.

All new statistics are added to a context called Filters so that a new statistic called "avgload" would be known to Data Consumer programs as "Filters/avgload".

As described above (Table 46 and description thereof), a statistic provided by xmservd is either of type SiCounter or of type SiQuantity. The two types in expressions can be combined to define new statistics, but the resulting statistic is generally defined as of type SiQuantity.

This has consequences that should be understood in order to define and interpret new statistics. To see how it works, assume there is a raw statistics value defined as a counter. If the data feeds for a raw statistic called "widgets" are received with an interval of two seconds, the following table is obtained:

| Elapsed seconds | Counter value | Delta value | Calculated rate/second |
|---|---|---|---|
| 0 | 33,206 | | |
| 2 | 33,246 | 40 | 20 |
| 4 | 33,296 | 50 | 25 |
| 6 | 33,460 | 164 | 82 |
| 8 | 33,468 | 8 | 4 |
| 10 | 33,568 | 100 | 50 |

If a new statistic is defined with the expression:

gadgets=widgets and the performance tool is used to monitor this new statistic, the rate as it was calculated when the latest data feed was received. The following table shows what will be see with different viewing intervals:

| Elapsed seconds | Interval 1 sec. | Interval 2 sec. | Interval 4 sec. | Raw Rate at 4 sec. |
|---|---|---|---|---|
| 1 | ? | | | |
| 2 | 20 | 20 | | |
| 3 | 20 | | | |
| 4 | 25 | 25 | 25 | 23 |
| 5 | 25 | | | |
| 6 | 82 | 82 | | |
| 7 | 82 | | | |
| 8 | 4 | 4 | 4 | 43 |
| 9 | 4 | | | |
| 10 | 50 | 50 | | |

The last column in the above table shows what the values would have been at the four-second intervals if the raw counter value had not been used to arrive at the average rate. Obviously, this needs to be taken into consideration when defining new statistics. The best way is to standardize the intervals to use.

To summarize, when new values are defined, any raw values of type SiQuantity are used as they are while the latest calculated rate per second is used for raw values of type SiCounter.

Because filtd must read the raw statistics 562 before it can calculate the values of the new ones 564, the new statistics are always one "cycle" behind the raw statistics. A performance tool instrument that plots a defined statistic, along with the raw statistics used to calculate it, will show a time lag between the new value and the raw ones.

The xmservd daemon divides usage of the cpu resource into four groups: kernel, user, wait, and idle. If it were desired to present it as only two: running and notbusy, those two new statistics could be defined with the following expressions:

running=CPU_kern+CPu_user "CPU running"

notbusy=CPU_wait+CPU_idle "CPU not running"

If it were desired to see the average number of bytes per transmitted packet for a LAN interface, the expression would be:

packsize=NetIf_tr0_ooctet/Netif_tr0_opacket \ "Average packet size"

In the above example, the divisor may very well be zero quite often. Whenever a division by zero is attempted, the resulting value is set to zero. The example also shows that expressions can be continued over more than one line by terminating each line except the last one with a back slash.

If the percentage of the network packets are using the loopback interface in the system, a definition like the following can be used:

localpct = (NetIf_lo0_ipacket + NetIf_lo0_opacket) * 100 \
/ (NetIf_+_ipacket + NetIf_+_opacket) \
"Percent of network packets on loopback i/f"

The above is an illustration of the usefulness of wildcards.

An alarm 571 consists of an action part that describes what action 570 to trigger and a condition part that defines the conditions for triggering the alarm. The general format for an alarm definition is shown in TABLE 66.

TABLE 66
Format For Defining Alarms with filtd action = condition description
action:
@alarm:alarm_definition
@alarm:
Symbolic name of an alarm. Starts with '@' and contains alpha-numeric characters.
alarm_definition:
One or more of: [command line], {TRAPxx}, {EXCEPTION}.
condition:
bool_expression [DURATION seconds] [FREQUENCY minutes] [SEVERITY xx]
bool_expression:
{evariable | wildcard | const} bool_operator {evariable | wildcard | const} . . .
evariable:
Fully qualified xmperf variable name with slashes replaced by underscores; valid names have at least one underscore. Each name component starts with alpha and contains only alpha-numeric characters and percent sign. The referenced variable may be defined by this same filter, in which case it must be specified as: Filters_target, where "target" is the name of the new statistic.
wildcard:
Fully qualified xmperf variable name with slashes replaced by underscores; valid names have at least one underscore. Each name component starts with alpha and contains only alpha-numeric characters and percent sign or must be a wildcard. The wildcard character appears in place of a context name, should only appear once and should one of the characters '+', '*', '#', '>', '<'.
bool_operator:
One of {*, /, %, +, −, &&, ||, =, !=, >, >=, <, <=}
const:
[[digist].]digits
description:
Text describing the alarm or the defined target variable. Should be enclosed in double quotes.

The two keywords DURATION and FREQUENCY are used to determine how long time a condition must remain true before the alarm is triggered and to specify the minimum number of minutes between each triggering of the same alarm. If these keywords are not specified, default values apply; if the keywords are specified, they should not be less than defined minimum values. Defaults and minimums are shown below:

| | Default | Minimum |
|---|---|---|
| DURATION | 60 seconds | 1 second |
| FREQUENCY | 30 minutes | 1 minute |

For an alarm to be triggered, at least FREQUENCY minutes must have elapsed since the last time this same alarm was triggered. When this is the case, the condition is monitored constantly. Each time the condition switches from false to true, a time stamp is taken. As long as the condition stays true, the elapsed time since the last time stamp is compared to DURATION and, if it equals or exceeds DURATION, the alarm is triggered.

When it can be done without forcing the data feed interval to become less than one second, filtd makes sure at least three data feeds will be taken in DURATION seconds. This is done by modifying the data feed interval if necessary. Doing modifying the data feed can have side effects on new statistics defined, since there is only one data feed interval in use for all raw statistics received by the filtd program, whether the raw statistics are used to define new statistics, to define alarms or both.

Alarms need not really be alarms. It would be much nicer if the conditions that would normally trigger an alarm could cause corrective action to be taken without human intervention. One example of such corrective action is that of increasing the UDP receive buffers in case of UDP overrun. The following "alarm" definition would provide this:

```
@udpfull:[no −o sb_msx+262144]
    UDP_fullsock>5 DURATION 1
```

If it is desired to have an SNMP trap with specific number 31 to be sent in addition to the execution of the no command, the alarm would be defined as follows:

```
@udpfull:[no −o sb_msx+262144] {TRAP31}
    UDP_fullsock> \ 5 DURATION 1 "Another
    UDP Buffer overrun"
```

If it is desired to be informed whenever the paging space on a host has less than 10 percent free or there is less than 100 pages free paging space, an alarm definition like the following could be used:

```
@oops:[aixterm −bg red −e red −e ksh −c *
    "(banner PANIC; read)"] \ (PagSp_% free<10) ||
    (PagSp_free<100)
```

One final example defines an alarm to send an exception t_rec to interested Data Consumer programs whenever the average busy percent for the disks exceeds 50 for more than 5 seconds:

```
@diskbusy:{EXCEPTION}
    (Disk_+_busy)/(Disk_#_busy)> \ 50
    DURATION 5 SEVERITY 3 "Disks are more
    than 50% busy on average"
```

As can be seen from the above description and examples, this filtering capability is highly flexible in both the manner in which the filters and alarms can be defined, as well as the subsequent actions that can be invoked as a result of detecting an alarm condition.

PROCESS CONTROL

An important component of system and network performance tuning is the ability to access and alter the course of a process execution while it is running from any node in the system. In fact, for a system administrator who has responsibility for a number of systems and is concerned about resource balancing as well as problem corrections, it is quite important to have an easy facility for centrally monitoring and controlling processes across a network. This system administrator needs to be able to adjust the priorities of processes to assure the smooth flow of work through a network of systems, as well as to kill processes that have become "pathologically insane", or running rampant. This control facility is an important component of performance management in conjunction with a live monitoring facility that allows a system administrator to immediately see the system response to the action just taken.

A scheme for easy system management control of local and network processes is described below. It assures a live network monitoring facility and a set of analysis tools are available to help the user in determining the proper action to take, as well as observing the system's response to an action taken. It also assumes that the user of the tool(s) has the proper security access and authority to perform the desired operations on the selected processes for local or remote machines. In the preferred embodiment, the Motif graphical user interface is used to present information on the display of a data processing system, and to allow a user to easily select single or multiple menu items. This interface is commonly known in the art to provide a user interface with overlapping windows displaying multiple outputs from different programs or processes. For further information, see "OSF/Motif Style Guide", Revision 1.1 dated 1991, available from Prentice Hall in Englewood Cliffs, N.J., and hereby incorporated by reference as background information.

The following steps describe the basic process control flow for local or remote networked computers of the data processing system:

- User selects a "process control" menu button in the user interface, thus invoking a process control routine.
- The process control routine does a UDP network broadcast to hosts and subnets listed in a "hosts" file including the local host.
- The process control routine presents a menu of available network nodes to the user, based on responses received from the network broadcast.
- The user selects one or more nodes from the menu
- The process control routine sends requests for process data to each of the selected nodes.
- The selected node(s) receives the request and reads the local process table entries. If an ordering of processes by attribute is requested, then the processes are sorted and ranked in the order requested.
- The selected node(s) sends a snapshot of the selected processes, in rank order in the preferred embodiment, to the initiating node comprising the process control routine.
- The process control routine receives the process snapshot from each node. The process control routine then sends the process data to the GUI to allow the user to select and operate on the process data as "objects".
- The user can select a "sort" button to reorder the menu of process data by a specific category or process parameter, e.g., process ID (PID), process name, process priority, userid of the process owner, process memory utilization, CPU utilization, page faults, etc.
- The GUI expands the "sort" button into a secondary set of option buttons for the user to select which category to sort. After the user has selected a category to sort, the ranking is done alphanumerically, depending on the type of data in the category. The sorted data is then redisplayed by the GUI.
- The user can request a "refresh" snapshot of the process data to get the most recent data values. The refresh is particularly useful for remote process information, when processes are not being continuously monitored.
- The user then selects one or more processes from the menu and selects the action to take on those processes, e.g., lower or raise priority, kill process(es), get more detailed statistics, etc.

○ If processes are local, the process control routine checks that the user is authentic and authorized to perform the selected actions for each of the selected processes. If this test is passed, the selected actions are performed for each of the selected processes. The actions to be performed are defined in a command bar option that can be selected by the user. For instance, a user could select a "kill process" option that would take the process ids (PIDs) selected by the user and pass them to the system "kill" command to "kill" the selected process. The GUI would interpret the selected command and pass this information to the configuration subsystem, which would cause the system invocation of the selected command. If processes are remote, the process control routine sends the requests to agents (daemons) on the remote hosts for them to check the ID and authority of the requestor, execute the requests, and return the results to the requesting process control routine.

○ When the remote host receives the user specified request, it takes the parameters and commands as specified by the initiating user, and passes them on to the local system for execution. As in the example above, a remote host would receive the kill request for the selected PIDs, and then pass the request to the remote system's "kill" command to kill the selected processes.

Data Processing System

FIG. 33 shows the preferred embodiment of the present invention, which comprises a CPU 610, random access and read only memory 614, prototype adapter 616, I/O adapter 618, user interface adapter 622, communication adapter 634, and display adapter 636 all interconnected via a common path, or bus 612. Each of the above components accesses the common bus using convention techniques known to those of ordinary skill in the art, and include such methods as dedicating particular ranges to each component in the system, with the CPU being the bus master. Other conventional techniques known to those of ordinary skill in the art include direct memory access, or DMA, used to transfer data at high speed from external devices such as DASD 620 or network 630 the data processing system's random access memory (RAM) at 614. As is further shown in FIG. 33, these external devices 620 and 630 interface to the common bus 612 through respective adapter 618 and 634. Other external devices such as the display 638 similarly use an adapter 636 to provide data flow between the bus 612 and the display 638. User interface means are provided by adapter 622, which has attached thereto such items as a joystick 632, mouse 626, keyboard 624, and speaker 628.

In the preferred embodiment, the CPU 610 is a RISC microprocessor, which has a 632 bit data path extending along bus 612. Other microprocessors or microcontrollers could similarly be substituted for this CPU 610 without departing from the scope and spirit of the present embodiment of this invention. The prototype adapter 616 in the preferred embodiment contains a timer which is used as the watchdog timer for generating a NMI signal. Other embodiments could include the timer internal to the CPU 610, such as is done with many microcontrollers known to those of skill in the art (e.g. the Intel 8051). Further embodiments could include the timer external to the CPU 610, but contained on the same card/motherboard which maintains the CPU 610, Additionally, the timer function could be generated using other system timers which may be in existence on other adapter cards 618, 622, 634, or 636. For example, the user interface adapter may have a timer module such as the Intel 8253 for use in generating square waveforms for driving speaker 628. This type of timer module has multiple internal timers, and thus an unused timer within this module could be used to generate the NMI signal of CPU 610. The point is that the particular location of the timer generating circuitry is not critical to achieving or implementing Applicants' claimed invention.

While the invention has been particularly shown and described with reference to a preferred embodiment, it will be understood by those skilled in the art that various changes in form and detail may be made without departing from the spirit and scope of the invention.

What is claimed is:

1. A method for controlling a plurality of processes in a data processing system, comprising the steps of:
   dynamically presenting a representation of each of the processes for selection on a display;
   displaying process information for each of the processes in each of the representations;
   selecting at least one process from the representations;
   in response to a selection of at least one process from user controls, gathering live process data for the at least one selected process from the data processing system;
   displaying the gathered process data in a control console; and
   in response to a command from the user controls, initiating at least one action on the at least one process.

2. The method of claim 1 wherein said step of initiating at least one action comprises the step of initiating a kill process action, pause process action, resume process action, or change priority of process action.

3. The method of claim 1 wherein said step of displaying process information comprises the step of displaying associated performance data statistics.

4. The method of claim 3 wherein said step of displaying associated performance data statistics comprises the step of displaying a process ID, process name, process priority, user ID of a process owner, process memory utilization, and CPU utilization.

5. The method of claim 3 further comprising the step of sorting the displayed process information by sorting at least one of the performance data statistics.

6. The method of claim 5 further comprising the step of ranking said displayed process information by the performance data statistic.

7. The method of claim 1 further comprising the step of dynamically changing said process information with live data updates.

8. The method of claim 1 wherein said step of initiating at least one action to be performed on at least one process further comprises the step of sending a message having control information to a daemon to control the process.

9. The method of claim 1 further comprising the step of grouping the gathered data as specified by a user.

10. The method of claim 9 further comprising the step of displaying the grouped data.

11. A system for controlling a plurality of processes in a data processing system, comprising:

means for dynamically presenting a representation of each of the processes for selection on a display;

means for displaying process information for each of the processes in each of the representations;

means for selecting at least one process from the representations;

in response to a selection of at least one process from user controls, means for gathering live process data for the at least one selected process from the data processing system;

means for displaying the gathered process data in a control console; and in response to a command from the user controls, means for initiating at least one action on the at least one process.

12. The system of claim 11 wherein said actions comprise a kill process, pause process, resume process, and change priority of process.

13. The system of claim 11 wherein said process information comprises associated performance data statistics.

14. The system of claim 11 wherein said displayed process information is sorted by process statistic.

15. The system of claim 11 wherein said displayed process information is ranked by process statistic.

16. The system of claim 11 wherein said process information is changed dynamically with live data updates.

17. The system of claim 11 wherein said data is gathered using daemons on said local and remote data processing systems.

* * * * *

UNITED STATES PATENT AND TRADEMARK OFFICE
CERTIFICATE OF CORRECTION

PATENT NO. : 5,432,932

DATED : July 11, 1995

INVENTOR(S) : J. N. Chen, N. Christiansen, J. C. Ross and A. T. Rowan

It is certified that error appears in the above-indentified patent and that said Letters Patent is hereby corrected as shown below:

Col. 35, line 1, delete ",";

Col. 36, line 33, delete "Consumers" and insert --consumers--

Col. 40, line 47, before "severity" insert --The--;

Col. 44, Table 11, at the bottom of columns labeled

Col. 83, Table 56, in the title, delete "Extention" and insert
        --Extension--; and Col. 31, Table 10, line 11, delete "argo" and insert
        --a.go--.

Col. 74, line 17, after "either" insert --,--
        delete "in" and insert --in--.

Col. 83, Table 56, in the title, delete "Extention" and insert
        --Extension--; and

UNITED STATES PATENT AND TRADEMARK OFFICE
CERTIFICATE OF CORRECTION

PATENT NO. : 5,432,932
DATED : July 11, 1995
INVENTOR(S) : J.N. Chen, et al.

It is certified that error appears in the above-indentified patent and that said Letters Patent is hereby corrected as shown below:

Col. 38, line 67, indent "c)" paragraph to line up with paragraphs "a)" and "b)".

Signed and Sealed this

Sixteenth Day of July, 1996

Attest:

BRUCE LEHMAN

*Attesting Officer*     *Commissioner of Patents and Trademarks*